(12) United States Patent
Matsuzaki et al.

(10) Patent No.: US 9,640,226 B2
(45) Date of Patent: May 2, 2017

(54) SEMICONDUCTOR DEVICE AND ELECTRONIC DEVICE WITH DATA VOLTAGES READ ACCURATELY WITHOUT THE INFLUENCE OF THRESHOLD VOLTAGE VARIATION

(71) Applicant: Semiconductor Energy Laboratory Co., Ltd., Kanagawa-ken (JP)

(72) Inventors: Takanori Matsuzaki, Kanagawa (JP); Atsushi Miyaguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/962,109

(22) Filed: Dec. 8, 2015

(65) Prior Publication Data
US 2016/0172009 A1 Jun. 16, 2016

(30) Foreign Application Priority Data

Dec. 10, 2014 (JP) ................................. 2014-249679
Feb. 10, 2015 (JP) ................................. 2015-023937

(51) Int. Cl.
*G11C 5/06* (2006.01)
*G11C 5/00* (2006.01)
(Continued)

(52) U.S. Cl.
CPC .............. *G11C 5/005* (2013.01); *G11C 11/24* (2013.01); *H01L 21/8258* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

(Continued)

*Primary Examiner* — Richard Elms
*Assistant Examiner* — Sultana Begum
(74) *Attorney, Agent, or Firm* — Husch Blackwell LLP

(57) ABSTRACT

To provide a semiconductor device having large memory capacity and high reliability of data or a small-size semiconductor device having a small circuit area. A memory cell includes first and second data retention portions capable of storing multilevel data. A data voltage is written to the first data retention portion from a first wiring through a transistor and a second wiring, and a data voltage is written to the second data retention portion from the second wiring through a transistor and the first wiring. With the configuration, data voltages reduced by the threshold voltages of the transistors can be retained in the first and second data retention portions. The written data voltages where the threshold voltages of the transistors are canceled can be read by precharging and then discharging the first wiring.

18 Claims, 43 Drawing Sheets

(51) Int. Cl.
    *H01L 29/24* (2006.01)
    *H01L 29/16* (2006.01)
    *G11C 11/24* (2006.01)
    *H01L 27/06* (2006.01)
    *H01L 27/1156* (2017.01)
    *H01L 21/8258* (2006.01)
    *H01L 27/108* (2006.01)

(52) U.S. Cl.
    CPC ...... *H01L 27/0688* (2013.01); *H01L 27/1156* (2013.01); *H01L 29/16* (2013.01); *H01L 29/24* (2013.01); *H01L 27/108* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 | 4/2011 | Yamazaki et al. |
| 2011/0101351 A1 | 5/2011 | Yamazaki |
| 2012/0176388 A1* | 7/2012 | Yokoyama ........... G09G 3/3648 345/531 |
| 2014/0269099 A1 | 9/2014 | Nagatsuka et al. |
| 2015/0310906 A1 | 10/2015 | Matsuzaki et al. |
| 2016/0172010 A1 | 6/2016 | Kato |
| 2016/0172383 A1 | 6/2016 | Nagatsuka |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-197443 A | 10/2014 |
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Trans-

(56) References Cited

OTHER PUBLICATIONS actions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition:The Blue Phase," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 As a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4-ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits , 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-666.

Lee.J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

(56) References Cited

OTHER PUBLICATIONS

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 in. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S.. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

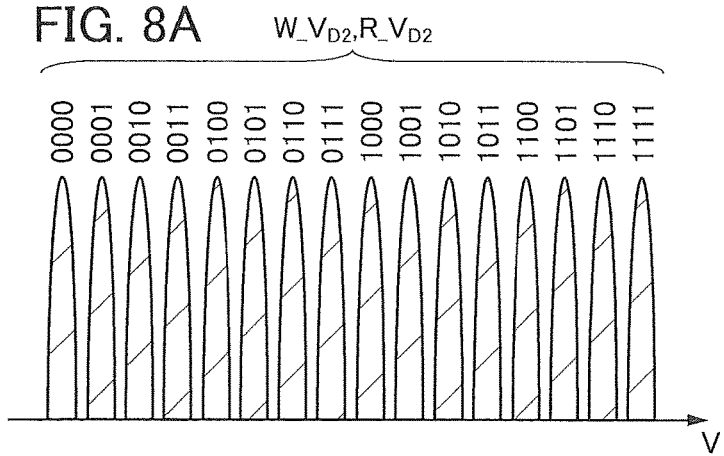
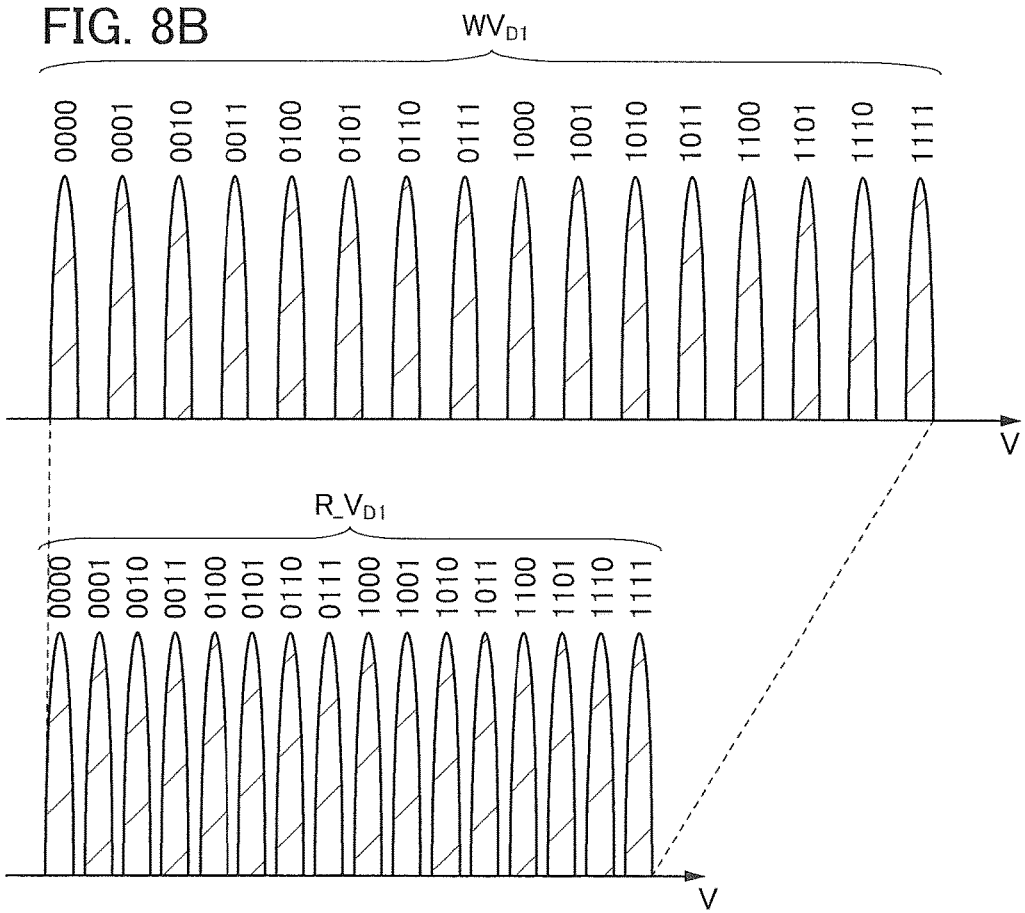

SEMICONDUCTOR DEVICE AND ELECTRONIC DEVICE WITH DATA VOLTAGES READ ACCURATELY WITHOUT THE INFLUENCE OF THRESHOLD VOLTAGE VARIATION

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Much attention has been focused on a semiconductor device that retains a plurality of voltage levels (also referred to as data voltages) corresponding to multilevel data by using a combination of a transistor in which silicon (Si) is used for a semiconductor layer (hereinafter, Si transistor) and a transistor in which an oxide semiconductor (OS) is used for a semiconductor layer (hereinafter, OS transistor) (see Patent Document 1).

REFERENCE

Patent Document

[Patent Document 1] Japanese Published Patent Application No. 2014-197443

SUMMARY OF THE INVENTION

In order to increase memory capacity, it is effective to increase the number of data voltages which can be retained in one memory cell to increase the number of bits of data. When the number of bits of data is increased, the number of voltage levels retained in the memory cell is increased exponentially. The structure in which the number of data voltages is increased to improve memory capacity is difficult to achieve because when the voltage levels read are varied due to variation in electrical characteristics of a transistor or the like, data is hard to determine, for example. Furthermore, the reliability of data might be decreased.

An object of one embodiment of the present invention is to provide a novel semiconductor device, a novel electronic device, and the like.

Another object of one embodiment of the present invention is to provide a semiconductor device or the like that has a novel structure, excellent data retention characteristics, and improved memory capacity. Another object of one embodiment of the present invention is to provide a semiconductor device or the like with a novel structure, a small circuit area of a memory cell, and a small size can be reduced.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

According to one embodiment of the present invention, a semiconductor device includes a memory cell, a first wiring, and a second wiring. The memory cell includes first to fourth transistors and first and second capacitors. One of a source and a drain of the first transistor is electrically connected to the first wiring, and the other of the source and the drain of the first transistor is electrically connected to the second wiring. The memory cell includes a first data retention portion where the second capacitor, one of a source and a drain of the second transistor, and one of a source and a drain of the fourth transistor are electrically connected to one another, and a second data retention portion where the first capacitor, a gate of the first transistor, the other of the source and the drain of the second transistor, and one of a source and a drain of the third transistor are electrically connected to one another. A first data voltage is written from the first wiring to the first data retention portion through the first transistor, the second wiring, and the other of the source and the drain of the fourth transistor. A second data voltage is written from the second wiring to the second data retention portion through the first transistor, the first wiring, and the other of the source and the drain of the third transistor.

According to one embodiment of the present invention, a semiconductor device includes a memory cell, a first wiring, and a second wiring. The memory cell includes first to fourth transistors and first and second capacitors. One of a source and a drain of the first transistor is electrically connected to the first wiring, and the other of the source and the drain of the first transistor is electrically connected to the second wiring. The memory cell includes a first data retention portion where the second capacitor, one of a source and a drain of the second transistor, and one of a source and a drain of the fourth transistor are electrically connected to one another, and a second data retention portion where the first capacitor, a gate of the first transistor, the other of the source and the drain of the second transistor, and one of a source and a drain of the third transistor are electrically connected to one another. A first data voltage is written from the first wiring to the first data retention portion through the first transistor, the second wiring, and the other of the source and the drain of the fourth transistor. A second data voltage is written from the second wiring to the second data retention portion through the first transistor, the first wiring, and the other of the source and the drain of the third transistor. The second data retention portion has a function of reading a second data voltage by a signal obtained by precharging the first wiring and then discharging the first wiring in accordance with a current flowing through the first transistor. The first data retention portion has a function of reading a first data voltage by a voltage obtained in such a manner that the second data retention portion is initialized by turning on the third transistor, charge of the first data retention portion is distributed to the second data retention portion by turning on the second transistor, and the first wiring is precharged and then discharged in accordance with a current flowing through the first transistor.

In the semiconductor device of one embodiment of the present invention, a semiconductor layer of the first transistor, a semiconductor layer of the second and third transistors, and a semiconductor layer of the fourth transistor are preferably provided in different layers.

In the semiconductor device of one embodiment of the present invention, a semiconductor layer of the first transistor and a semiconductor layer of the second and fourth transistors are preferably provided in different layers.

In the semiconductor device of one embodiment of the present invention, the first transistor is preferably a transistor including silicon in a channel formation region.

In the semiconductor device of one embodiment of the present invention, the second to fourth transistors are preferably transistors including an oxide semiconductor in channel formation regions.

In the semiconductor device of one embodiment of the present invention, the capacitance of the second capacitor is preferably larger than the capacitance of the first capacitor.

In the semiconductor device of one embodiment of the present invention, a voltage retained in the first data retention portion is larger than a voltage retained in the second data retention portion.

Note that other embodiments of the present invention will be described in Embodiments below and the drawings.

One embodiment of the present invention can provide a novel semiconductor device, a novel electronic device, or the like.

Another embodiment of the present invention can provide a semiconductor device or the like with a novel structure, large memory capacity, and high reliability of data. Another embodiment of the present invention can provide a semiconductor device or the like with a novel structure, a small size of the circuit area of a memory cell, and a small size.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Therefore, one embodiment of the present invention does not have the effects described above in some cases.

BRIEF DESCRIPTION OF THE DRAWINGS

In the accompanying drawings:

FIGS. 8A and 8B are schematic diagrams illustrating one embodiment of the present invention;

DETAILED DESCRIPTION OF THE INVENTION

Figure 1:
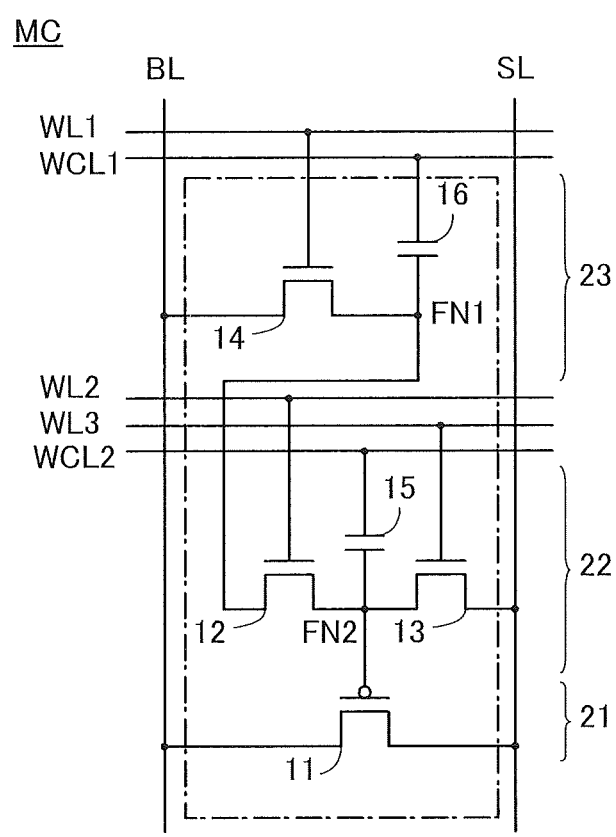
FIG. 1 is a circuit diagram illustrating one embodiment of the present invention.

Embodiments will be described below with reference to the drawings. However, the embodiments can be implemented with various modes. It will be readily appreciated by those skilled in the art that modes and details can be changed in various ways without departing from the spirit and scope of the present invention. Therefore, the present invention should not be interpreted as being limited to the description of Embodiments below.

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be omitted in other embodiments or claims.

In the drawings, the same components, components having similar functions, components formed of the same material, or components formed at the same time are denoted by the same reference numerals in some cases, and description thereof is not repeated in some cases.

Embodiment 1

In this embodiment, a configuration of a memory cell included in a semiconductor device of one embodiment of the disclosed invention is described.

The memory cell described in this embodiment can retain multilevel data. The memory cell includes a plurality of data retention portions. The plurality of data retention portions each retain a plurality of voltage levels (data voltages) corresponding to multilevel data to increase memory capacity per memory cell. The data voltages are retained in such a manner that transistors having a low off-state current retain charges corresponding to the data voltages.

In the case where a memory cell including two data retention portions retains 8-bit data, for example, the two data retention portions each retain 4-bit data. In this case, each of the two data retention portions retains a data voltage corresponding to 4-bit data, i.e., 16 levels. The data voltage is converted, in accordance with the 16 levels, into the original data. Accordingly, when the data voltages are varied, the original data is hard to obtain, which decreases the reliability of the data.

According to one embodiment of the present invention, in the memory cell including the plurality of data retention portions, variation in the read data voltages is decreased and the data voltages can be converted into accurate data. Specifically, data voltages written to the memory cell and data voltages read from the memory cell are prevented from being influenced by a variation factor, particularly, the threshold voltages in transistors, and the threshold voltages are less influenced by variation in data voltages. Then, data voltages with less influenced of the variation are converted into the accurate data and read.

Figure 4A:
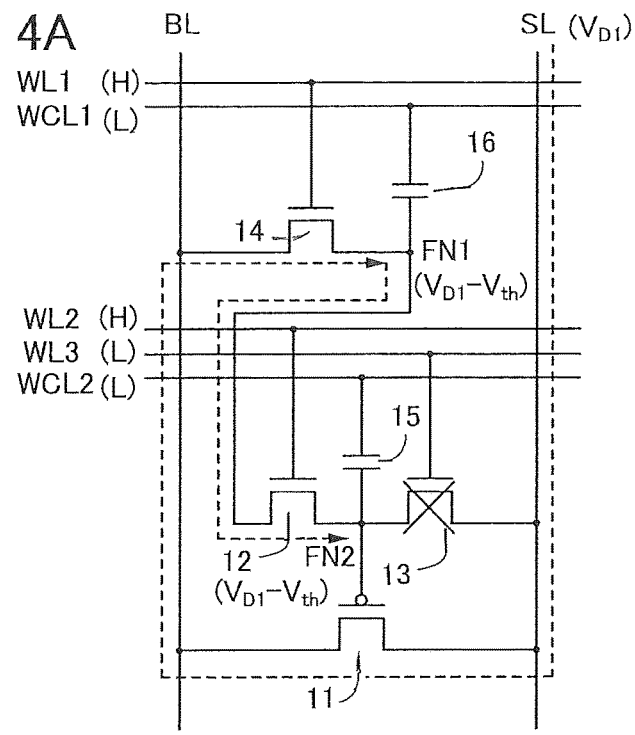
FIGS. 4A and 4B are circuit diagrams illustrating one embodiment of the present invention.
Figure 4B:
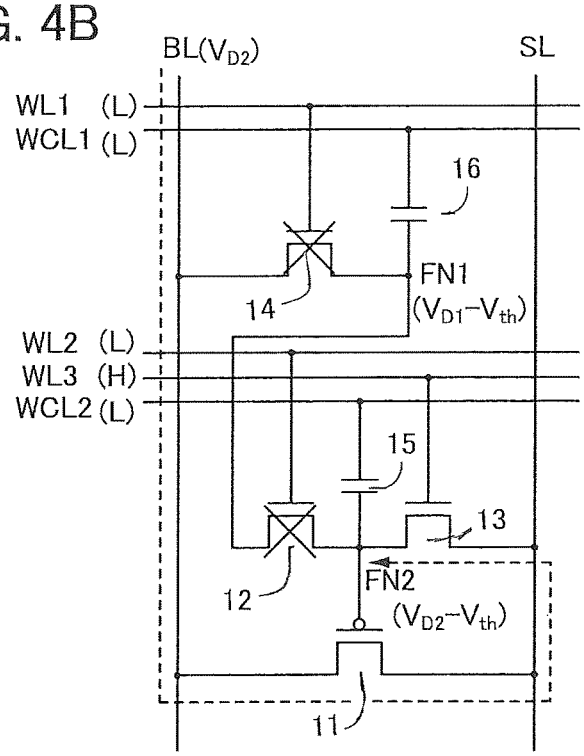

Specifically, with reference to FIG. 4A, a data voltage is written from a first wiring SL to a first data retention portion through a transistor 11 for reading the data voltage and a second wiring BL. With reference to FIG. 4B, a data voltage is written from the second wiring BL to a second data retention portion through a transistor 11 for reading the data voltage and the first wiring SL. With such a configuration, writing the data voltage to the first data retention portion and writing the data voltage to the second data retention portion can be performed without meeting of the data voltages. In other words, with reference to FIGS. 4A and 4B, the two writing operations are not performed concurrently. Furthermore, the data voltage written to the data retention portion can be written as a data voltage ($V_D - V_{th}$) obtained by subtracting a threshold voltage ($V_{th}$) of the transistor for reading the data voltage from the original data voltage ($V_D$). The data voltage read from the data retention portion can be read as a voltage ($V_D$) obtained by adding the threshold voltage ($V_{th}$) of the transistor for reading the data voltage to the written data voltage ($V_D - V_{th}$).

Therefore, the data voltage which is written to the memory cell and then read can be read by cancelling threshold voltages of transistors for reading the data voltages. Consequently, memory capacity per memory cell can be improved and the data into which the read data voltage is converted can be close to the accurate data; thus, excellent reliability of data can be obtained.

The data retention portion retains a data voltage corresponding to data having a smaller number of bits than the original data. Therefore, even in the case where reading of the data voltage retained in the memory cell accurately is difficult because of the large number of bits of the original data, a data voltage corresponding to small-bit data which is divided can be retained. In other words, in the case where the original data is 8-bit data, 256 levels need to be retained; however, since the two data retention portions each retain 4-bit data, only 16 levels need to be retained.

The following structure is effective: a transistor included in a data retention portion of a memory cell and a transistor for reading a data voltage are provided in different layers to be stacked. Thus, even in a memory cell including a plurality of data retention portions, the circuit area can be reduced, so that the size of the semiconductor device can be reduced.

Examples of a memory cell and operations of writing and reading of the memory cell are described with reference to drawings in this embodiment.

<Memory Cell MC>

An example of a circuit diagram of a memory cell MC in FIG. 1 is described.

The memory cell MC includes transistors 11 to 14 and capacitors 15 and 16. Although not illustrated in FIG. 1, a plurality of memory cells MC are provided in a matrix. The memory cell MC can control writing and reading of a data voltage in accordance with a signal or a voltage supplied to a wiring BL, a wiring SL, wirings WL1 to WL3, a wiring WCL1, and a wiring WCL2.

One of a source and a drain of the transistor 11 is connected to the wiring SL. The other of the source and the drain of the transistor 11 is connected to the wiring BL. Although the transistor 11 is a p-channel transistor in FIG. 1, the transistor 11 may be an n-channel transistor.

The transistor 11 is preferably a transistor including silicon in its channel formation region (Si transistor). Variation in threshold voltages of Si transistors manufactured in the same process can be reduced by adding an impurity and the like.

The memory cell MC in FIG. 1 includes two data retention portions. For example, a first data retention portion retains a charge between one of a source and a drain of the transistor 14, one electrode of the capacitor 16, and one of a source and a drain of the transistor 12 which are connected to a node FN1. A second data retention portion retains a charge between a gate of the transistor 11, the other of the source and the drain of the transistor 12, one of a source and a drain of the transistor 13, and one electrode of the capacitor 15 which are connected to a node FN2.

The other of the source and the drain of the transistor 13 is connected to the wiring SL. The other of the source and the drain of the transistor 14 is connected to the wiring BL. A gate of the transistor 14 is connected to the wiring WL1. A gate of the transistor 12 is connected to the wiring WL2. A gate of the transistor 13 is connected to the wiring WL3. The other electrode of the capacitor 16 is connected to the wiring WCL1. The other electrode of the capacitor 15 is connected to the wiring WCL2.

The transistors 12 to 14 each function as a switch for control of writing a data voltage and retaining a charge. Note that, as each of the transistors 12 to 14, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a Si transistor, for example. An OS transistor is described in detail in a later embodiment. Although the transistors 12 to 14 are n-channel transistors in FIG. 1, the transistors 12 to 14 may be p-channel transistors.

The transistors 12 and 13 and the transistor 14 are preferably provided in different layers even when the transistors 12 to 14 are OS transistors. In other words, the memory cell MC in this embodiment preferably includes, as illustrated in FIG. 1, a first layer 21 where the transistor 11 is provided, a second layer 22 where the transistors 12 and 13 are provided, and a third layer 23 where the transistor 14 is provided. By stacking layers where transistors are provided, the circuit area can be reduced, so that the size of the semiconductor device can be reduced.

A data voltage written to the data retention portion connected to the node FN1 is supplied to the wiring SL. A ground voltage ($V_{GND}$) for initializing the voltage of the wiring SL is supplied to the wiring SL. A precharge voltage ($V_{pre}$) for reading the data voltage written to the node FN1 is supplied to the wiring SL. After a predetermined voltage is supplied to the wiring SL, the wiring SL can be set in an electrically floating state.

A data voltage written to the data retention portion connected to the node FN2 is supplied to the wiring BL. $V_{GND}$ for initializing the voltage of the wiring BL or discharging $V_{pre}$ supplied to the wiring SL is supplied to the wiring BL. After a predetermined voltage is supplied to the wiring BL, the wiring BL can be set in an electrically floating state.

First to third word signals are supplied to the wirings WL1 to WL3. A read word signal is supplied to the wiring WCL2. A fixed voltage, e.g., $V_{GND}$ is supplied to the wiring WCL1.

<Writing Operation of Data Voltage to Memory Cell MC>

Next, a writing operation of a data voltage to the memory cell MC is described.

Figure 2:
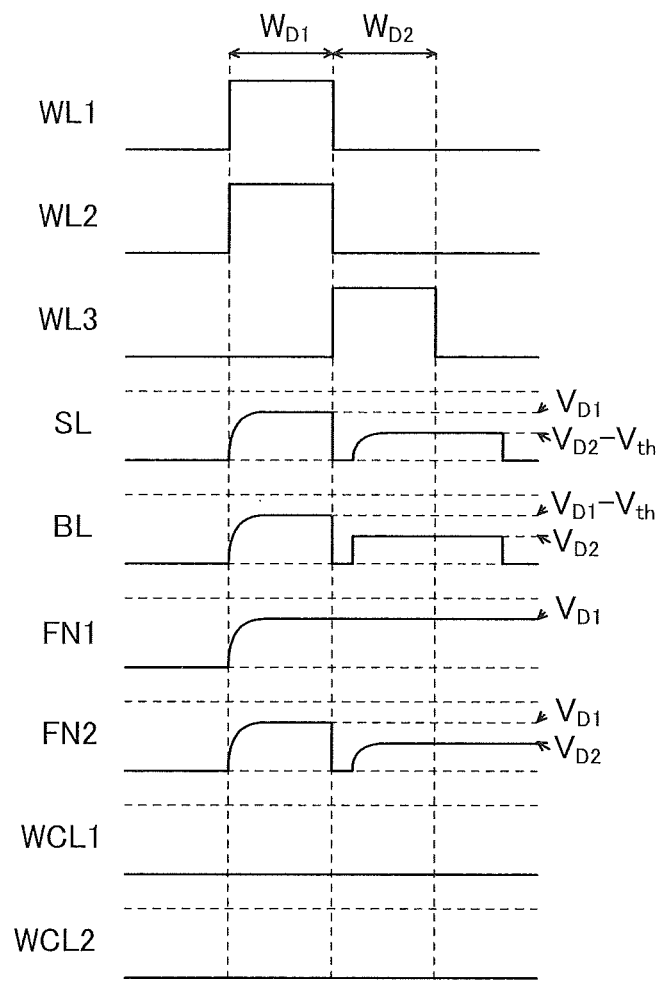
FIG. 2 is a timing chart of one embodiment of the present invention.

FIG. 2 is a timing chart of a writing operation of a data voltage to the memory cell MC in FIG. 1. FIG. 2 illustrates a period $W_{D1}$ in which a data voltage is written to the data retention portion connected to the node FN1 and a period $W_{D2}$ in which a data voltage is written to the data retention portion connected to the node FN2. FIGS. 4A and 4B are circuit diagrams visualizing current flows, the conduction states of the transistors, and voltages of the wirings and the nodes FN1 and FN2 in the period $W_{D1}$ and the period $W_{D2}$. Although the reference numerals of the transistors and the capacitors are omitted in FIGS. 4A and 4B, the circuit configurations in FIGS. 4A and 4B are the same as that in FIG. 1 and the description is made using the same reference numerals as those in FIG. 1.

In FIG. 2 and FIGS. 4A and 4B, the description is made on the assumption that the data voltage written to the data retention portion connected to the node FN1 is represented as $V_{D1}$, the data voltage written to the data retention portion connected to the node FN2 is represented as $V_{D2}$, and the threshold voltage of the transistor 11 is represented as $V_{th}$.

In the period $W_{D1}$, the voltage of the wiring SL is set at $V_{D1}$, and after the voltage of the wiring BL is set at $V_{GND}$, the wiring BL is brought into an electrically floating state. The wirings WL1 and WL2 are set at a high level. The wiring WL3, the wiring WCL1, and the wiring WCL2 are set at a low level. Then, the voltage of the node FN2 in the electrically floating state is decreased, so that a current flows through the transistor 11. The current flows through the transistor 11, so that the voltage of the wiring BL is increased. The transistors 14 and 12 are turned on. Thus, as the voltage of the wiring BL is increased, the voltages of the nodes FN1 and FN2 are increased. When the voltage of the node FN2 is increased and a voltage ($V_{gs}$) between a gate and a source of the transistor 11 becomes the threshold voltage $V_{th}$ of the transistor 11, the current flowing through the transistor 11 is decreased. Accordingly, the voltages of the wiring BL and the nodes FN1 and FN2 stop increasing, so that the voltages of the nodes FN1 and FN2 are fixed at "$V_{D1}-V_{th}$" in which $V_{D1}$ is decreased by $V_{th}$. The above is the writing operation of the data voltage to the data retention portion connected to the node FN1.

FIG. 4A illustrates a charge flow, the conduction states of the transistors, and voltages of the wiring SL and the nodes FN1 and FN2 in the operation in the period $W_{D1}$. The charge flow is indicated by a dotted arrow. The non-conduction state of the transistor is represented by a cross. The high-level voltage of the wiring is represented by "H" and the low-level voltage of the wiring is represented by "L". Note that the low level is represented by "$V_{GND}$" in some cases. As illustrated in FIG. 4A, when a current flows through the transistor 11, $V_{D1}$ supplied to the wiring SL is supplied to the wiring BL, so that the voltages of the nodes FN1 and FN2 are increased. When the voltage of the node FN2 becomes "$V_{D1}-V_{th}$" with the increase in the voltages, $V_{gs}$ of the transistor 11 becomes $V_{th}$, so that the current flow is stopped.

In the period $W_{D2}$, the voltage of the wiring BL is set at $V_{D2}$, and after the voltage of the wiring SL is set at $V_{GND}$, the wiring SL is brought into an electrically floating state. The wiring WL3 is set at the high level. The wirings WL1 and WL2 and the wirings WCL1 and WCL2 are set at the low level. The transistor 13 is turned on, so that the wiring SL is set at the low level. Thus, the wiring SL is set at $V_{GND}$ and the voltage of the node FN2 is decreased to the low level, so that the current flows through the transistor 11. By the current flow, the voltage of the wiring SL is increased. The transistor 13 is turned on. Thus, as the voltage of the wiring SL is increased, the voltage of the node FN2 is increased. When the voltage of the node FN2 is increased and $V_{gs}$ of the transistor 11 becomes $V_{th}$ of the transistor 11, the current flowing through the transistor 11 is decreased. Accordingly, an increase in the voltages of the wiring SL and the node FN2 is stopped, so that the voltage of the node FN2 is fixed at "$V_{D2}-V_{th}$" in which $V_{D2}$ is decreased by $V_{th}$. The above is the writing operation of the data voltage to the data retention portion connected to the node FN2.

FIG. 4B illustrates, like FIG. 4A, a charge flow, the conduction states of the transistors, and the voltages of the wiring BL and the nodes FN1 and FN2 in the operation in the period $W_{D2}$. As illustrated in FIG. 4B, when a current flows through the transistor 11, $V_{D2}$ supplied to the wiring BL is supplied to the wiring SL, so that the voltage of the node FN2 is increased. When the voltage of the node FN2 becomes "$V_{D2}-V_{th}$" with the increase in the voltage, $V_{gs}$ of the transistor 11 becomes $V_{th}$, so that the current flow is stopped. At this time, the transistors 12 and 14 are off and the voltage of the node FN1 remains at "$V_{D1}-V_{th}$" written in the period $W_{D1}$.

In the memory cell MC, after data voltages are written to the plurality of data retention portions, the wiring WCL2 is set at the high level, so that the voltages of the nodes FN1 and FN2 are increased. Then, the transistors are turned off to stop movement of charges; thus, the written data voltages are retained.

By the above-described writing operation of the data voltage to the nodes FN1 and FN2, the data voltages can be retained in the plurality of data retention portions. Consequently, the memory capacity per memory cell can be increased. Although examples where "$V_{D1}-V_{th}$" and "$V_{D2}-V_{th}$" are used as the written voltages are described, they are data voltages corresponding to multilevel data. Therefore, in the case where the data retention portions each retain 4-bit data, 16-level "$V_{D1}-V_{th}$" and 16-level "$V_{D2}-V_{th}$" can be obtained.

Note that data voltages read from the plurality of data retention portions are A/D converted. The resolution of the A/D converter depends on data with a large number of bits. In the case where 8-bit data is retained in two data retention portions, retaining data divided into 4-bit data is efficient. For example, in the case where 5-bit data and 3-bit data are retained in the respective data retention portions, a 5-bit A/D converter is needed, which is inefficient. Therefore, when the numbers of bits retained in the data retention portions are the same or substantially the same, the size of a circuit for A/D conversion can be reduced.

Note that data retained in the data retention portion may be different bit data. For example, in the case where the original data is 8-bit data, instead of the configuration where 4-bit data is retained at the node FN1 and 4-bit data is retained at the node FN2, 3-bit data may be retained at the node FN1 and 5-bit data may be retained at the node FN2. The original data can be other multilevel data, e.g., 9-bit data or 10-bit data.

<Reading Operation of Data Voltage from Memory Cell MC>

Next, a reading operation of a data voltage from the memory cell MC is described. Note that the written data voltage is lost in the reading operation. Therefore, it is preferable that the data voltage be written again by a refresh operation after the data voltage is read.

Figure 3:
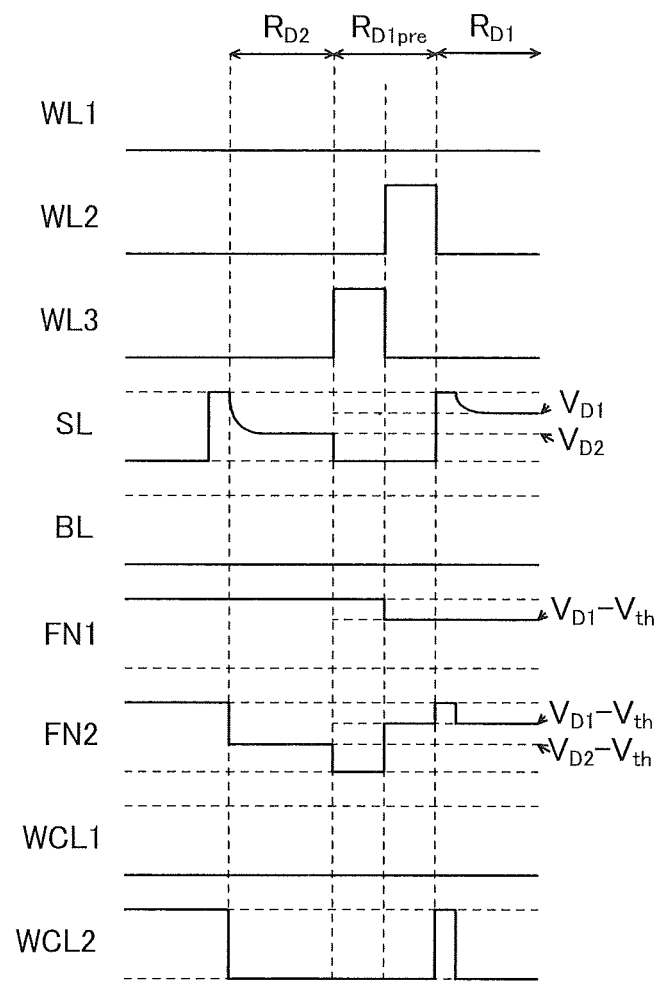
FIG. 3 is a timing chart of one embodiment of the present invention.

FIG. 3 is a timing chart of a reading operation of a data voltage from the memory cell MC in FIG. 1. FIG. 3 shows a period $R_{D2}$ in which a data voltage is read from the data retention portion connected to the node FN2, a period $R_{D1pre}$ for preparing for reading of a data voltage from the data retention portion connected to the node FN1, and a period $R_{D1}$ in which a data voltage is read from the data retention portion connected to the node FN2. FIGS. 5A and 5B and FIGS. 6A and 6B are circuit diagrams visualizing current flows, the conduction states of the transistors, and the voltages of the wirings and the nodes FN1 and FN2 in the period $R_{D1}$, the former half of the period $R_{D1pre}$, the latter half of the period $R_{D1pre}$, and the period $R_{D2}$.

Note that description for $V_{D1}$ and $V_{D2}$ in FIG. 3, FIGS. 5A and 5B, and FIGS. 6A and 6B is the same as the description of the writing operation.

First, in the period $R_{D2}$, the wiring SL which is supplied with $V_{pre}$ and is electrically floating in advance is discharged. The wirings WL1, WL2, WL3, and WCL1 are set low. When the wiring WCL2 is set low, the voltage of the node FN2 which is electrically floating is set at "$V_{D2}-V_{th}$". The voltage of the node FN2 is decreased, so that a current flows through the transistor 11. By the current flow, the voltage of the wiring SL which is electrically floating is decreased. As the voltage of the wiring SL is decreased, $V_{gs}$ of the transistor 11 is decreased. When $V_{gs}$ of the transistor 11 becomes $V_{th}$ of the transistor 11, the current flowing through the transistor 11 is decreased. In other words, the voltage of the wiring SL becomes "$V_{D2}$" which is larger than the voltage of the node FN2, "$V_{D2}-V_{th}$", by $V_{th}$. The voltage of the wiring SL corresponds to the data voltage of the data retention portion connected to the node FN2. The data voltage of the read analog value is subjected to A/D conversion, so that data of the data retention portion connected to the node FN2 is obtained. The above is the reading operation of the data voltage of the data retention portion connected to the node FN2.

Figure 5A:
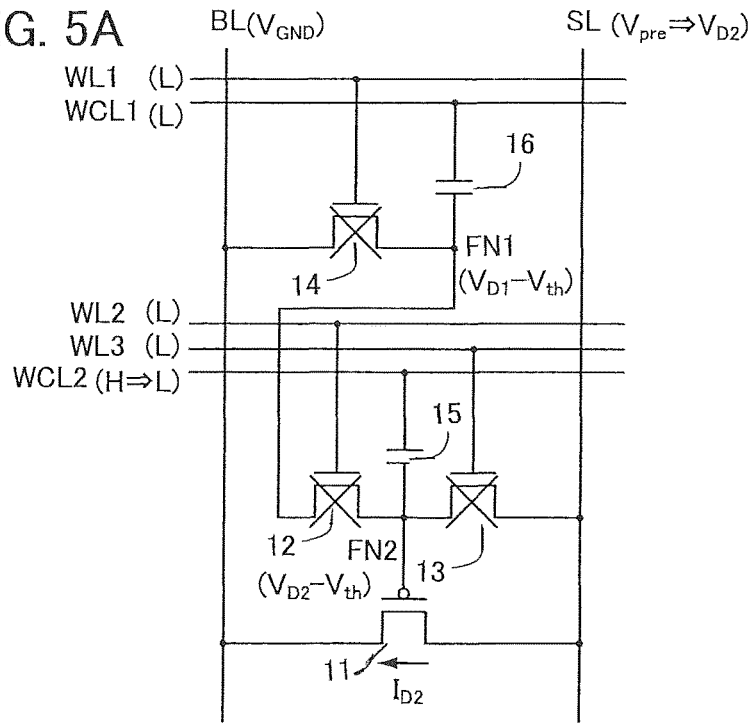
FIGS. 5A and 5B are circuit diagrams illustrating one embodiment of the present invention.

FIG. 5A, like FIGS. 4A and 4B, shows a charge flow, the conduction states of the transistors, and the voltages of the wiring SL and the nodes FN1 and FN2 in the operation in the period $R_{D2}$. As shown in FIG. 5A, the wiring SL is electrically floating after $V_{pre}$ is supplied to the wiring SL once. By changing the voltage of the wiring WCL2 from high to low, a current $I_{D2}$ flows through the transistor 11. When the current $I_{D2}$ flows, the voltage of the wiring SL which is in a floating state is decreased. With the decrease in the voltage, the voltage of the wiring SL is set at "$V_{D2}$". In the transistor 11, $V_{gs}$ between "$V_{D2}-V_{th}$" of the node FN2 and "$V_{D2}$" of the wiring SL becomes $V_{th}$, so that the current $I_{D2}$ stops. Then, "$V_{D2}$" written in the period $W_{D2}$ is read to the wiring SL.

Next, the period $R_{D1pre}$ is a preparation period for reading "$V_{D1}$" written in the period $W_{D1}$. In the period, the former-half operation and the latter-half operation are different.

In the former half of the period $R_{D1pre}$, "$V_{D2} V_{th}$" of the node FN2 is discharged. The wirings SL and BL are set low. The wiring WL3 is set high. The wirings WL1 and WL2 and the wirings WCL1 and WCL2 are set low. The transistor 13 is turned on, so that the node FN2 is set low.

Figure 5B:
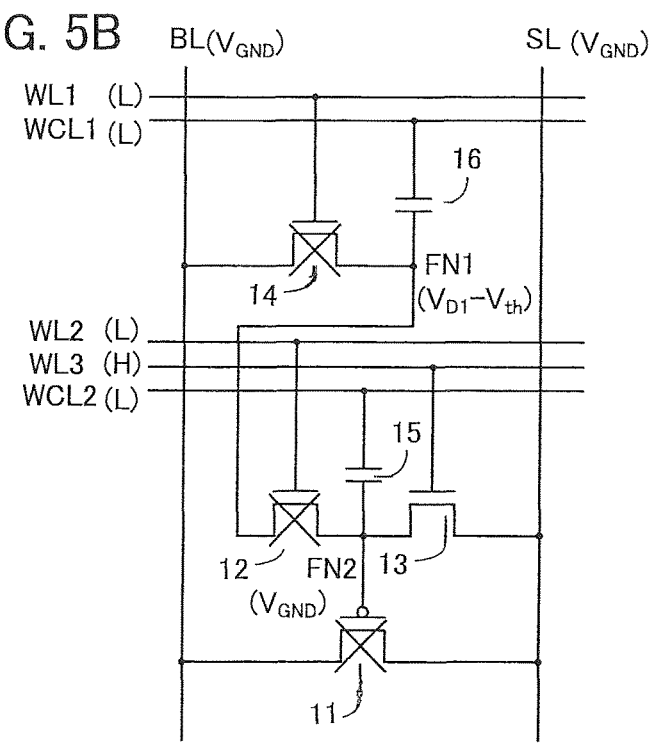

FIG. 5B, like FIGS. 4A and 4B, shows the conduction states of the transistors and the voltages of the wiring SL and the nodes FN1 and FN2 in the operation in the former half of the period $R_{D1pre}$. As shown in FIG. 5B, the voltage of the wiring SL is set at $V_{GND}$, i.e., a low level. The transistor 13 is turned on, so that the voltage of the node FN2 is set at $V_{GND}$.

In the latter half of the period $R_{D1pre}$, charges retained in the node FN1 are distributed to the node FN2, and a data voltage of the data retention portion connected to the node FN1 is transferred to the data retention portion connected to the node FN2. The wirings SL and BL are set low. The wiring WL2 is set high. The wirings WL1 and WL3 and the wirings WCL1 and WCL2 are set low. The transistor 12 is turned on, so that the charges in the node FN1 are distributed between the node FN1 and the node FN2.

By distributing the charges in the node FN1 to the node FN2, the capacitance of the node which retains the voltage of the node FN1, "$V_{D1}-V_{th}$", is increased by the capacitance of the capacitor 15. Therefore, the voltage after the charge distribution is decreased from the written voltage, "$V_{D1}-V_{th}$". Thus, the capacitance of the capacitor 16 is preferably larger than the capacitance of the capacitor 15. Alternatively, the voltage written to the node FN1, "$V_{D1}-V_{th}$", is preferably larger than the voltage corresponding to the same data, "$V_{D2}-V_{th}$". By changing the ratio of the capacitances and setting the written voltage larger in advance as described above, a decrease in voltage after the charge distribution can be suppressed. The change in voltage due to the charge distribution is described later.

Figure 6A:
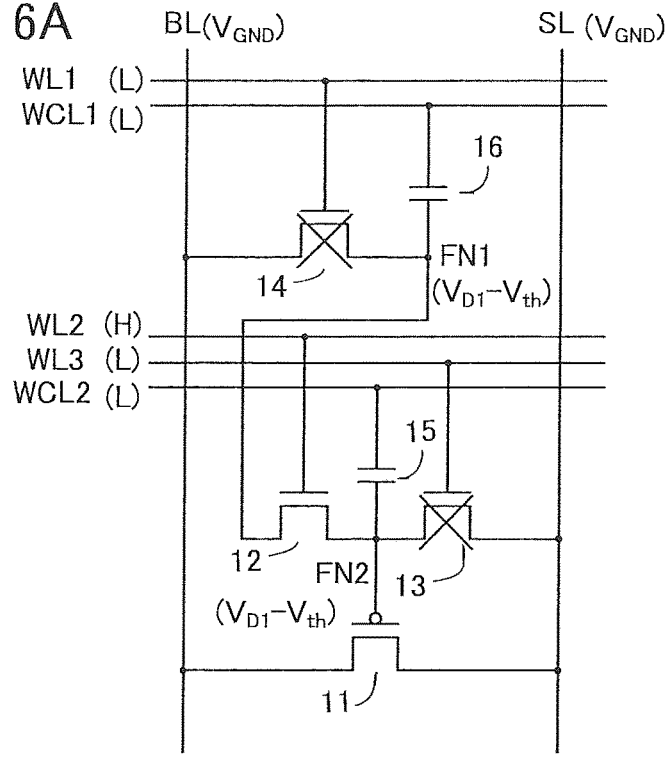
FIGS. 6A and 6B are circuit diagrams illustrating one embodiment of the present invention.

FIG. 6A, like FIGS. 4A and 4B, shows the conduction states of the transistors and the voltages of the wiring SL and the nodes FN1 and FN2 in the operation in the latter half of the period $R_{D1pre}$. As shown in FIG. 6A, the transistor 12 is turned on, so that charges of the node FN1 are distributed to the node FN2. As described above, the voltage written to the node FN1, "$V_{D1}-V_{th}$", is decreased by distributing the charges between the nodes FN1 and FN2; however, it is represented as the voltage, "$V_{D1}-V_{th}$", here.

Next, in the period $R_{D1}$, the wiring SL which is supplied with $V_{pre}$ and is electrically floating in advance is discharged. The wirings WL1, WL2, WL3, and WCL1 are set low. The wiring WCL2 is set high at the time of precharge and then, set low. When the wiring WCL2 is set low, the voltage of the node FN2 which is electrically floating is set at "$V_{D1}-V_{th}$". The voltage of the node FN2 is decreased, so that a current flows through the transistor 11. The current flows, so that the voltage of the wiring SL which is electrically floating is decreased. As the voltage of the wiring SL is decreased, $V_{gs}$ of the transistor 11 is decreased. When $V_{gs}$ of the transistor 11 becomes $V_{th}$ of the transistor 11, the current flowing through the transistor 11 is decreased. In other words, the voltage of the wiring SL becomes "$V_{D1}$" which is larger than the voltage of the node FN2, "$V_{D1}-V_{th}$", by $V_{th}$. The voltage of the wiring SL corresponds to the data voltage of the data retention portion connected to the node FN1. The data voltage of the read analog value is subjected to A/D conversion, so that data of the data retention portion connected to the node FN1 is obtained. The above is the reading operation of the data voltage of the data retention portion connected to the node FN1.

Figure 6B:
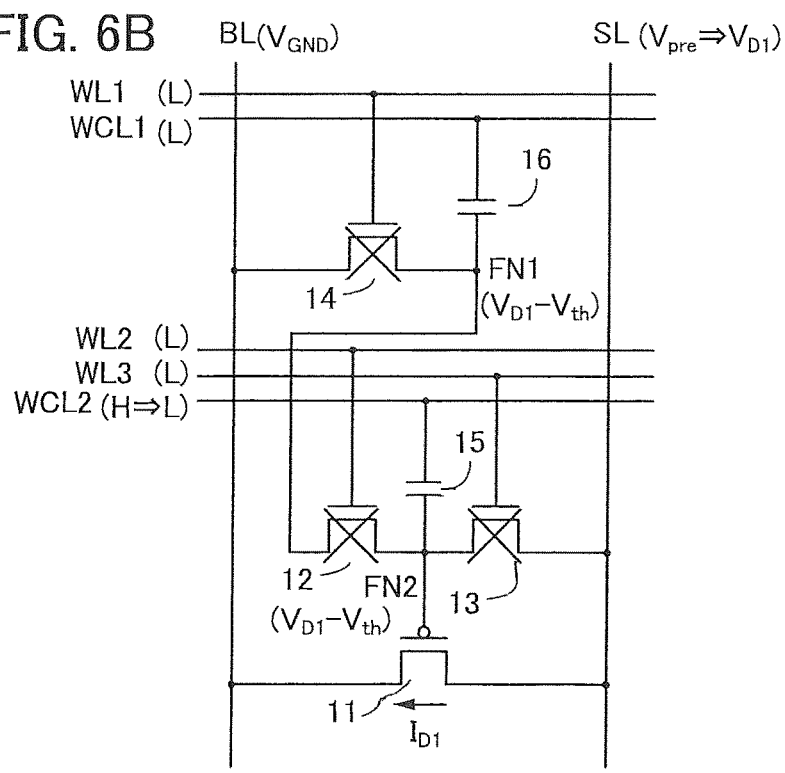

FIG. 6B, like FIGS. 4A and 4B, shows a charge flow, the conduction states of the transistors, and the voltages of the wiring SL and the nodes FN1 and FN2 in the operation in the period $R_{D1}$. As shown in FIG. 6B, the wiring SL is electrically floating after $V_{pre}$ is supplied to the wiring SL once. By changing the voltage of the wiring WCL2 from high to low, a current $I_{D1}$ flows through the transistor 11. When the current $I_{D1}$ flows, the voltage of the wiring SL which is in a floating state is decreased. With the decrease in the voltage, the voltage of the wiring SL is set at "$V_{D1}$". In the transistor 11, $V_{gs}$ between "$V_{D1}-V_{th}$" of the node FN2 and "$V_{D1}$" of the wiring SL becomes $V_{th}$, so that the current $I_{D1}$ stops. Then, "$V_{D1}$" written in the period $W_{D1}$ is read to the wiring SL.

In the above-described reading operation of data voltages from the nodes FN1 and FN2, the data voltages can be read from the plurality of data retention portions. Therefore, the memory capacity per memory cell can be increased. The read data voltage can be read as a voltage larger than the written data voltage by $V_{th}$. Therefore, $V_{th}$ of "$V_{D1}-V_{th}$" and $V_{th}$ of "$V_{D2} V_{th}$" written in the writing operation can be canceled to be read. As a result, the memory capacity per memory cell can be improved and read data can be close to accurate data; thus, the data reliability becomes excellent.

<A Plurality of Voltage Levels Supplied to Data Retention Portions>

Next, data voltages supplied to the nodes FN1 and FN2 are described.

Figure 7A:
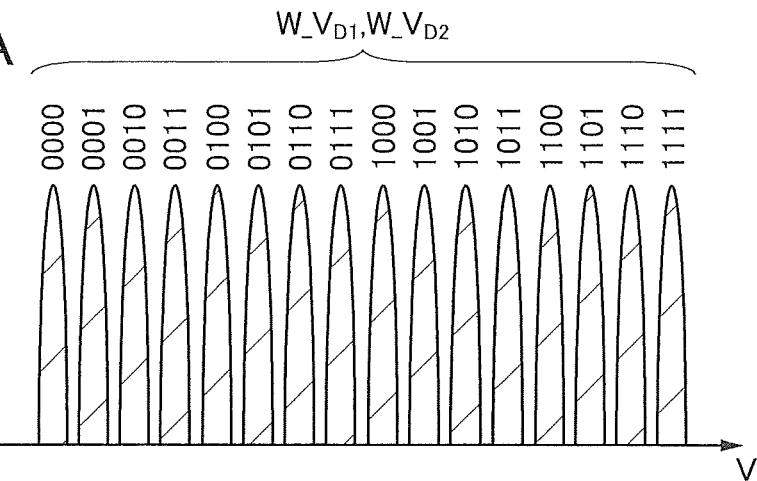
FIGS. 7A to 7D are circuit diagrams and schematic diagrams illustrating one embodiment of the present invention.

FIG. 7A shows distribution of the data voltages corresponding to data. FIG. 7A shows the case where data retained in the memory cell MC is set to 8-bit data and a data voltage corresponding to 4-bit data is retained in each of the two data retention portions.

As shown in FIG. 7A, data voltages written to the memory cells MC are represented by $W\_V_{D1}$ and $W\_V_{D2}$. Each of $W\_V_{D1}$ and $W\_V_{D2}$ corresponds to 4-bit data and can be represented by 16 levels. Each of $W\_V_{D1}$ and $W\_V_{D2}$ corresponds to 4-bit data, "0000" to "1111", as shown in FIG. 7A.

Figure 7B:
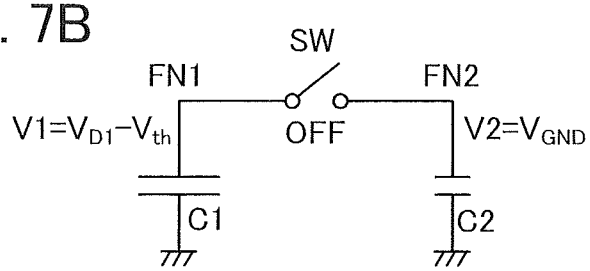

As described above, the data voltages written to the node FN1 are read by distributing charges between the node FN1 and the node FN2. FIG. 7B is a circuit diagram illustrating the capacitor 16 (with capacitance of C1), the capacitor 15 (with capacitance of C2), and the transistor 12 functioning as a switch (SW) at the time of reading the data voltages written to the node FN1. In FIG. 7B, when the switch is off, "$V_{D1}-V_{th}$" (V1) is retained on the node FN1 side and "GND" (V2) is retained on the node FN2 side.

Figure 7C:
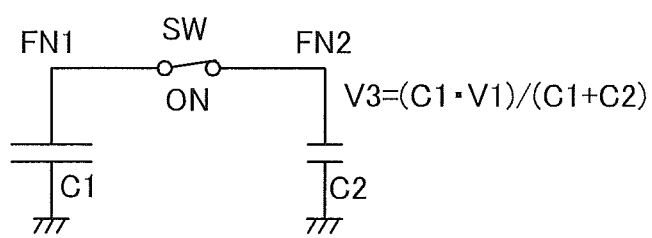

Charges are distributed by changing the switch from the state in FIG. 7B to the state where the switch is turned on as shown in FIG. 7C. In the case where the charges after the distribution are retained, the voltage V3 after the distribution becomes "(C1·V1)/(C1+C2)". In other words, by setting the capacitance C1 larger than the capacitance C2, the decrease in voltage due to the charge distribution can be suppressed to be small. In other words, by setting the capacitance of the capacitor 16 larger than the capacitance of the capacitor 15, the change in data voltage after the charge distribution of the node FN1 to the node FN2 can be suppressed.

Figure 7D:
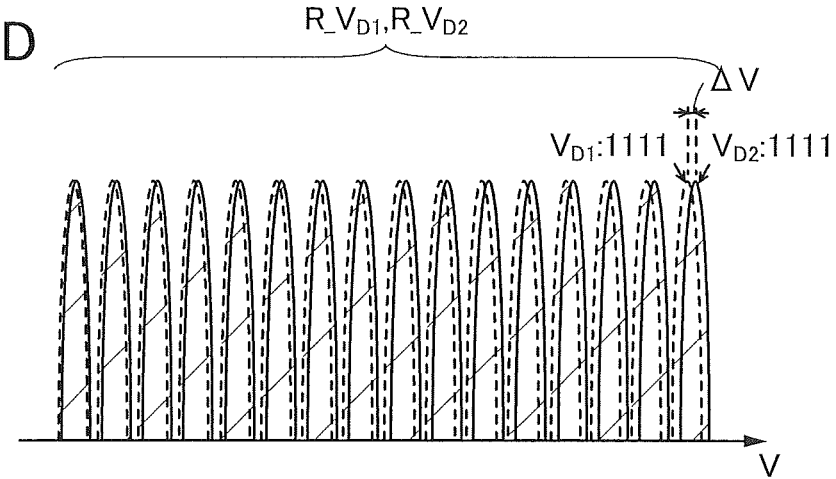

Note that the decrease in the read data voltage due to the charge distribution is more likely to occur as the written data voltage is higher. Specifically, as shown in FIG. 7D, the voltage which is retained in the node FN1 and read is represented as $R\_V_{D1}$ (denoted by a dotted line in the diagram) and the voltage which is retained in the node FN2 and read is represented as $R\_V_{D2}$ (denoted by a solid line in the diagram). In the case where $W\_V_{D1}$ and $W\_V_{D2}$ are the same data and have the same data voltage, on the data "1111" side, the voltage difference $\Delta V$ arises between the data voltage $V_{D1}$ retained in the node FN1 and the data voltage $V_{D2}$ retained in the node FN2.

In the case where the capacitance C1 is larger than the capacitance C2 as described above, the voltage difference $\Delta V$ in FIG. 7D is set to be separated from another data.

Alternatively, $W\_V_{D1}$ and $W\_V_{D2}$ may be different from each other. For example, as shown in FIG. 8A, $W\_V_{D2}$ written to the node FN2, which is read earlier, is used as a reference. $R\_V_{D2}$ read from the node FN2 has the same distribution of the data voltage as $W\_V_{D2}$. On the other hand, as shown in FIG. 8B, $W\_V_{D1}$ written to the node FN1, which is read by charge distribution, is set higher than $W\_V_{D2}$. When $W\_V_{D1}$ is higher than $W\_V_{D2}$, $R\_V_{D1}$ obtained by the decrease in the voltage after the charge distribution can be adjusted to have the same distribution of the data voltage as $R\_V_{D2}$. Thus, the difference of data voltages read from the nodes FN1 and FN2 can be narrowed.

The structure illustrated in FIGS. 8A and 8B may be combined with the structure where the capacitances are formed which is shown in FIGS. 7A to 7D are obtained.

<Modification Examples of Memory Cell MC>

FIGS. 9A and 9B, FIG. 10, FIG. 11, FIGS. 12A and 12B, and FIGS. 13A and 13B illustrate modification examples of a circuit configuration that the memory cell MC described in FIG. 1 can have.

Figure 9A:
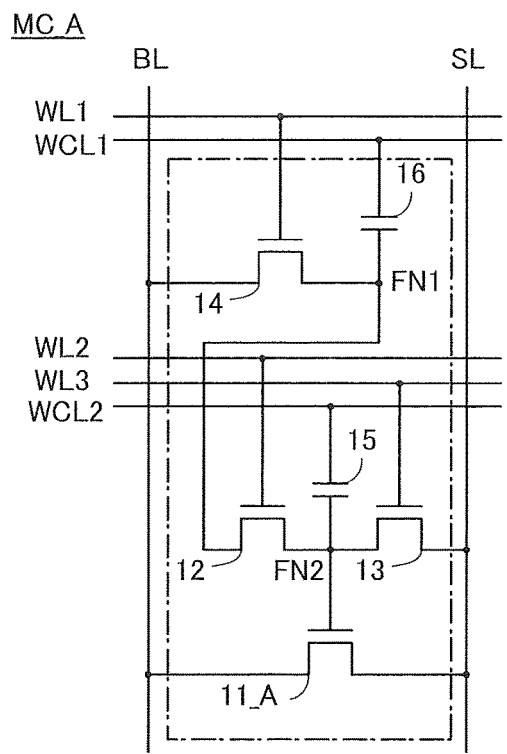
FIGS. 9A and 9B are circuit diagrams each illustrating one embodiment of the present invention.

A memory cell MC_A illustrated in FIG. 9A includes a transistor 11_A, the transistors 12 to 14, and the capacitors 15 and 16. The transistor 11_A is an n-channel transistor. The configuration in FIG. 9A can be used for the memory cell MC in FIG. 1.

Figure 9B:
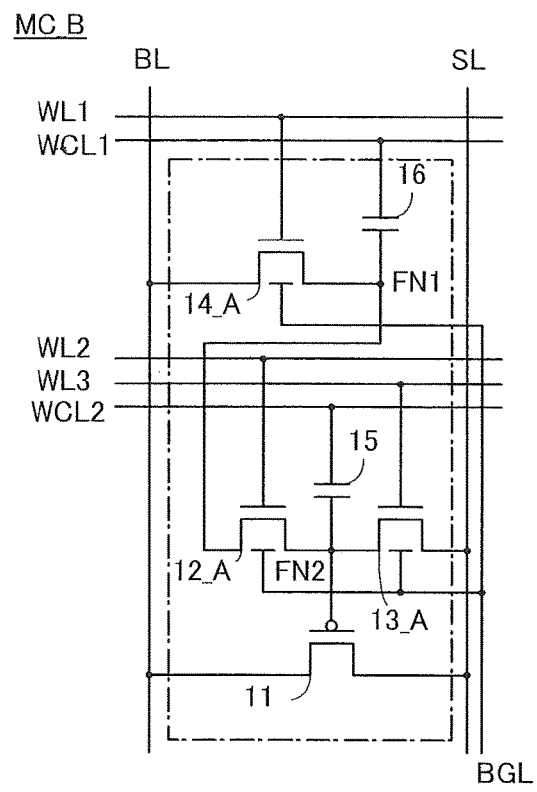

A memory cell MC_B illustrated in FIG. 9B includes the transistor 11, transistors 12_A to 14_A, and the capacitors 15 and 16. The transistors 12_A to 14_A each include a backgate that can be controlled by a wiring BGL. This configuration enables control of the threshold voltages of the transistors 12_A to 14_A. The configuration in FIG. 9B can be used for the memory cell MC in FIG. 1.

Figure 10:
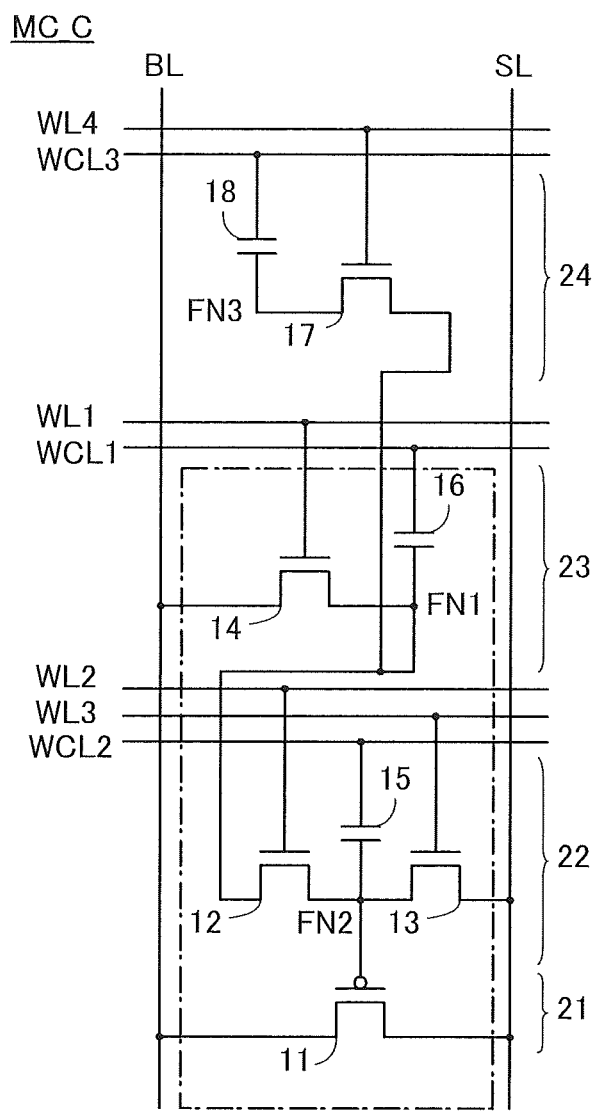
FIG. 10 is a circuit diagram illustrating one embodiment of the present invention.

A memory cell MC_C illustrated in FIG. 10 includes a transistor 17 and a capacitor 18 in addition to the configuration of the memory cell in FIG. 1. The transistor 17 and the capacitor 18 can be provided in a fourth layer 24 different from the first to third layers 21 to 23. The transistor 17 and the capacitor 18 can be controlled by a wiring WL4 and a wiring WCL3. The configuration in FIG. 10 enables an increase in the memory capacity without an increase in the circuit area of the memory cell. The configuration in FIG. 10 can be used for the memory cell MC in FIG. 1.

Figure 11:
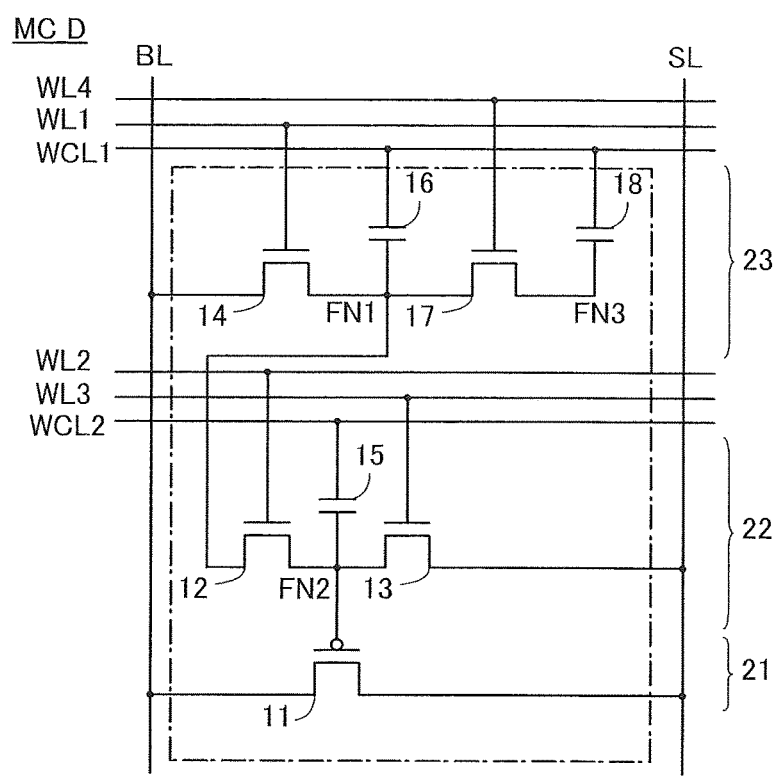
FIG. 11 is a circuit diagram illustrating one embodiment of the present invention.

The transistor 17 and the capacitor 18 illustrated in FIG. 11 may be provided in the third layer 23. The circuit configuration in that case is illustrated as a memory cell MCD in FIG. 11. The configuration in FIG. 11 enables an increase in the memory capacity without an increase in the number of layers. The configuration in FIG. 11 can be used for the memory cell MC in FIG. 1.

Figure 12A:
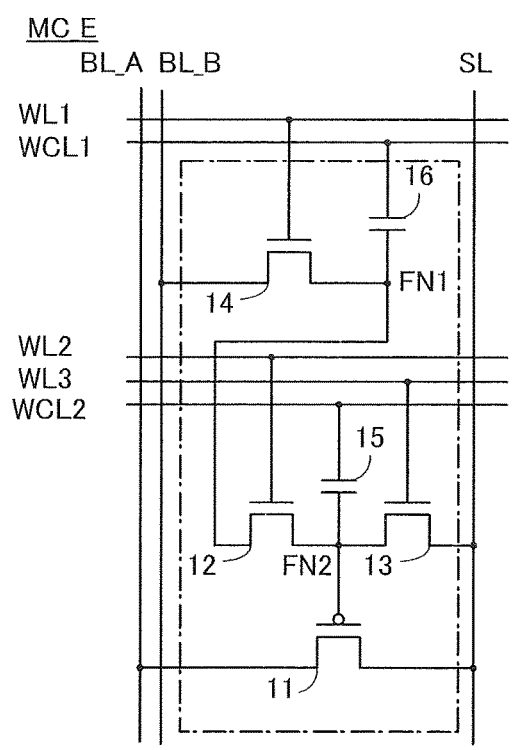
FIGS. 12A and 12B are circuit diagrams each illustrating one embodiment of the present invention.

A memory cell MC_E illustrated in FIG. 12A includes the transistors 11 to 14 and the capacitors 15 and 16. The transistor 11 and the transistor 14 are connected to a wiring BL_A and a wiring BL_B, respectively. In the configuration in FIG. 12A, the wiring BL_A can be used for writing a data voltage and the wiring BL_B can be used for reading a data voltage, for example. The configuration in FIG. 12A can be used for the memory cell MC in FIG. 1.

Figure 12B:
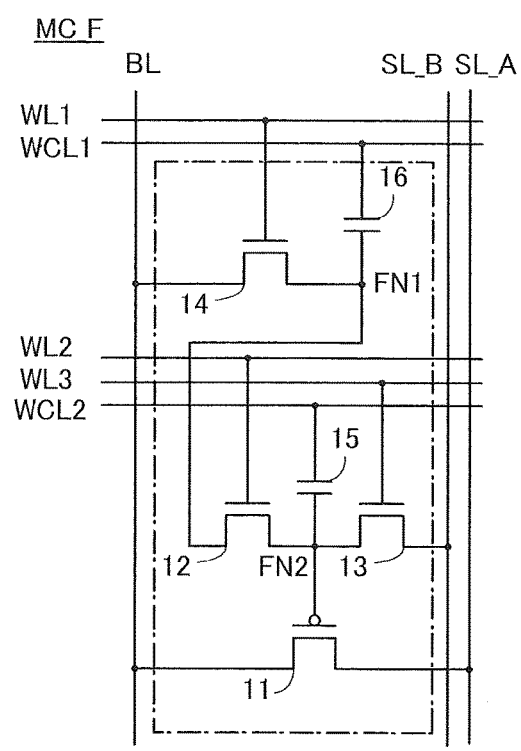

A memory cell MCF illustrated in FIG. 12B includes the transistors 11 to 14 and the capacitors 15 and 16. The transistor 11 and the transistor 13 are connected to a wiring SL_A and a wiring SL_B, respectively. In the configuration in FIG. 12B, the wiring SL_A can be used for writing a data voltage and the wiring SL_B can be used for reading a data voltage, for example. The configuration in FIG. 12B can be used for the memory cell MC in FIG. 1.

Figure 13A:
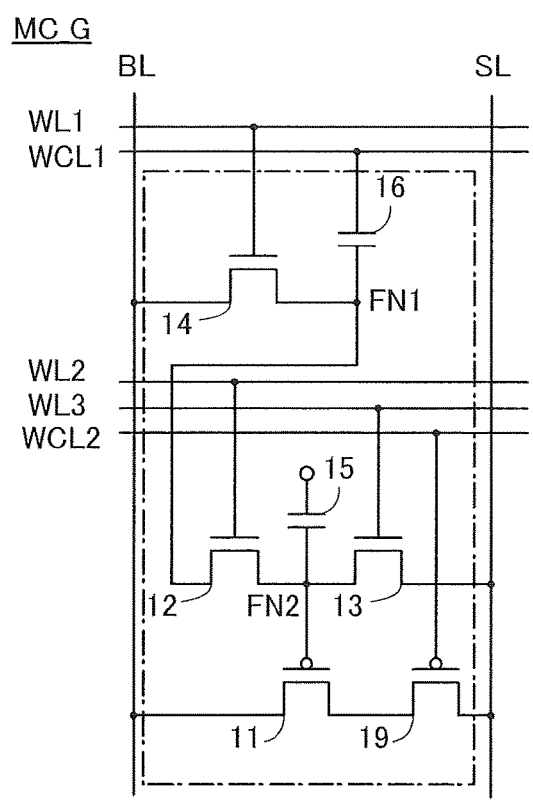
FIGS. 13A and 13B are circuit diagrams each illustrating one embodiment of the present invention.

A memory cell MC_G illustrated in FIG. 13A includes the transistors 11 to 14, the capacitors 15 and 16, and a transistor 19. The transistor 19 and the transistor 11 are p-channel transistors. The configuration in FIG. 13A can be used for the memory cell MC in FIG. 1.

Figure 13B:
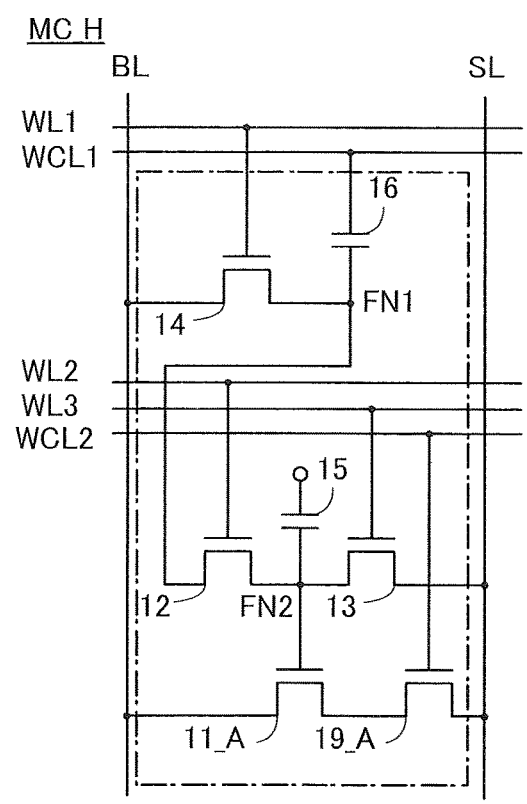

A memory cell MC_H illustrated in FIG. 13B includes the transistor 11_A, the transistors 12 to 14, the capacitors 15 and 16, and a transistor 19_A. The transistor 19_A and the transistor 11_A are n-channel transistors. The configuration in FIG. 13B can be used for the memory cell MC in FIG. 1.

Figure 33A:
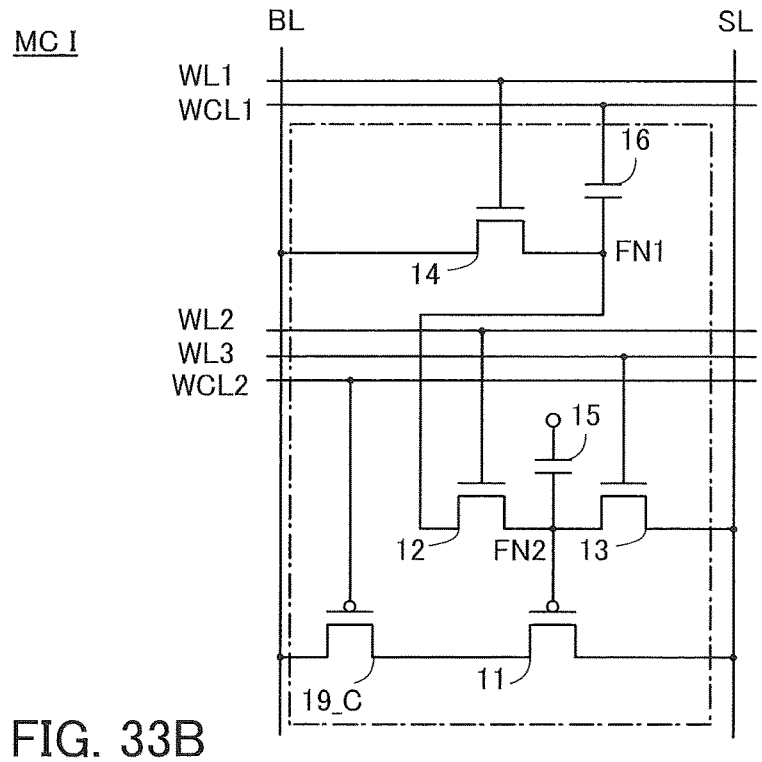
FIGS. 33A and 33B are circuit diagrams each illustrating one embodiment of the present invention.

A memory cell MC_I illustrated in FIG. 33A includes the transistors 11 to 14, the capacitors 15 and 16, and a transistor 19_C. The transistor 19_C and the transistor 11 are p-channel transistors. The configuration in FIG. 33A can be used for the memory cell MC in FIG. 1.

Figure 33B:
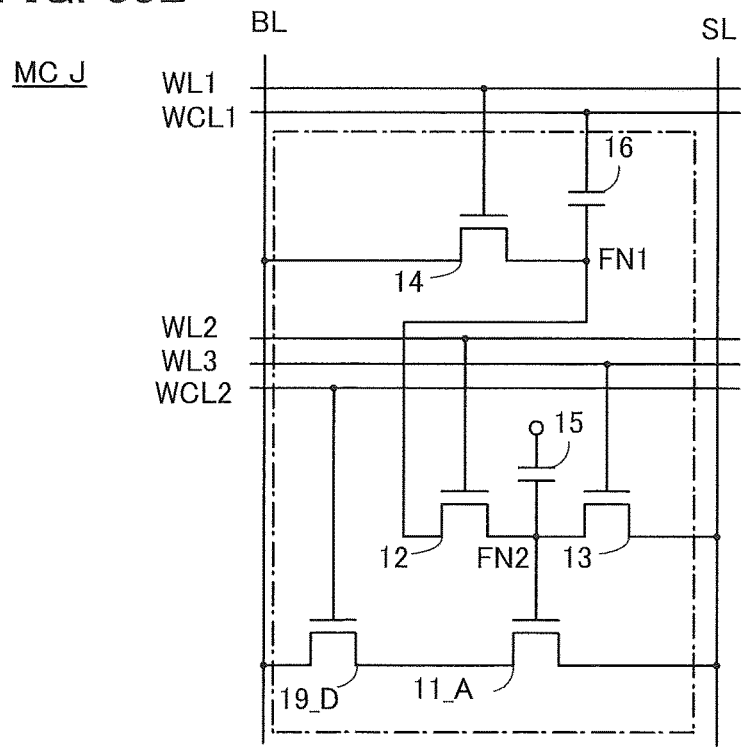

A memory cell MC_J illustrated in FIG. 33B includes the transistor 11_A, the transistors 12 to 14, the capacitors 15 and 16, and a transistor 19_D. The transistor 19_D and the transistor 11_A are n-channel transistors. The configuration in FIG. 33B can be used for the memory cell MC in FIG. 1.

Figure 34A:
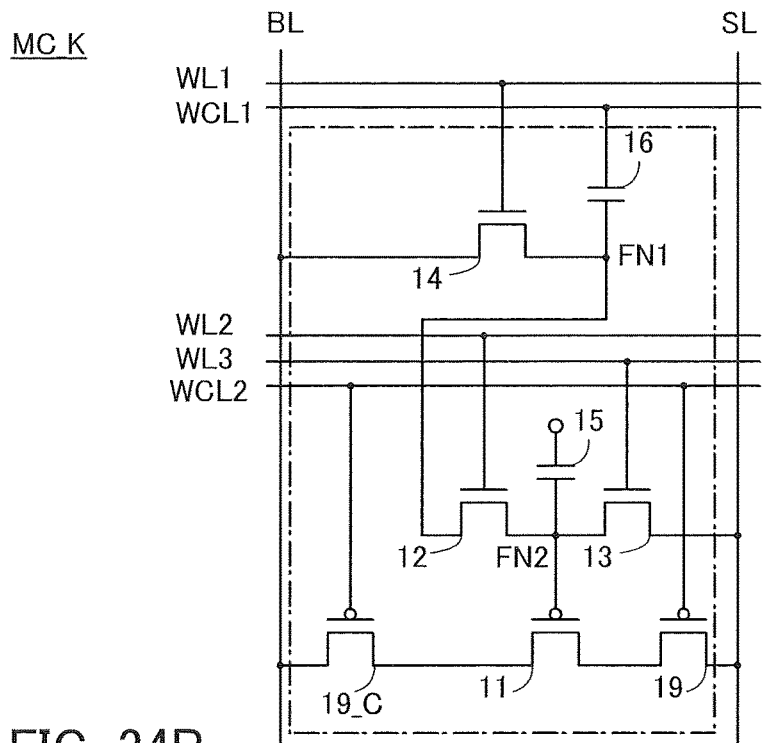
FIGS. 34A and 34B are circuit diagrams each illustrating one embodiment of the present invention.

A memory cell MC_K illustrated in FIG. 34A includes the transistors 11 to 14, the capacitors 15 and 16, the transistor 19, and the transistor 19_C. The transistors 19 and 19_C and the transistor 11 are p-channel transistors. The configuration in FIG. 34A can be used for the memory cell MC in FIG. 1.

Figure 34B:
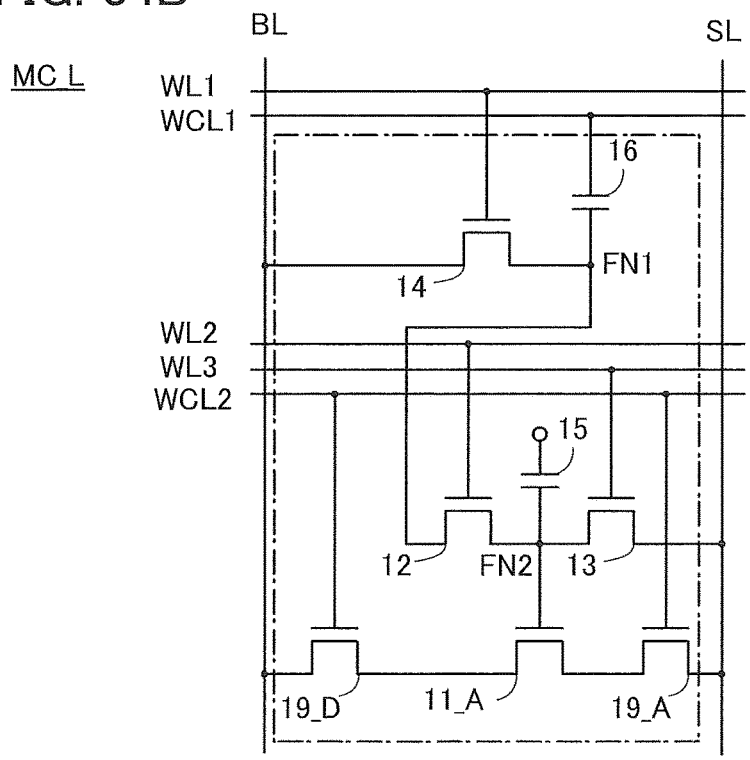

A memory cell MC_L illustrated in FIG. 34B includes the transistor 11_A, the transistors 12 to 14, the capacitors 15 and 16, and the transistors 19_A and 19_D. The transistors 19_A and 19_D and the transistor 11_A are n-channel transistors. The configuration in FIG. 34B can be used for the memory cell MC in FIG. 1.

As described above, one embodiment of the present invention can operate with a variety of modification examples.

<Summary>

As described above, a semiconductor device including the memory cell MC having the structure in this embodiment can have a structure in which a data voltage which is written to the memory cell and then read can be read by canceling $V_{th}$ of transistors for reading data voltages. As a result, the memory capacity per memory cell can be improved and data into which the read data voltage is converted can be close to accurate data; thus, the reliability of data can be excellent.

A transistor included in a data retention portion of a memory cell can be provided in a layer different from that of the transistor for reading a data voltage, in which case the transistors can be stacked. Thus, even in a memory cell including a plurality of data retention portions, the circuit area can be reduced, so that the size of the semiconductor device can be reduced.

Embodiment 2

In this embodiment, configurations of memory cells that are different from those in Embodiment 1 are described. Note that for the description of the same portions as those in Embodiment 1, Embodiment 1 is referred to, and the repeated description is omitted.

Specifically, with reference to FIG. 4A, a data voltage is written to a first data retention portion from a first wiring SL through a transistor 11 for reading the data voltage, a second wiring BL, and a second data retention portion. With reference to FIG. 4B, a data voltage is written to the second data retention portion from the first wiring SL through a transistor 11 for reading the data voltage and the second wiring BL. With such a configuration, writing the data voltage to the first data retention portion and writing the data voltage to the second data retention portion can be performed without meeting of the data voltages. In other words, with reference to FIGS. 4A and 4B, the two writing operations are not performed concurrently. Furthermore, the data voltage written to the data retention portion can be written as a data voltage ($V_D-V_{th}$) obtained by subtracting a threshold voltage ($V_{th}$) of the transistor for reading the data voltage from the original data voltage ($V_D$). The data voltage read from the data retention portion can be read as a voltage ($V_D$) obtained by adding the threshold voltage ($V_{th}$) of the transistor for reading the data voltage to the written data voltage ($V_D-V_{th}$).

Examples of a memory cell and operations of writing and reading of the memory cell are described with reference to drawings in this embodiment.

<Memory Cell MC>

Figure 35:
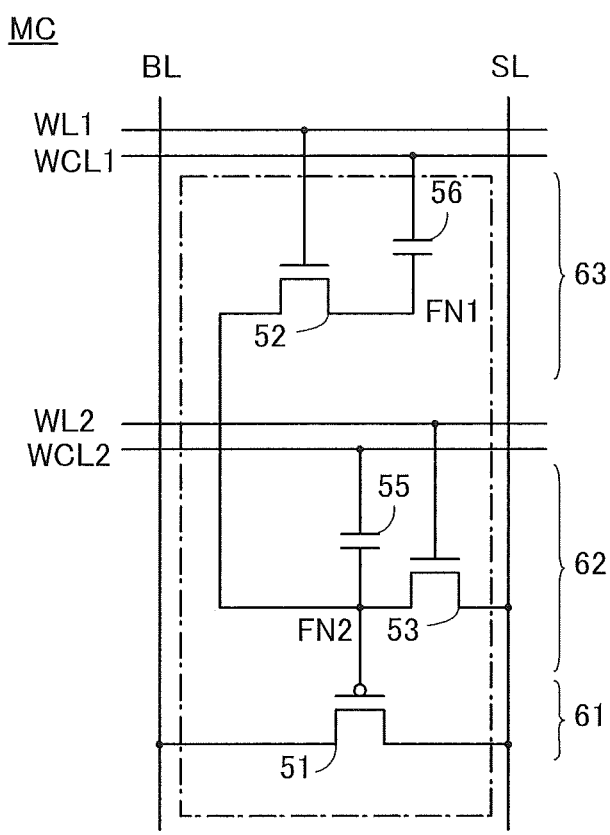
FIG. 35 is a circuit diagram illustrating one embodiment of the present invention.

An example of a circuit diagram of a memory cell MC in FIG. 35 is described.

The memory cell MC includes transistors 51 to 53 and capacitors 55 and 56. Although not illustrated in FIG. 35, a plurality of memory cells MC are provided in a matrix. The memory cell MC can control writing and reading of a data voltage in accordance with a signal or a voltage supplied to the wiring BL, the wiring SL, the wirings WL1 and WL2, and the wirings WCL1 and WCL2.

One of a source and a drain of the transistor 51 is connected to the wiring SL. The other of the source and the drain of the transistor 51 is connected to the wiring BL. Although the transistor 51 is a p-channel transistor in FIG. 35, the transistor 51 may be an n-channel transistor.

The transistor 51 is preferably a transistor including silicon in its channel formation region (Si transistor). Variation in threshold voltages of Si transistors manufactured in the same process can be reduced by adding an impurity and the like.

The memory cell MC in FIG. 35 includes two data retention portions. For example, a first data retention portion retains a charge between one of a source and a drain of the transistor 52 and one electrode of the capacitor 56 which are connected to the node FN1. A second data retention portion retains a charge between a gate of the transistor 51, the other of the source and the drain of the transistor 52, one of a source and a drain of the transistor 53, and one electrode of the capacitor 55 which are connected to the node FN2.

The other of the source and the drain of the transistor 53 is connected to the wiring SL. A gate of the transistor 52 is connected to the wiring WL1. A gate of the transistor 53 is connected to the wiring WL2. The other electrode of the capacitor 56 is connected to the wiring WCL1. The other electrode of the capacitor 55 is connected to the wiring WCL2.

The transistors 52 and 53 each function as a switch for control of writing a data voltage and retaining a charge. Note that, as each of the transistors 52 and 53, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a Si transistor, for example. An OS transistor is described in detail in a later embodiment. Although the transistors 52 and 53 are n-channel transistors in FIG. 35, the transistors 52 and 53 may be p-channel transistors.

The transistor 52 and the transistor 53 are preferably provided in different layers even when the transistors 52 and 53 are OS transistors. In other words, the memory cell MC in this embodiment preferably includes, as illustrated in FIG. 35, a first layer 61 where the transistor 51 is provided, a second layer 62 where the transistor 53 is provided, and a third layer 63 where the transistor 52 is provided. By stacking layers where transistors are provided, the circuit area can be reduced, so that the size of the semiconductor device can be reduced.

Data voltages to be written to the data retention portions connected to the nodes FN1 and FN2 are supplied to the wiring BL. A ground voltage ($V_{GND}$) for discharging a precharge voltage ($V_{pre}$) supplied to the wiring SL is supplied to the wiring BL. After a predetermined voltage is supplied to the wiring BL, the wiring BL can be set in an electrically floating state.

The precharge voltage ($V_{pre}$) for reading a voltage of the node FN2 is supplied to the wiring SL. The ground voltage ($V_{GND}$) for initializing the voltage of the wiring SL is supplied to the wiring SL. After a predetermined voltage is supplied to the wiring SL, the wiring SL can be set in an electrically floating state.

First and second word signals are supplied to the wirings WL1 and WL2. A read word signal is supplied to the wiring WCL2. A fixed voltage, e.g., $V_{GND}$ is supplied to the wiring WCL1.

<Writing Operation of Data Voltage to Memory Cell MC>

Next, a writing operation of a data voltage to the memory cell MC is described.

Figure 36:
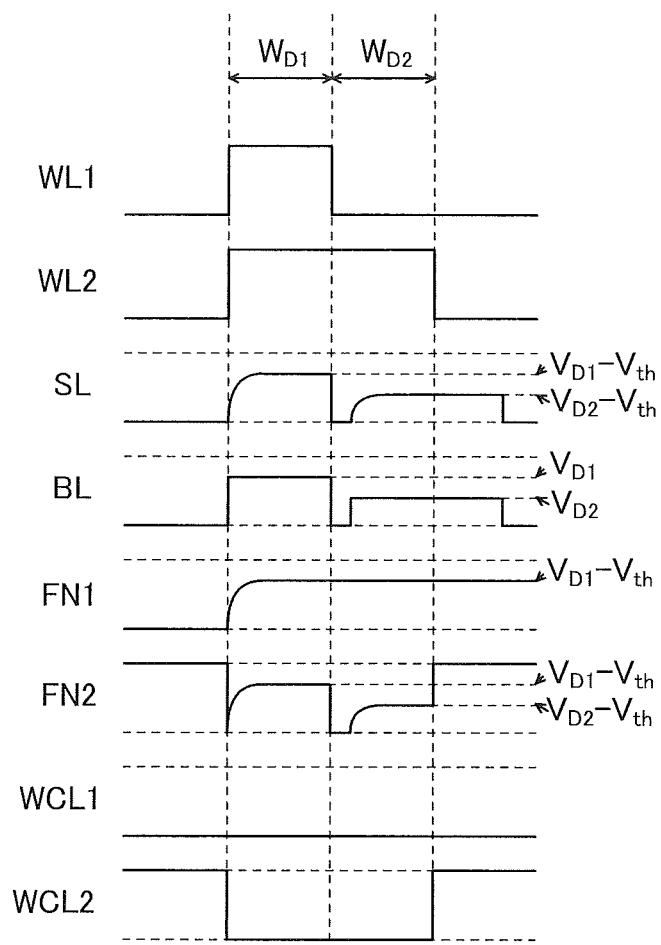
FIG. 36 is a timing chart of one embodiment of the present invention.
Figure 38A:
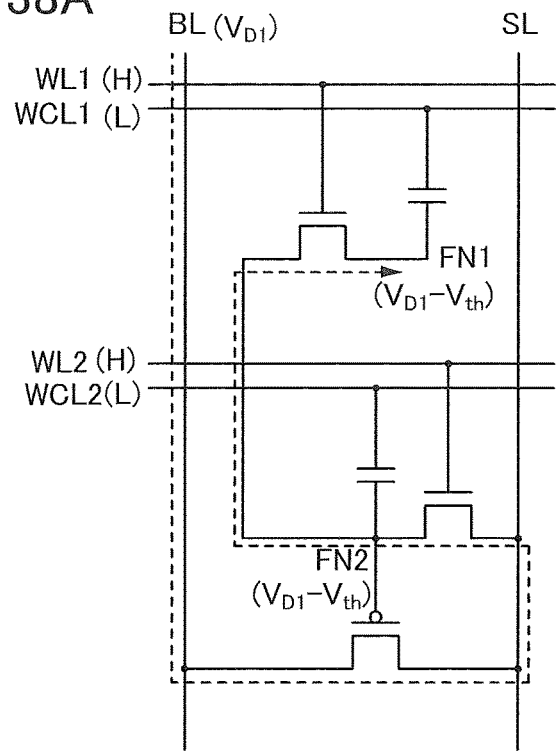
FIGS. 38A and 38B are circuit diagrams illustrating one embodiment of the present invention.
Figure 38B:
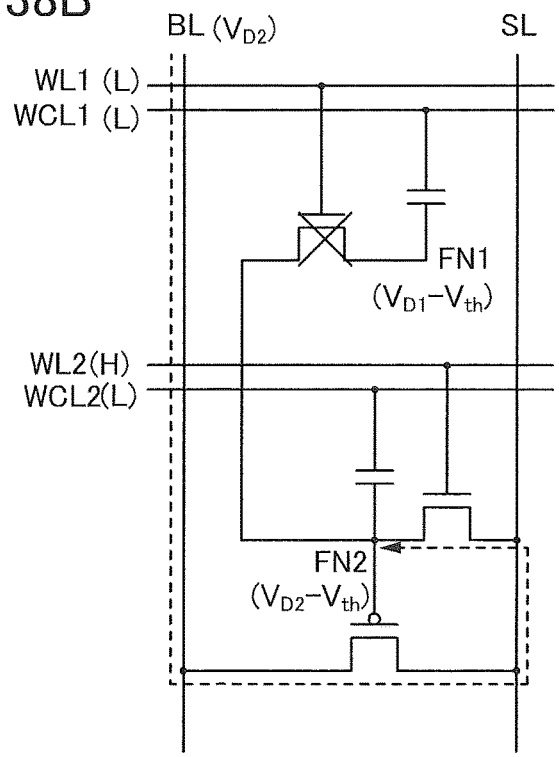

FIG. 36 is a timing chart of a writing operation of a data voltage to the memory cell MC in FIG. 35. FIG. 36 illustrates a period $W_{D1}$ in which a data voltage is written to the data retention portion connected to the node FN1 and a period $W_{D2}$ in which a data voltage is written to the data retention portion connected to the node FN2. FIGS. 38A and 38B are circuit diagrams visualizing current flows, the conduction states of the transistors, and voltages of the wirings and the nodes FN1 and FN2 in the period $W_{D1}$ and the period $W_{D2}$. Although the reference numerals of the transistors and the capacitors are omitted in FIGS. 38A and 38B, the circuit configurations in FIGS. 38A and 38B are the same as that in FIG. 35 and the description is made using the same reference numerals as those in FIG. 35.

In FIG. 36 and FIGS. 38A and 38B, the description is made on the assumption that the data voltage written to the data retention portion connected to the node FN1 is represented as $V_{D1}$, the data voltage written to the data retention portion connected to the node FN2 is represented as $V_{D2}$, and the threshold voltage of the transistor 51 is represented as $V_{th}$.

In the period $W_{D1}$, the voltage of the wiring BL is set at $V_{D1}$, and after the voltage of the wiring SL is set at $V_{GND}$, the wiring SL is brought into an electrically floating state. The wirings WL1 and WL2 are set at a high level. The wiring WCL1 and the wiring WCL2 are set at a low level. Then, the voltage of the node FN2 in an electrically floating state is decreased, so that a current flows through the transistor 51. The current flows through the transistor 51, so that the voltage of the wiring SL is increased. At this time, the transistors 52 and 53 are on. Thus, as the voltage of the wiring SL is increased, the voltages of the nodes FN1 and FN2 are increased. When the voltage of the node FN2 is increased and a voltage ($V_{gs}$) between a gate and a source of the transistor 51 becomes the threshold voltage $V_{th}$ of the transistor 51, the current flowing through the transistor 51 is decreased. Accordingly, the voltages of the wiring SL and the nodes FN1 and FN2 stop increasing, so that the voltages of the nodes FN1 and FN2 are fixed at "$V_{D1}-V_{th}$" in which $V_{D1}$ is decreased by $V_{th}$. The above is the writing operation of the data voltage to the data retention portion connected to the node FN1.

FIG. 38A illustrates a charge flow, the conduction states of the transistors, and voltages of the wiring BL and the nodes FN1 and FN2 in the operation in the period $W_{D1}$. The charge flow is indicated by a dotted arrow. The non-conduction state of the transistor is represented by a cross. The high-level voltage of the wiring is represented by "H" and the low-level voltage of the wiring is represented by "L". Note that the low level is represented by "$V_{GND}$" in some cases. As illustrated in FIG. 38A, when a current flows through the transistor 51, $V_{D1}$ supplied to the wiring SL is supplied to the wiring SL, so that the voltages of the nodes FN1 and FN2 are increased. When the voltage of the node FN2 becomes "$V_{D1}-V_{th}$" with the increase in the voltages, $V_{gs}$ of the transistor 51 becomes $V_{th}$, so that the current flow is stopped.

In the period $W_{D2}$, the wiring BL is set at $V_{D2}$, and after the wiring SL is set at $V_{GND}$, the wiring SL is brought into an electrically floating state. The wiring WL2 is set at the high level. The wiring WL1 and the wirings WCL1 and WCL2 are set at the low level. The transistor 53 is turned on, so that the wiring SL is set at the low level. Thus, the wiring SL is set at $V_{GND}$ and the voltage of the node FN2 is decreased to the low level, so that the current flows through the transistor 51. By the current flow, the voltage of the wiring SL is increased. The transistor 53 is turned on. Thus, as the voltage of the wiring SL is increased, the voltage of the node FN2 is increased. When the voltage of the node FN2 is increased and $V_{gs}$ of the transistor 51 becomes $V_{th}$ of the transistor 51, the current flowing through the transistor 51 is decreased. Accordingly, an increase in the voltages of the wiring SL and the node FN2 is stopped, so that the voltage of the node FN2 is fixed at "$V_{D2}-V_{th}$" in which $V_{D2}$ is decreased by $V_{th}$. The above is the writing operation of the data voltage to the data retention portion connected to the node FN2.

FIG. 38B illustrates, like FIG. 38A, a charge flow, the conduction states of the transistors, and the voltages of the wiring BL and the nodes FN1 and FN2 in the operation in the period $W_{D2}$. As illustrated in FIG. 38B, when a current flows through the transistor 51, $V_{D2}$ supplied to the wiring BL is supplied to the wiring SL, so that the voltage of the node FN2 is increased. When the voltage of the node FN2 becomes "$V_{D2}-V_{th}$" with the increase in the voltage, $V_{gs}$ of the transistor 51 becomes $V_{th}$, so that the current flow is stopped. At this time, the transistor 52 is off and the voltage of the node FN1 remains at "$V_{D1}-V_{th}$" written in the period $W_{D1}$.

In the memory cell MC, after data voltages are written to the plurality of data retention portions, the wiring WCL2 is set at the high level, so that the voltage of the node FN2 is increased. Then, the transistors are turned off to stop movement of charges; thus, the written data voltages are retained.

By the above-described writing operation of the data voltage to the nodes FN1 and FN2, the data voltages can be retained in the plurality of data retention portions. Consequently, the memory capacity per memory cell can be increased. Although examples where "$V_{D1}-V_{th}$" and "$V_{D2}-V_{th}$" are used as the written voltages are described, they are data voltages corresponding to multilevel data. Therefore, in the case where the data retention portions each retain 4-bit data, 16-level "$V_{D1}-V_{th}$" and 16-level "$V_{D2}-V_{th}$" can be obtained.

Note that data voltages read from the plurality of data retention portions are A/D converted. The resolution of the A/D converter depends on data with a large number of bits. In the case where 8-bit data is retained in two data retention portions, retaining data divided into 4-bit data is efficient. For example, in the case where 5-bit data and 3-bit data are retained in the respective data retention portions, a 5-bit A/D converter is needed, which is inefficient. Therefore, when the numbers of bits retained in the data retention portions are the same or substantially the same, the size of a circuit for A/D conversion can be reduced.

Note that data retained in the data retention portion may be different bit data. For example, in the case where the original data is 8-bit data, instead of the configuration where 4-bit data is retained at the node FN1 and 4-bit data is retained at the node FN2, 3-bit data may be retained at the node FN1 and 5-bit data may be retained at the node FN2. The original data can be other multilevel data, e.g., 9-bit data or 10-bit data.

<Reading Operation of Data Voltage from Memory Cell MC>

Next, a reading operation of a data voltage from the memory cell MC is described. Note that the written data voltage is lost in the reading operation. Therefore, it is preferable that the data voltage be written again by a refresh operation after the data voltage is read. Although an example where the wiring SL is precharged and the wiring BL is discharged is described below, the configuration may be reversed. In other words, the wiring BL may be precharged and the wiring SL may be discharged.

Figure 37:
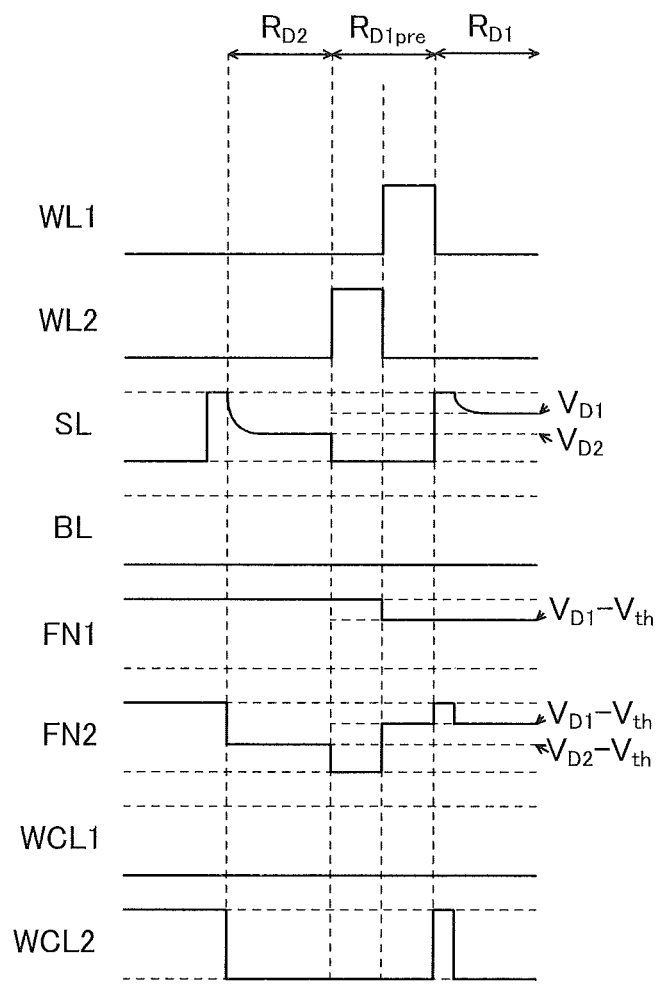
FIG. 37 is a timing chart of one embodiment of the present invention.

FIG. 37 is a timing chart of a reading operation of a data voltage from the memory cell MC in FIG. 35. FIG. 37 shows a period $R_{D2}$ in which a data voltage is read from the data retention portion connected to the node FN2, a period $R_{D1pre}$ for preparing for reading of a data voltage from the data retention portion connected to the node FN1, and a period $R_{D1}$ in which a data voltage is read from the data retention portion connected to the node FN2. FIGS. 39A and 39B and FIGS. 40A and 40B are circuit diagrams visualizing current flows, the conduction states of the transistors, and the voltages of the wirings and the nodes FN1 and FN2 in the period $R_{D1}$, the former half of the period $R_{D1pre}$, the latter half of the period $R_{D1pre}$, and the period $R_{D2}$.

Note that description for $V_{D1}$ and $V_{D2}$ in FIG. 37, FIGS. 39A and 39B, and FIGS. 40A and 40B is the same as the description of the writing operation.

First, in the period $R_{D2}$, the wiring SL which is supplied with $V_{pre}$ and is electrically floating in advance is discharged. The wirings WL1, WL2, and WCL1 are set low. When the wiring WCL2 is set low, the voltage of the node FN2 which is electrically floating is set at "$V_{D2}-V_{th}$". The voltage of the node FN2 is decreased, so that a current flows through the transistor 51. By the current flow, the voltage of the wiring SL which is electrically floating is decreased. As the voltage of the wiring SL is decreased, $V_{gs}$ of the transistor 51 is decreased. When $V_{gs}$ of the transistor 51 becomes $V_{th}$ of the transistor 51, the current flowing through the transistor 51 is decreased. In other words, the voltage of the wiring SL becomes "$V_{D2}$" which is larger than the voltage of the node FN2, "$V_{D2}-V_{th}$", by $V_{th}$. The voltage of the wiring SL corresponds to the data voltage of the data retention portion connected to the node FN2. The data voltage of the read analog value is subjected to A/D conversion, so that data of the data retention portion connected to the node FN2 is obtained. The above is the reading operation of the data voltage of the data retention portion connected to the node FN2.

Figure 39A:
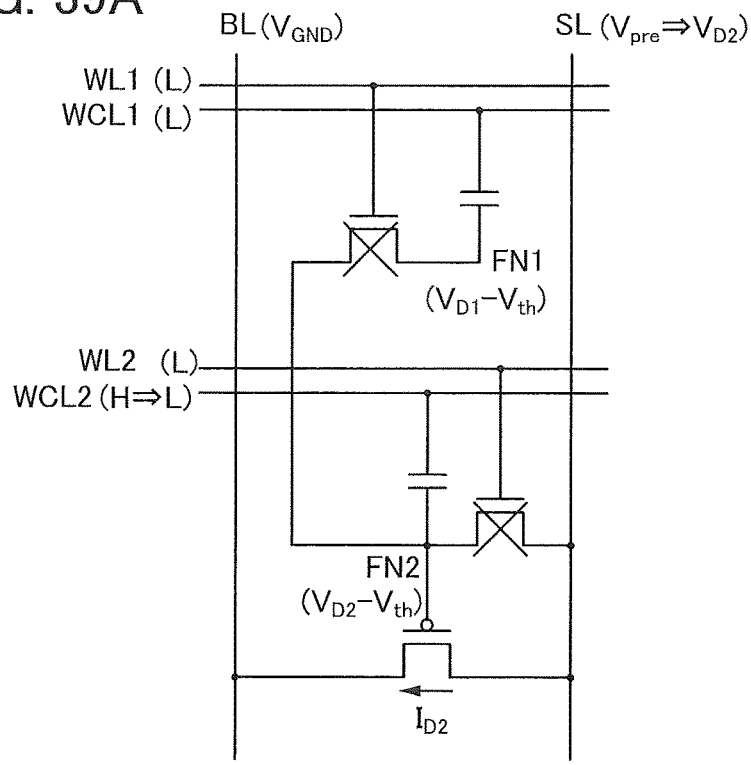
FIGS. 39A and 39B are circuit diagrams illustrating one embodiment of the present invention.

FIG. 39A, like FIGS. 38A and 38B, shows a charge flow, the conduction states of the transistors, and the voltages of the wiring SL and the nodes FN1 and FN2 in the operation in the period $R_{D2}$. As shown in FIG. 39A, the wiring SL is electrically floating after $V_{pre}$ is supplied to the wiring SL once. By changing the voltage of the wiring WCL2 from high to low, a current $I_{D2}$ flows through the transistor 51. When the current $I_{D2}$ flows, the voltage of the wiring SL which is in a floating state is decreased. With the decrease in the voltage, the voltage of the wiring SL is set at "$V_{D2}$". In the transistor 51, $V_{gs}$ between "$V_{D2}-V_{th}$" of the node FN2 and "$V_{D2}$" of the wiring SL becomes $V_{th}$, so that the current $I_{D2}$ stops. Then, "$V_{D2}$" written in the period $W_{D2}$ is read to the wiring SL.

Next, the period $R_{D1pre}$ is a preparation period for reading "$V_{D1}$" written in the period $W_{D1}$. In the period, the former-half operation and the latter-half operation are different.

In the former half of the period $R_{D1pre}$, "$V_{D2} V_{th}$" of the node FN2 is discharged. The wirings SL and BL are set low. The wiring WL2 is set high. The wiring WL1 and the wirings WCL1 and WCL2 are set low. The transistor 53 is turned on, so that the node FN2 is set low.

Figure 39B:
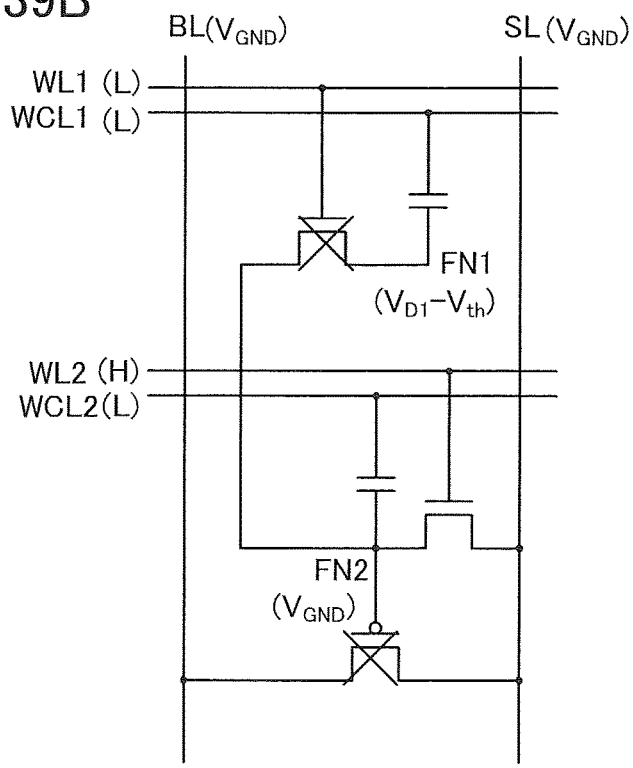

FIG. 39B, like FIGS. 38A and 38B, shows the conduction states of the transistors and the voltages of the wiring SL and the nodes FN1 and FN2 in the operation in the former half of the period $R_{D1pre}$. As shown in FIG. 39B, the voltage of the wiring SL is set at $V_{GND}$, i.e., a low level. The transistor 53 is turned on, so that the voltage of the node FN2 is set at $V_{GND}$.

In the latter half of the period $R_{D1pre}$, charges retained in the node FN1 are distributed to the node FN2, and a data voltage of the data retention portion connected to the node FN1 is transferred to the data retention portion connected to the node FN2. The wirings SL and BL are set low. The wiring WL1 is set high. The wiring WL2 and the wirings WCL1 and WCL2 are set low. The transistor 52 is turned on, so that the charges in the node FN1 are distributed between the node FN1 and the node FN2.

By distributing the charges in the node FN1 to the node FN2, the capacitance of the node which retains the voltage of the node FN1, "$V_{D1}-V_{th}$", is increased by the capacitance of the capacitor 55. Therefore, the voltage after the charge distribution is decreased from the written voltage, "$V_{D1}-V_{th}$". Thus, the capacitance of the capacitor 56 is preferably larger than the capacitance of the capacitor 55. Alternatively, the voltage written to the node FN1, "$V_{D1}-V_{th}$", is preferably larger than the voltage corresponding to the same data, "$V_{D2}-V_{th}$". By changing the ratio of the capacitances and setting the written voltage larger in advance as described above, a decrease in voltage after the charge distribution can be suppressed.

Figure 40A:
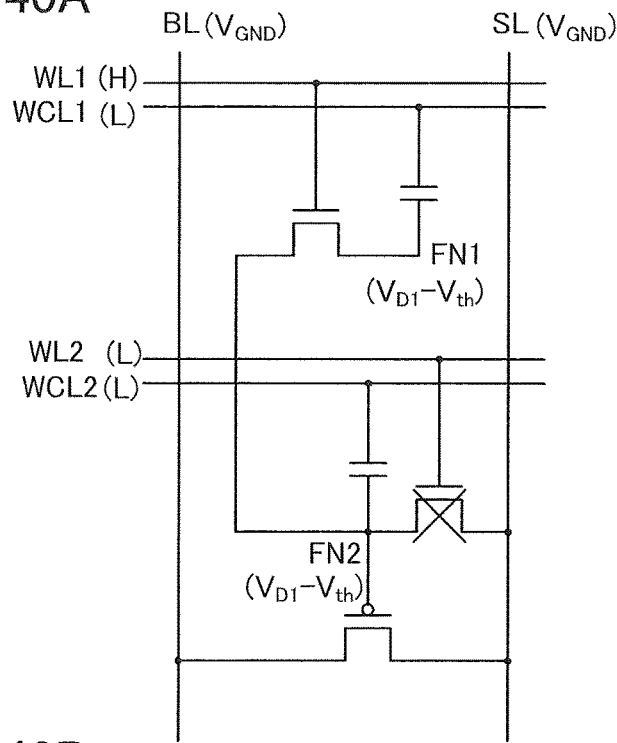
FIGS. 40A and 40B are circuit diagrams illustrating one embodiment of the present invention.

FIG. 40A, like FIGS. 38A and 38B, shows the conduction states of the transistors and the voltages of the wiring SL and the nodes FN1 and FN2 in the operation in the latter half of the period $R_{D1pre}$. As shown in FIG. 40A, the transistor 52 is turned on, so that charges of the node FN1 are distributed to the node FN2. As described above, the voltage written to the node FN1, "$V_{D1}-V_{th}$", is decreased by distributing the charges between the nodes FN1 and FN2; however, it is represented as the voltage, "$V_{D1}-V_{th}$", here.

Next, in the period $R_{D1}$, the wiring SL which is supplied with $V_{pre}$ and is electrically floating in advance is discharged. The wirings WL1, WL2, and WCL1 are set low. The wiring WCL2 is set high at the time of precharge and then, set low. When the wiring WCL2 is set low, the voltage of the node FN2 which is electrically floating is set at "$V_{D1}-V_{th}$". The voltage of the node FN2 is decreased, so that a current flows through the transistor 51. The current flows, so that the voltage of the wiring SL which is electrically floating is decreased. As the voltage of the wiring SL is decreased, $V_{gs}$ of the transistor 51 is decreased. When $V_{gs}$ of the transistor 51 becomes $V_{th}$ of the transistor 51, the current flowing through the transistor 51 is decreased. In other words, the voltage of the wiring SL becomes "$V_{D1}$" which is larger than the voltage of the node FN2, "$V_{D1}-V_{th}$", by $V_{th}$. The voltage of the wiring SL corresponds to the data voltage of the data retention portion connected to the node FN1. The data voltage of the read analog value is subjected to A/D conversion, so that data of the data retention portion connected to the node FN1 is obtained. The above is the reading operation of the data voltage of the data retention portion connected to the node FN1.

Figure 40B:
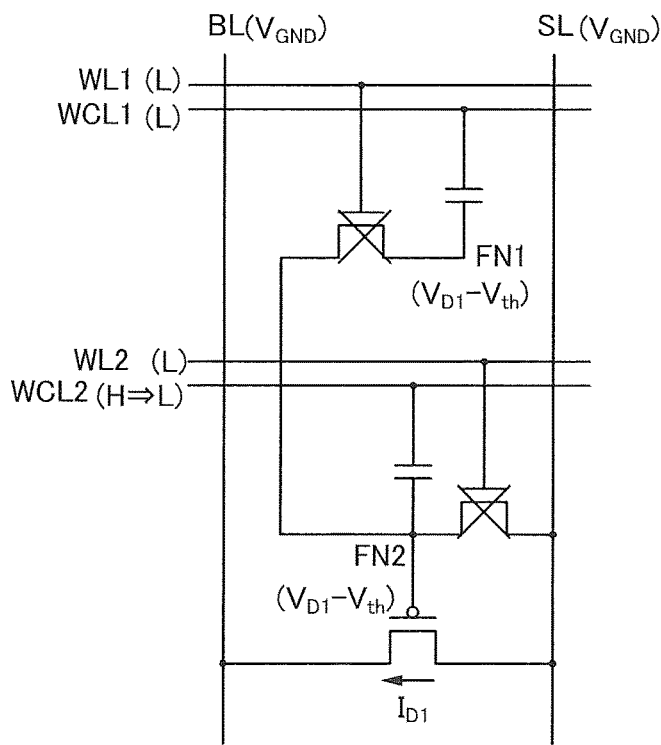

FIG. 40B, like FIGS. 38A and 38B, shows a charge flow, the conduction states of the transistors, and the voltages of the wiring SL and the nodes FN1 and FN2 in the operation in the period $R_{D1}$. As shown in FIG. 40B, the wiring SL is electrically floating after $V_{pre}$ is supplied to the wiring SL once. By changing the voltage of the wiring WCL2 from high to low, a current $I_{D1}$ flows through the transistor 51. When the current $I_{D1}$ flows, the voltage of the wiring SL which is in a floating state is decreased. With the decrease in the voltage, the voltage of the wiring SL is set at "$V_{D1}$". In the transistor 51, $V_{gs}$ between "$V_{D1}-V_{th}$" of the node FN2 and "$V_{D1}$" of the wiring SL becomes $V_{th}$, so that the current $I_{D1}$ stops. Then, "$V_{D1}$" written in the period $W_{D1}$ is read to the wiring SL.

In the above-described reading operation of data voltages from the nodes FN1 and FN2, data voltages can be read from a plurality of data retention portions. Therefore, the memory capacity per memory cell can be increased. The read voltage can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability is excellent.

<A Plurality of Voltage Levels Supplied to Data Retention Portions>

Data voltages supplied to the nodes FN1 and FN2 are similar to those described with reference to FIGS. 7A to 7D and FIGS. 8A and 8B.

<Modification Examples of Memory Cell MC>

FIGS. 41A and 41B, FIG. 42, and FIG. 43 illustrate modification examples of a circuit configuration that the memory cell MC described in FIG. 35 can have.

Figure 41A:
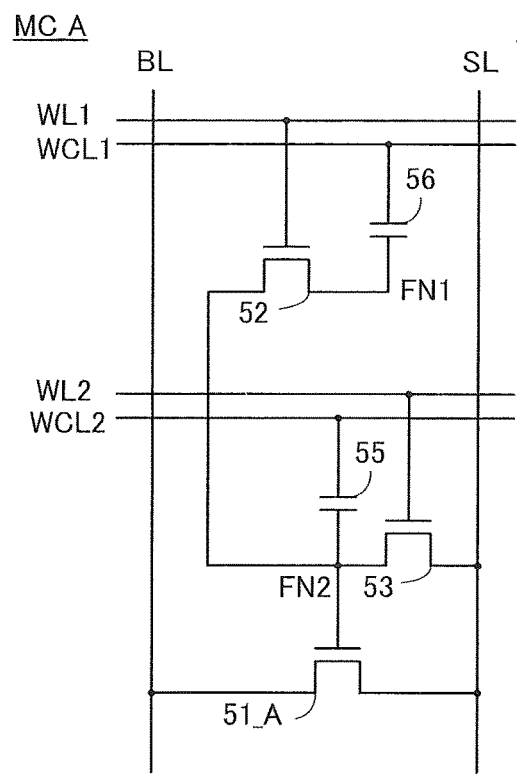
FIGS. 41A and 41B are circuit diagrams each illustrating one embodiment of the present invention.

A memory cell MC_A illustrated in FIG. 41A includes a transistor 51_A, the transistors 52 and 53, and the capacitors 55 and 56. The transistor 51_A is an n-channel transistor. The configuration in FIG. 41A can be used for the memory cell MC in FIG. 35.

Figure 41B:
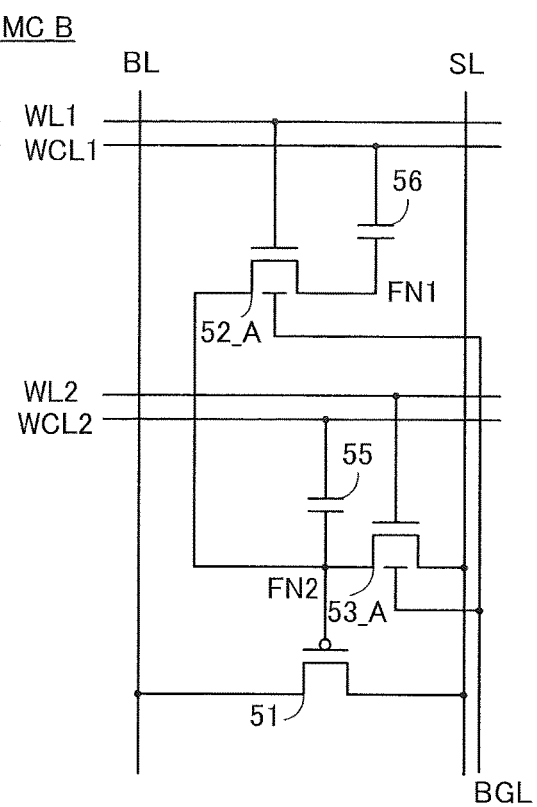

A memory cell MC_B illustrated in FIG. 41B includes the transistor 51, transistors 52_A and 53_A, and the capacitors 55 and 56. The transistors 52_A and 53_A each include a backgate that can be controlled by a wiring BGL. This configuration enables control of the threshold voltages of the transistors 52_A and 53_A. The configuration in FIG. 41B can be used for the memory cell MC in FIG. 35.

Figure 42:
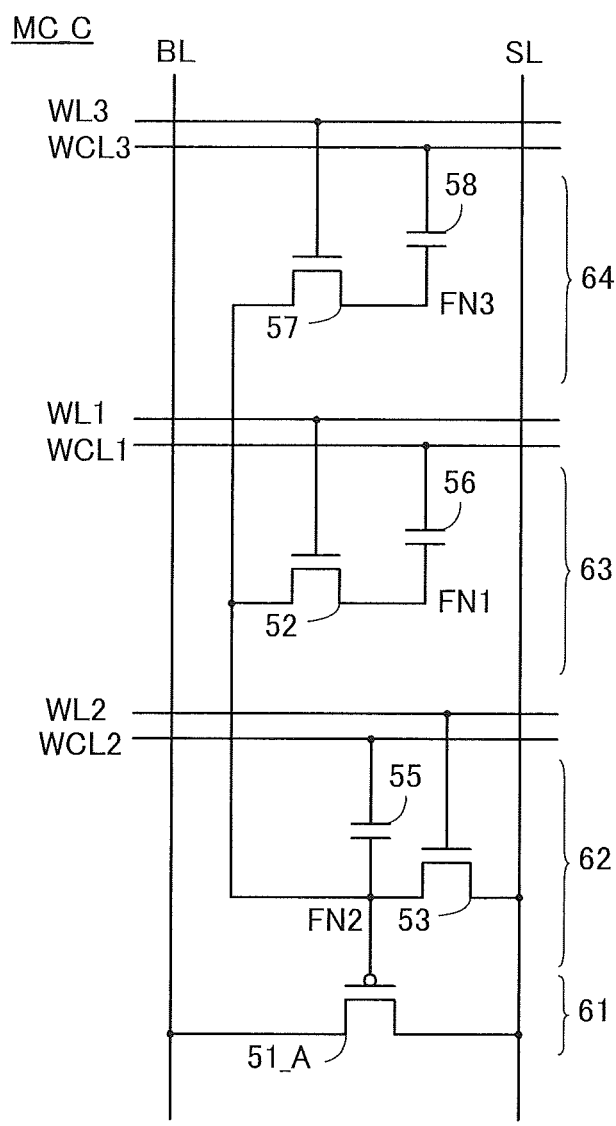
FIG. 42 is a circuit diagram illustrating one embodiment of the present invention.
Figure 43:
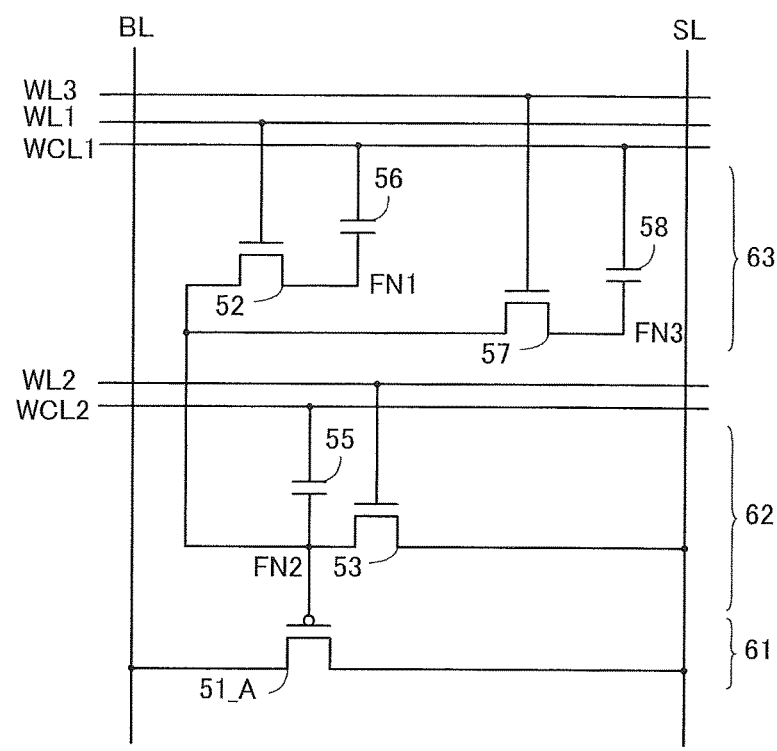
FIG. 43 is a circuit diagram illustrating one embodiment of the present invention.

A memory cell MC_C illustrated in FIG. 42 includes a transistor 57 and a capacitor 58 in addition to the configuration of the memory cell in FIG. 35. The transistor 57 and the capacitor 58 can be provided in a fourth layer 64 different from the first to third layers 61 to 63. The transistor 57 and the capacitor 58 can be controlled by a wiring WL3 and a wiring WCL3. The configuration in FIG. 42 enables an increase in the memory capacity without an increase in the circuit area of the memory cell. The configuration in FIG. 42 can be used for the memory cell MC in FIG. 35.

The transistor 57 and the capacitor 58 illustrated in FIG. 42 may be provided in the third layer 63. The circuit configuration in that case is illustrated as a memory cell MC_D in FIG. 43. The configuration in FIG. 43 enables an increase in the memory capacity without an increase in the number of layers. The configuration in FIG. 43 can be used for the memory cell MC in FIG. 35.

As described above, one embodiment of the present invention can operate with a variety of modification examples.

Embodiment 3

In this embodiment, an example of a random access memory (RAM) including the memory cell illustrated in FIG. 1 is described. Description below is made with reference to FIG. 14, FIG. 15, FIG. 16, and FIG. 17. A RAM is referred to as a memory device or a semiconductor device in some cases.

<Configuration Example of RAM>

Figure 14:
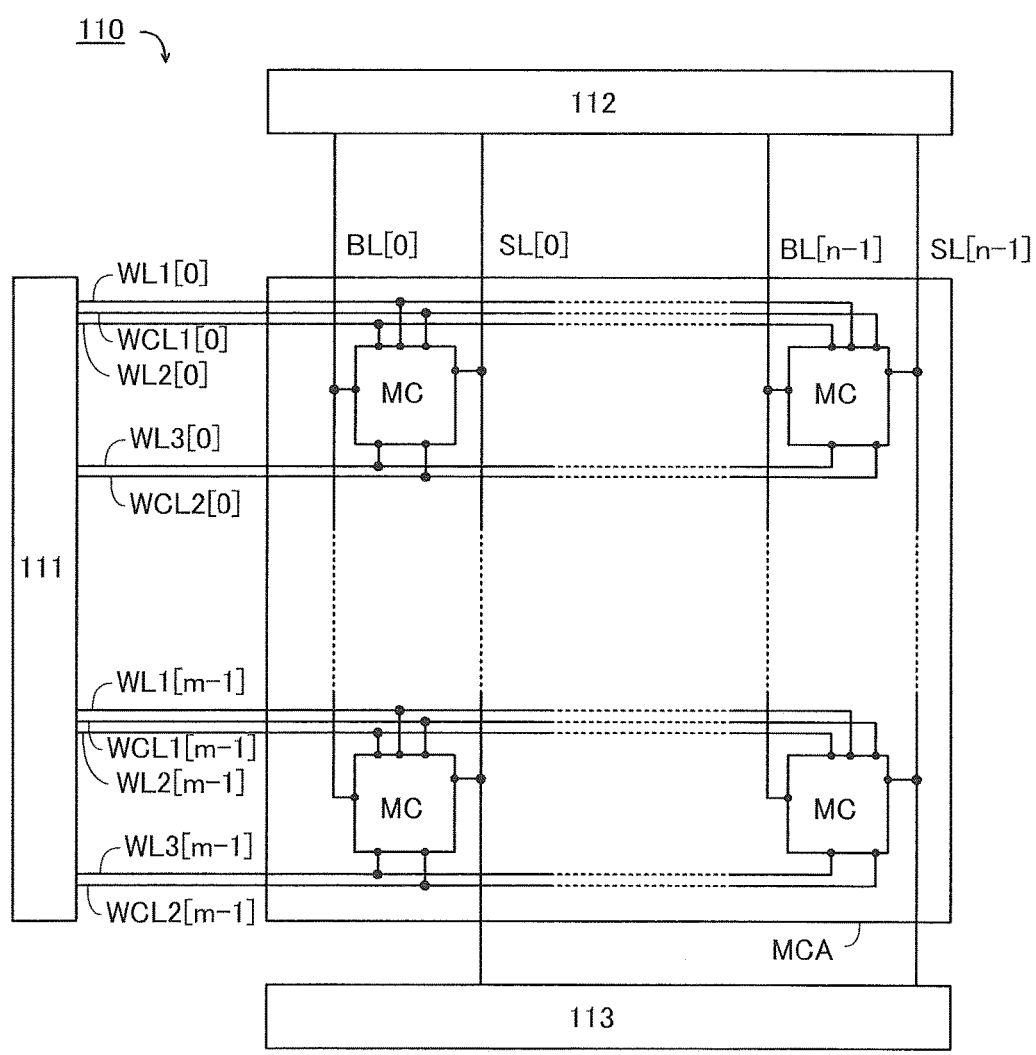
FIG. 14 is a block diagram illustrating one embodiment of the present invention.

FIG. 14 is a block diagram illustrating a configuration example of a RAM including the memory cell MC in FIG. 1.

A RAM 110 illustrated in FIG. 14 includes a memory cell array MCA including a plurality of memory cells MC in FIG. 1, a row decoder 111, a column decoder 112, and an A/D converter 113. In the RAM 110, the memory cells MC are arranged in a matrix of in rows and n columns (in and n are each a natural number of 2 or more).

In FIG. 14, wirings WL1[0] to WL1[m−1], wirings WCL1[0] to WCL1[m−1], wirings WL2[0] to WL2[m−1], wirings WL3[0] to WL3[m−1], wirings WCL2[0] to WCL2[m−1], wirings BL[0] to BL[n−1], and wirings SL[0] to SL[n−1] are provided.

In the memory cell array MCA in FIG. 14, the memory cells MC illustrated in FIG. 1 are arranged in a matrix. In the memory cell MC in FIG. 1, multilevel data can be read as accurate data. Thus, the RAM 110 can have large memory capacity and high reliability.

The row decoder 111 is a circuit having a function of supplying a first word signal to the wirings WL1 [0] to WL1[m−1], supplying a second word signal to the wirings WL2[0] to WL2[m−1], supplying a third word signal to the wirings WL3[0] to WL3 [m−1], supplying $V_{GND}$ to the wirings WCL1 [0] to WCL1[m−1], and supplying a read word signal to the wirings WCL2[0] to WCL2[m−1]. The wirings WL1[0] to WL1[m−1], the wirings WL2[0] to WL2[m−1], the wirings WL3[0] to WL3[m−1], the wirings WCL1[0] to WCL1[m−1], and the wirings WCL2[0] to WCL2[m−1] are connected to the memory cells MC. The row decoder 111 is a circuit for supplying signals to the wirings, and is simply referred to as a circuit in some cases.

The column decoder 112 is a circuit having a function of selectively supplying data to the wiring SL and the wiring BL, a function of selectively precharging the wiring SL and the wiring BL, a function of selectively setting the wiring SL and the wiring BL at the ground voltage, and a function of selectively setting the wiring SL and the wiring BL in an electrically floating state. The column decoder 112 is a circuit for supplying signals or voltages to the wirings, and is simply referred to as a circuit in some cases.

The A/D converter 113 is a circuit which has functions of converting the voltages of the wirings SL, which are analog values, into digital values and outputting the digital values outside.

Note that although flash A/D converters are used as the A/D converters 113 in the description, successive approximation A/D converters, multi-slope A/D converters, or delta-sigma A/D converters may be used.

<Configuration Example of Row Decoder>

Figure 15:
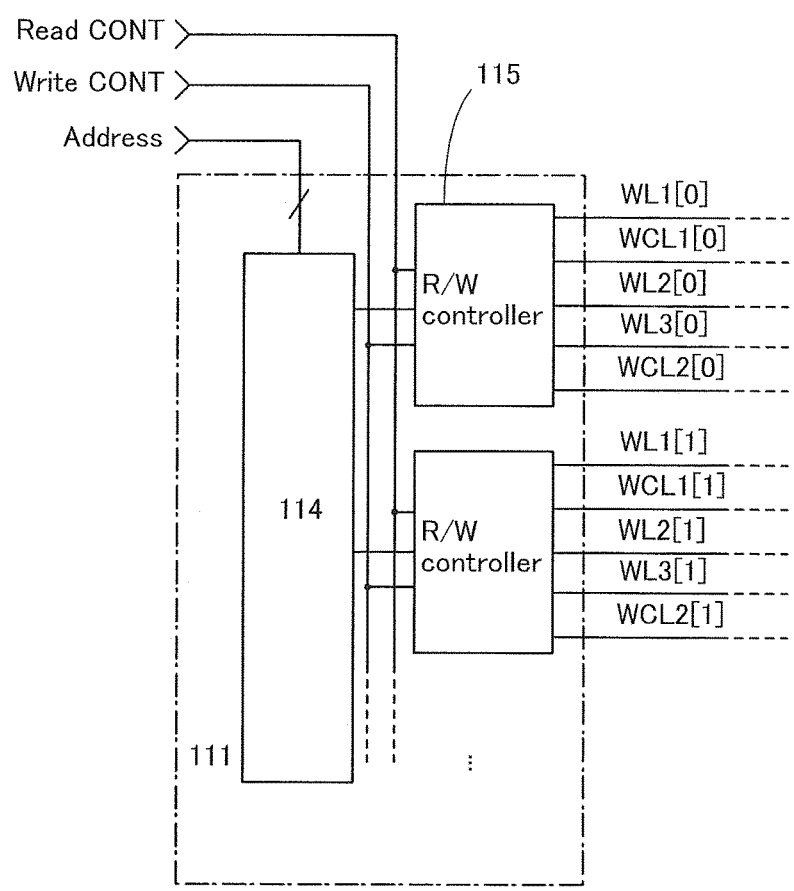
FIG. 15 is a block diagram illustrating one embodiment of the present invention.

FIG. 15 is a block diagram showing a configuration example of the row decoder 111 illustrated in FIG. 14.

The row decoder 111 illustrated in FIG. 15 includes a decoder 114 and a read/write (R/W) controller 115. The R/W controller 115 is provided for each row of a group of the wiring WL1, the wiring WL2, the wiring WL3, the wiring WCL1, and the wiring WCL2. The R/W controllers 115 are connected to the wirings WL1[0] to WL1[m−1], the wirings WCL1 [0] to WCL1 [m−1], the wirings WL2[0] to WL2[m−1], the wirings WL3 [0] to WL3[m−1], and the wirings WCL2[0] to WCL2[m−1] in the respective rows.

The decoder 114 is a circuit having a function of outputting a signal for selecting a row of the wiring WL1, the wiring WL2, the wiring WL3, the wiring WCL1, and the wiring WCL2. Specifically, the decoder 114 receives an address signal Address and selects the R/W controller 115 in any row in accordance with the address signal Address.

The R/W controller 115 is a circuit having a function of selectively outputting first to third word signals and a read word signal to the wiring WL1, the wiring WL2, the wiring WL3, the wiring WCL1, and the wiring WCL2 in a row selected by the decoder 114 and a function of supplying the ground voltage.

The R/W controller 115 receives a write control signal Write_CONT and a read control signal Read_CONT and selectively outputs signals or voltages to the wiring WL1, the wiring WL2, the wiring WL3, the wiring WCL1, and the wiring WCL2 in accordance with these received signals.

<Configuration Example of Column Decoder>

Figure 16:
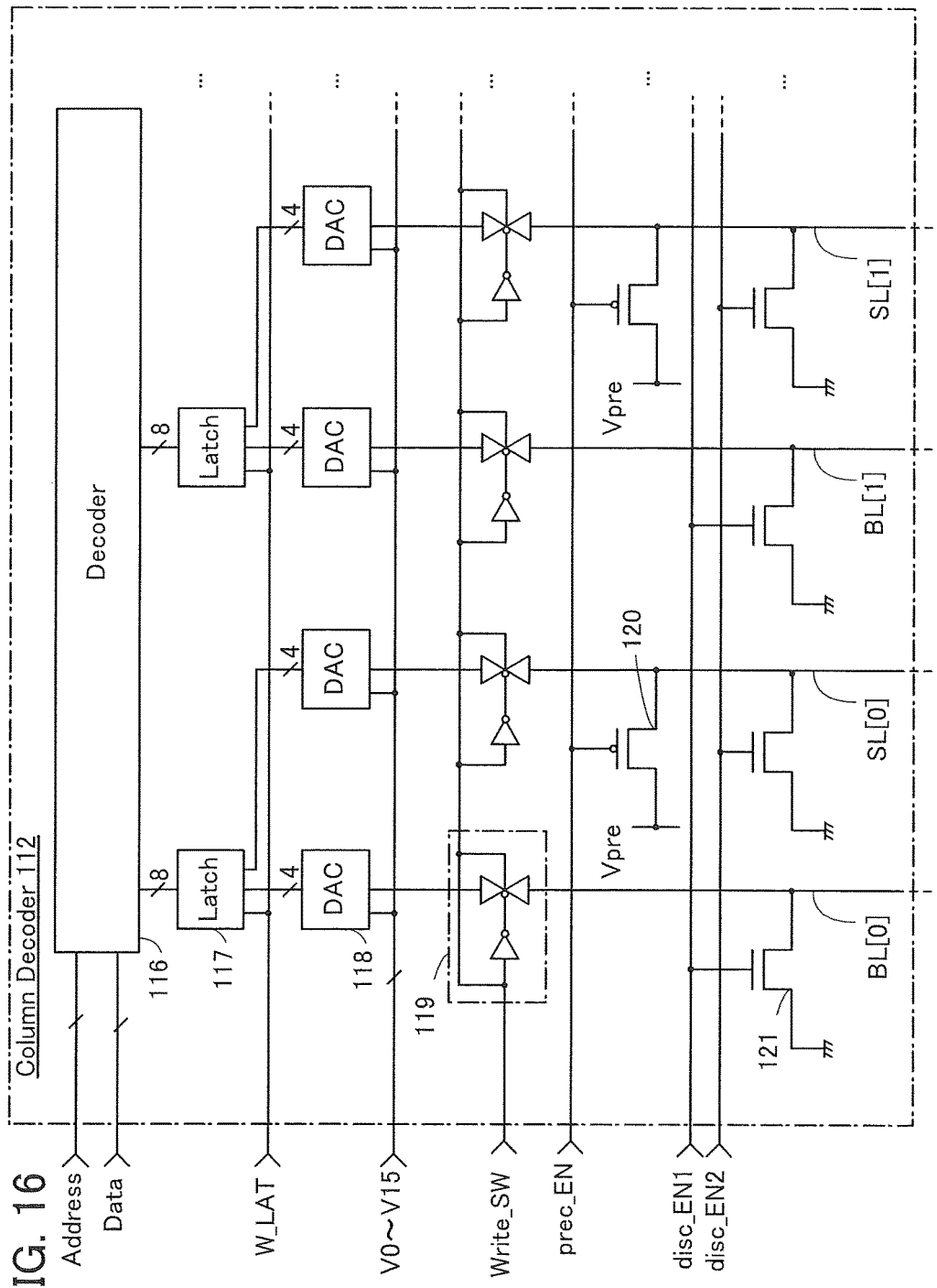
FIG. 16 is a block diagram illustrating one embodiment of the present invention.

FIG. 16 is a block diagram showing a configuration example of the column decoder 112 in FIG. 14.

The column decoder 112 illustrated in FIG. 16 includes a decoder 116, a latch 117, a D/A converter 118, a switch circuit 119, a transistor 120, and a transistor 121. The latch 117, the D/A converter 118, the switch circuit 119, and the transistor 121 are provided for each column of a group of the wiring SL and the wiring BL. The transistor 120 is provided for each wiring SL.

The decoder 116 is a circuit having a function of selecting a column of the wiring BL and sorting and outputting input data. Specifically, the decoder 116 receives an address signal Address and data Data, and outputs the data Data to the latch 117 in any of rows in accordance with the address signal Address.

Note that the data Data input to the decoder 116 is k-bit digital data. The k-bit digital data is a signal represented by binary data of '1' or '0' for each bit. Specifically, 8-bit digital data is data represented by '00000000' to '11111111'.

The latch 117 is a circuit having a function of temporarily storing the input data Data and outputting the data Data. The latch 117 is controlled in accordance with a latch signal W_LAT. For example, since the latch 117 supplies high-order 4-bit data to the wiring SL and low-order 4-bit data to the wiring BL when the number of bits of the input data Data is 8, the latch 117 is controlled to output data to the D/A converters 118 in the corresponding columns.

The D/A converter 118 is a circuit having a function of converting input data into a data voltage $V_D$ which is an analog value. Specifically, the D/A converter 118 converts 4-bit data, for example, into one of 16 levels (V0 to V15) and outputs the voltage to the switch circuit 119.

The data voltage $V_D$ output from the D/A converter 118 is, for example, a voltage corresponding to divided 4-bit data when the original data Data is 8 bits. As described in the above embodiment, the data voltage supplied to the wiring BL may be different from the data voltage supplied to the wiring SL. For example, a 4-bit data voltage supplied to the wiring BL may be converted into 16 levels in the range of 0 V to 3 V, and a 4-bit data voltage supplied to the wiring SL may be converted into 16 levels in the range of 0 V to 6 V. The structure can prevent 4-bit data voltages separately read from being varied at the time of reading the data voltage $V_D$.

The switch circuit 119 is a circuit having a function of supplying the data voltage $V_D$ to the wiring BL and the wiring SL and a function of setting the wiring BL in an electrically floating state. The switch circuit 119 turns on an analog switch by control with a switch control signal Write_SW so that the data voltage $V_D$ is supplied to the wiring BL, and then, turns off the analog switch so that the wiring BL is set in an electrically floating state.

The transistor 120 is a circuit having a function of supplying $V_{pre}$ to the wiring SL. The transistor 120 supplies $V_{pre}$ to the wiring SL by control with a precharge control signal prec_EN.

The transistor 121 is a circuit having a function of supplying $V_{GND}$ to the wiring SL and the wiring BL. The transistor 121 supplies $V_{GND}$ to the wiring BL or the wiring SL by control with discharge control signals disc_EN1 and disc_EN2.

<Configuration Example of A/D Converter>

Figure 17:
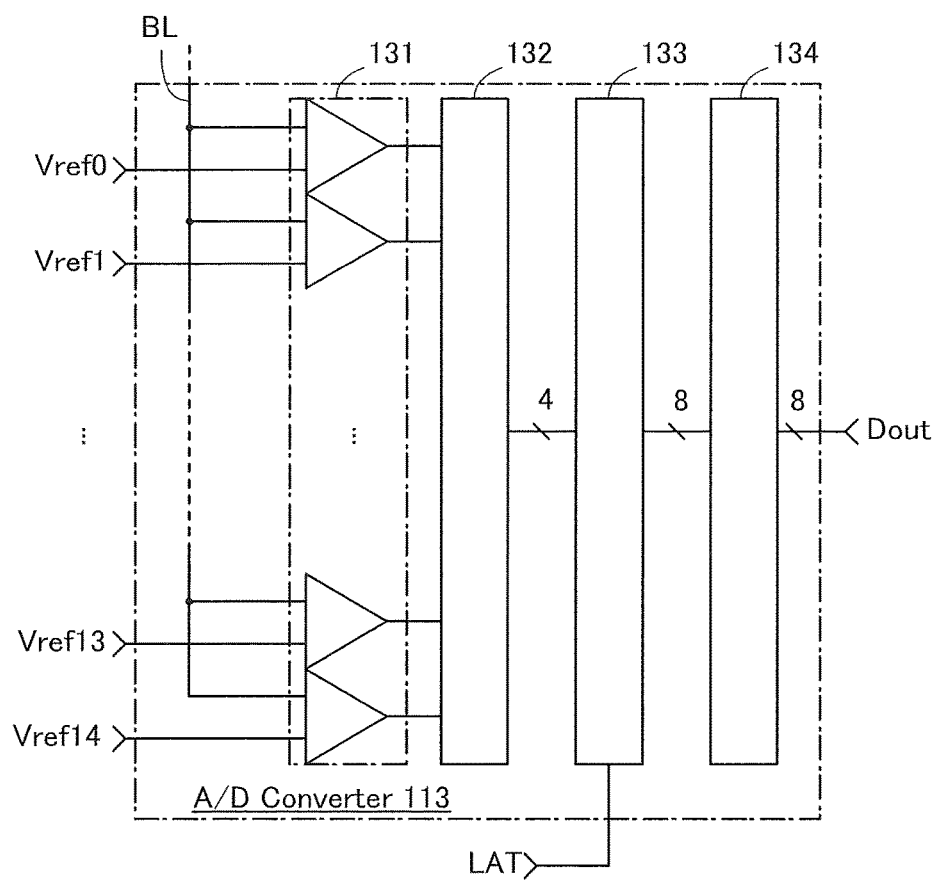
FIG. 17 is a block diagram illustrating one embodiment of the present invention.

FIG. 17 is a block diagram showing a configuration example of the A/D converter 113 illustrated in FIG. 14. FIG. 17 illustrates an example where data retained in the memory cell MC is 8-bit data.

The A/D converter 113 illustrated in FIG. 17 as an example includes a comparator 131, an encoder 132, a latch 133, and a buffer 134. The comparator 131, the encoder 132, the latch 133, and the buffer 134 are provided for every column. The buffer 134 of each column outputs an output signal Dout.

In the A/D converter 113 in FIG. 17, the comparators 131 compare voltages read out through the wiring SL in response to the data voltages $V_{D1}$ and $V_{D2}$ retained in the memory cell MC and reference voltages Vref0 to Vref14. The data voltages $V_{D1}$ and $V_{D2}$ are output at different timings and therefore high-order 4-bit data and low-order 4-bit data are divided and determined.

Then, the encoder 132 generates a high-order 4-bit digital signal and a low-order 4-bit digital signal on the basis of a signal by which the voltage of the wiring SL is determined. The obtained data are output to the latch 133 at different timings and retained. In the latch 133, the original 8-bit data Data is obtained by combining the high-level 4-bit digital signal and the low-level 4-bit digital signal. The 8-bit data Data is output in accordance with a latch signal LAT. The data Data is output as an output signal Dout through the buffer 134. Note that the buffer 134 can be omitted.

Embodiment 4

In this embodiment, the OS transistor described in the above embodiments will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$. In the oxide semiconductor, hydrogen, nitrogen, carbon, silicon, and a metal element other than a main component are impurities. For example, hydrogen and nitrogen form donor levels to increase the carrier density.

A transistor using an intrinsic or substantially intrinsic oxide semiconductor has a low carrier density and thus is less likely to have a negative threshold voltage. In addition, the transistor including the oxide semiconductor has small variation in electrical characteristics and high reliability because of few carrier traps in the oxide semiconductor.

Furthermore, a transistor including the oxide semiconductor can have an extremely low off-state current.

Note that the OS transistor with a reduced off-state current can exhibit a normalized off-state current per micrometer in channel width of $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C.

The case where a data voltage of 4-bit data is retained in the node FN2 is described, for example. In the case where the power source voltage is higher than or equal to 2 V and lower than or equal to 3.5 V, the storage capacitance is 0.1 fF, the distribution width of the retained voltage is lower than 30 mV, and the allowable amount of change in the retained voltage is lower than 80 mV, the leakage current from the node FN2 needs to be lower than $0.025 \times 10^{-24}$ A in order that the retained voltage is lower than the allowable amount of change at 85° C. for 10 years. In the case where leakage current from other portions is further small and the leakage portions are mostly in an OS transistor, when the channel width of the OS transistor is 60 nm, the leakage current per unit area of the OS transistor is preferably lower than $0.423 \times 10^{-24}$ A/μm. The memory cell MC can retain data at 85° C. for 10 years when the above specifications are satisfied.

<Temperature Characteristics>

Figure 30A:
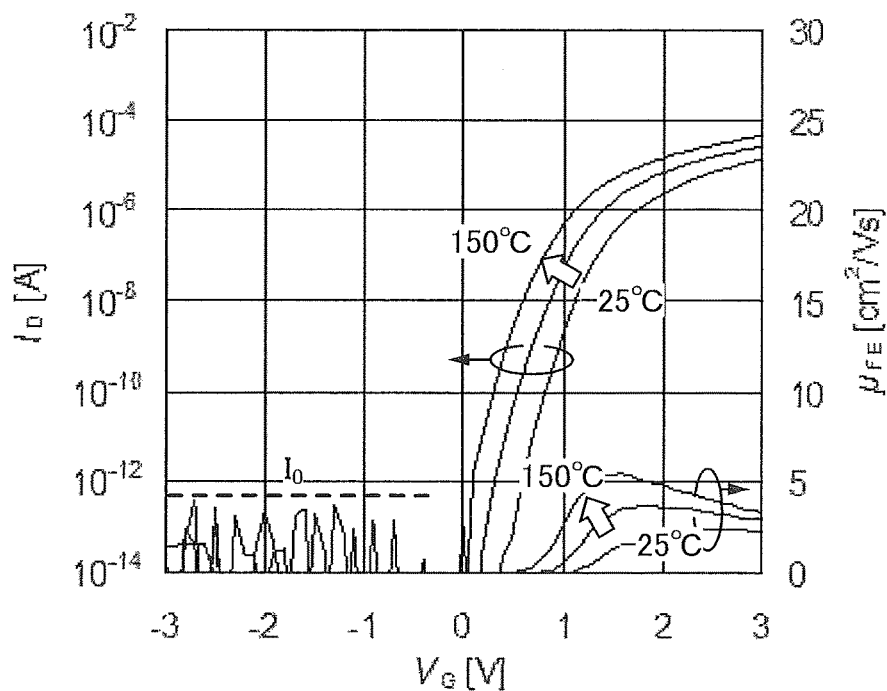
FIGS. 30A and 30B are graphs each illustrating one embodiment of the present invention.
Figure 30B:
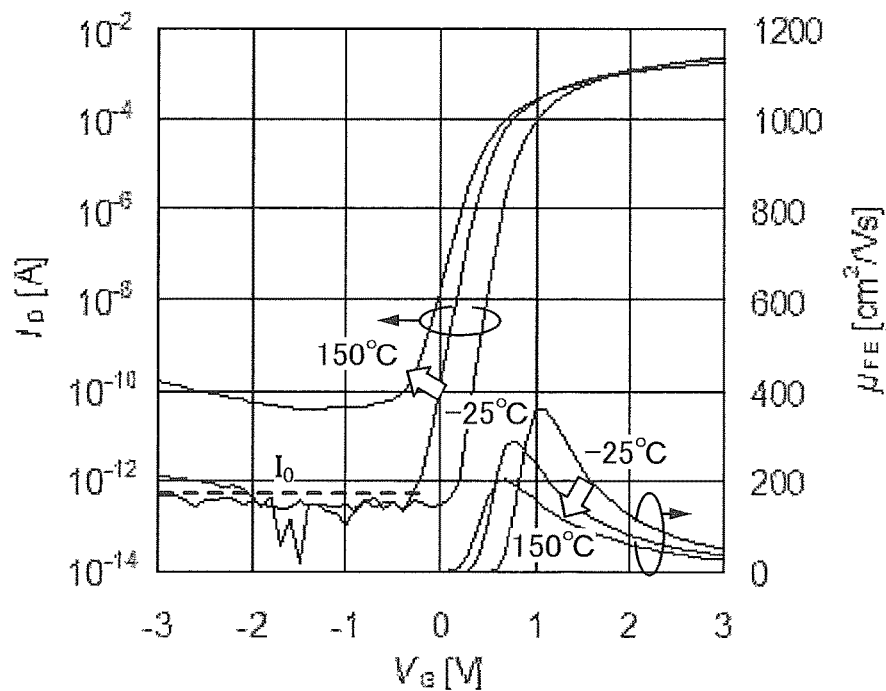

An OS transistor can be used at a higher temperature than a Si transistor. As specific examples, FIG. 30A shows temperature dependence of gate voltage $V_G$-drain current $I_D$ characteristics and gate voltage $V_G$-electric field mobility $\mu_{FE}$ characteristics of an OS transistor, and FIG. 30B shows temperature dependence of gate voltage $V_G$-drain current $I_D$ characteristics and gate voltage $V_G$-electric field mobility $\mu_{FE}$ characteristics of a Si transistor. FIGS. 30A and 30B show measurement results of electrical characteristics at temperatures of −25° C., 50° C., and 150° C. Note that the drain voltage $V_D$ is set at 1 V.

FIG. 30A shows electrical characteristics of the OS transistor that has a channel length L of 0.45 μm, a channel width W of 10 μm, and a thickness Tox of an oxide film of a gate insulating layer of 20 mm FIG. 30B shows electrical characteristics of the Si transistor that has L of 0.35 μm, W of 10 μm, and Tox of 20 nm.

An oxide semiconductor layer in the OS transistor is made of an In—Ga—Zn-based oxide. The Si transistor is formed using a silicon wafer.

FIGS. 30A and 30B show that the OS transistor has low temperature dependence of rising gate voltage. The off-state current of the OS transistor is lower than or equal to the lower measurement limit ($I_0$) independently of temperature. On the contrary, the off-state current of the Si transistor largely depends on the temperature. According to the measurement results of FIG. 30B, at 150° C., the off-state current of the Si transistor rises, and a sufficiently high current on/off ratio cannot be obtained.

According to the graphs in FIGS. 30A and 30B, an OS transistor used as a switch can operate even at 150° C. or higher. Thus, a power storage device can have excellent heat resistance.

<Breakdown Voltage>

Here, breakdown voltage of an OS transistor is described in comparison with breakdown voltage of a Si transistor.

Figure 31:
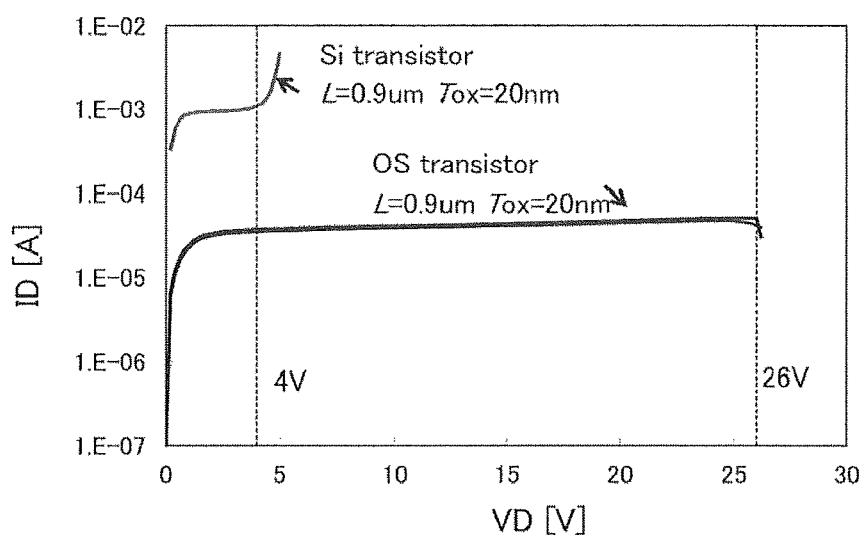
FIG. 31 is a graph for illustrating one embodiment of the present invention.

FIG. 31 shows ID-VD curves of a Si transistor and an OS transistor for explaining drain breakdown voltage of the OS transistor. In FIG. 31, to compare breakdown voltages between the Si transistor and the OS transistor under the same conditions, both of the transistors have a channel length of 0.9 μm, a channel width of 10 μm, and a thickness of a gate insulating film using silicon oxide of 20 nm. Note that the gate voltage is 2 V.

As shown in FIG. 31, avalanche breakdown occurs in the Si transistor at a drain voltage of approximately 4 V, whereas in the OS transistor, a constant current can flow until a drain voltage of approximately 26 V causes avalanche breakdown.

Figure 32A:
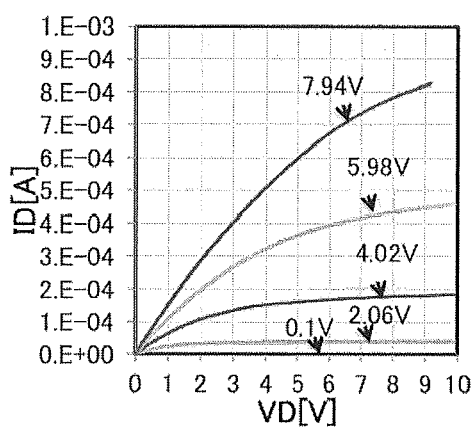
FIGS. 32A and 32B are graphs each illustrating one embodiment of the present invention.
Figure 32B:
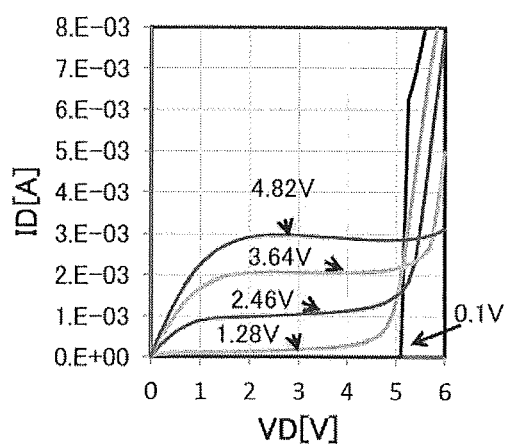

FIG. 32A shows ID-VD curves of an OS transistor with varying gate voltage. FIG. 32B shows ID-VD curves of a Si transistor with varying gate voltage. In FIG. 32A, to compare breakdown voltage between the Si transistor and the OS transistor under the same conditions, both of the transistors have a channel length of 0.9 μm, a channel width of 10 μm, and a thickness of a gate insulating film using silicon oxide of 20 nm. The gate voltage changes from 0.1 V to 2.06 V, 4.02 V, 5.98 V, and 7.94 V in the OS transistor of FIG. 32A, and changes from 0.1 V to 1.28 V, 2.46 V, 3.64 V, and 4.82 V in the Si transistor of FIG. 32B.

As shown in FIGS. 32A and 32B, avalanche breakdown occurs in the Si transistor at a drain voltage of approximately 4 V to 5 V, whereas in the OS transistor, a constant current can flow at a drain voltage of approximately 9 V at which avalanche breakdown does not occur.

As shown in FIG. 31 and FIGS. 32A and 32B, an OS transistor has higher breakdown voltage than a Si transistor. Therefore, even when an OS transistor is provided in a portion to which high voltage is supplied, the OS transistor can stably operate without causing dielectric breakdown.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. For this reason, when there is $V_{gs}$ at which the off-state current of a transistor is lower than or equal to I, it may be said that the off-state current of the transistor is lower than or equal to I. The off-state current of a transistor may refer to an off-state current at given $V_{gs}$, off-state current at $V_{gs}$ in a given range, or off-state current at $V_{gs}$ at which sufficiently low off-state current is obtained.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is $V_{gs}$ at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on a voltage $V_{ds}$ between its drain and source in some cases. Unless otherwise specified, the off-state current in this specification may be an off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. When there is $V_{gs}$ at which the off-state current of a transistor is lower than or equal to I at given $V_{ds}$, it may be said that the off-state current of the transistor is lower than or equal to I. Here, given $V_{ds}$ is, for example, 0.1 V, 0.8 V, 1 V, 1.2 V, 1.8 V, 2.5 V, 3 V, 3.3 V, 10 V, 12 V, 16 V, 20 V, $V_{ds}$ at which the reliability of a semiconductor device or the like including the transistor is ensured, or $V_{ds}$ used in the semiconductor device or the like.

In the above description of the off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, In:Ga:Zn=4:2:3, or In:Ga:Zn=2:1:3, or an oxide with an atomic ratio close to the above atomic ratios can be used.

<Impurity in Oxide Semiconductor>

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film Note that "substantially intrinsic" means that the oxide semiconductor film contains extremely few (close to zero) carriers derived from a donor and has a carrier density of lower than $8 \times 10^{11}/cm^3$, preferably lower than $1 \times 10^{11}/cm^3$, or more preferably lower than $1 \times 10^{10}/cm^3$, and is higher than or equal to $1 \times 10^{-9}/cm^3$.

<Structure of Oxide Semiconductor>

Next, a structure of an oxide semiconductor is described.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including $InGaZnO_4$ crystals is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution IEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part can be found in some cases. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

The OS transistor can achieve extremely favorable off-state current characteristics.

Embodiment 5

In this embodiment, a cross-sectional structure of a transistor included in a semiconductor device of one embodiment of the disclosed invention will be described with reference to drawings.

<Schematic Views of Cross-Sectional Structure>

First, schematic views of a cross-sectional structure of a semiconductor device of one embodiment of the invention will be described with reference to FIGS. 18A and 18B.

Transistors included in the semiconductor device of one embodiment of the present invention are constituted of Si transistors and OS transistors. For example, the semiconductor device has a cross-sectional structure in which a layer including Si transistors and a layer including OS transistors are stacked. Each of the layers includes a plurality of transistors including semiconductor layers of the same material.

Figure 18A:
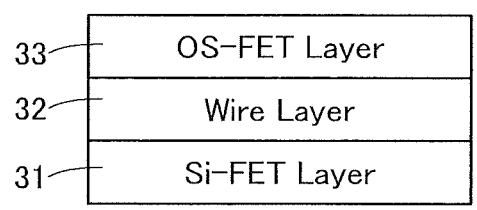
FIGS. 18A and 18B are schematic cross-sectional views each illustrating one embodiment of the present invention.

The semiconductor device of one embodiment of the present invention can be formed by, for example as illustrated in FIG. 18A, stacking a layer 31 including Si transistors (represented as Si-FET Layer in the drawing), a layer 32 in which a wiring is provided (represented as Wire Layer in the drawing), and a layer 33 including OS transistors (represented as OS-FET Layer in the drawing) in this order.

In the schematic view of the cross-sectional structure in FIG. 18A, the layer 31 including Si transistors includes Si transistors formed on a single crystal silicon substrate. Note that the Si transistors may be transistors including a thin semiconductor layer of silicon, germanium, or the like in an amorphous, microcrystalline, polycrystalline, or single crystal state.

The layer 33 including OS transistors in the schematic view of the cross-sectional structure in FIG. 18A includes OS transistors formed over a planarized insulating surface.

The layer 32 in which a wiring is provided in the schematic view of the cross-sectional structure in FIG. 18A includes a wiring for electrically connecting transistors in the layer 31 including Si transistors and/or the layer 33 including OS transistors or includes a wiring for supplying a voltage to the transistors. Although the layer 32 in which a wiring is provided is illustrated as a single layer in FIG. 18A, it may include a plurality of stacked layers.

Furthermore, although the layer 33 including OS transistors is illustrated as a single layer in the schematic view of the cross-sectional structure in FIG. 18A, it may include a plurality of stacked layers. In the case of stacking a plurality of layers, the schematic view of the cross sectional structure is as illustrated in FIG. 18B.

Figure 18B:
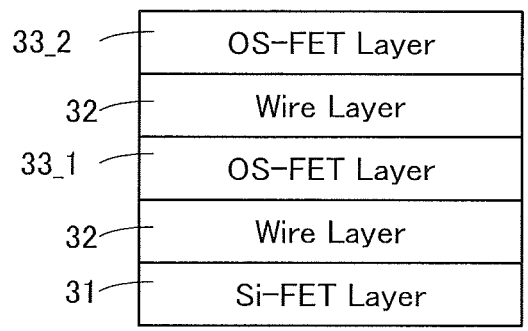

In FIG. 18B, a two-layer structure including a layer 33_1 including OS transistors and a layer 33_2 including OS transistors is illustrated. In the schematic view of the cross-sectional structure in FIG. 18B, the layer 33_1 including OS transistors and the layer 33_2 including OS transistors include OS transistors each formed over a planarized insulating surface. Although the example of stacking two layers is illustrated in FIG. 18B, the number of stacked layers is not limited to two. The layer 32 in which a wiring is provided can be provided between the layer 33_1 including OS transistors and the layer 33_2 including OS transistors. With this structure, OS transistors can be electrically connected to each other.

The transistors 12 to 14 described in FIG. 1 in Embodiment 1 are OS transistors and the transistor 11 is a Si transistor. In the case where the transistors in FIG. 1 are provided in layers in FIGS. 18A and 18B, the transistor 11 is provided in the layer 31 including Si transistors and the transistors 12 to 14 are provided in the layers 33, 33_1, and 33_2 including OS transistors. Stacking the layer including OS transistors over the layer including Si transistors as illustrated in FIGS. 18A and 18B enables a reduction in the circuit area of a memory cell, that is, the chip area and size of the semiconductor device.

<Cross-Sectional Structure of Layer Including Si Transistors and Layer in which Wiring is Provided>

Figure 19:
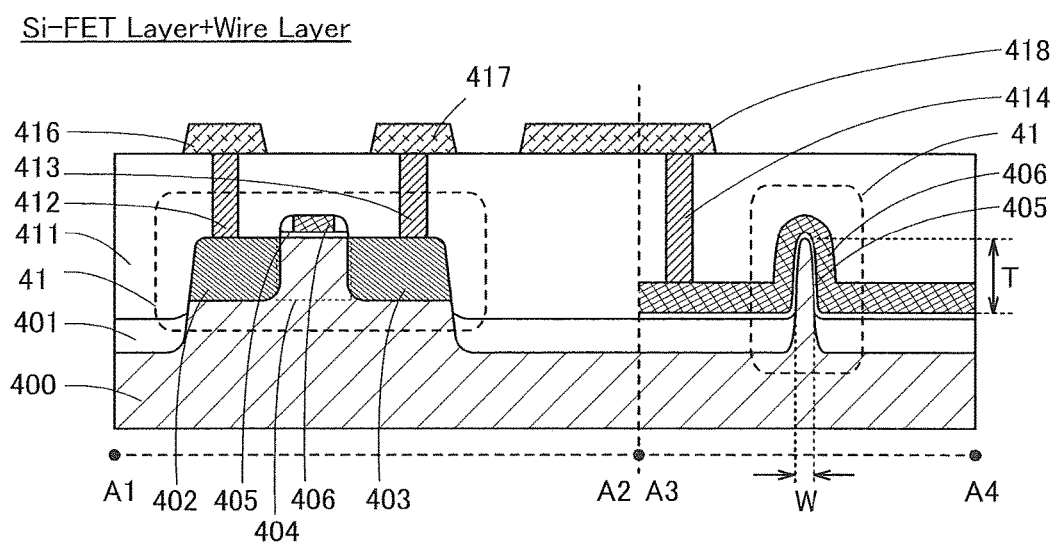
FIG. 19 is a schematic cross-sectional view illustrating one embodiment of the present invention.

Next, FIG. 19 illustrates an example of a cross-sectional structure of the layer 31 including Si transistors and the layer 32 in which a wiring is provided which are described with reference to FIGS. 18A and 18B. In FIG. 19, a cross-sectional structure of a transistor 41 included in the layer 31 including Si transistors is illustrated. The cross-sectional structure of the transistor 41 in FIG. 19 can be applied to the transistor 11 illustrated in FIG. 1 in Embodiment 1, for example.

In FIG. 19, a region along dashed line A1-A2 shows a structure of the transistor 41 in the channel length direction, and a region along dashed line A3-A4 shows a structure of the transistor 41 in the channel width direction.

In FIG. 19, a substrate 400 where the transistor 41 is formed can be, for example, a silicon substrate, a germanium substrate, or a silicon germanium substrate. In FIG. 19, a single crystal silicon substrate is used as the substrate 400.

The transistor 41 is electrically isolated by an element isolation method. As the element isolation method, a trench isolation method (a shallow trench isolation (STI) method) or the like can be used. FIG. 19 illustrates an example where the trench isolation method is used to electrically isolate the transistor 41. Specifically, in FIG. 19, the transistor 41 is electrically isolated by element isolation using an element isolation region 401 formed in such a manner that an insulator including silicon oxide or the like is buried in a trench formed in the substrate 400 by etching or the like and then the insulator is partly removed by etching or the like.

In a projection of the substrate 400 that exists in a region other than the trench, an impurity region 402 and an impurity region 403 of the transistor 41 and a channel formation region 404 placed between the impurity regions 402 and 403 are provided. Furthermore, the transistor 41 includes an insulating film 405 covering the channel formation region 404 and a gate electrode 406 that overlaps with the channel formation region 404 with the insulating film 405 provided therebetween.

In the transistor 41, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 41 can be reduced, and the number of transferred carriers in the transistor 41 can be increased. As a result, the on-state current and field-effect mobility of the transistor 41 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 41 can be further increased and the field-effect mobility of the transistor 41 can be further increased.

Note that when the transistor 41 is formed using a bulk semiconductor substrate, the aspect ratio is preferably 0.5 or more, further preferably 1 or more.

An insulating film 411 is provided over the transistor 41. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

Note that the layer 32 in which a wiring is provided illustrated in FIGS. 18A and 18B corresponds to conductive films 416, 417, and 418 in FIG. 19. The layer 32 in which a wiring is provided can be stacked by forming an insulating film, an opening in the insulating film, and a conductive film in a region including the opening, in this order.

<Cross-Sectional Structure of Layer Including OS Transistors>

Figure 20A:
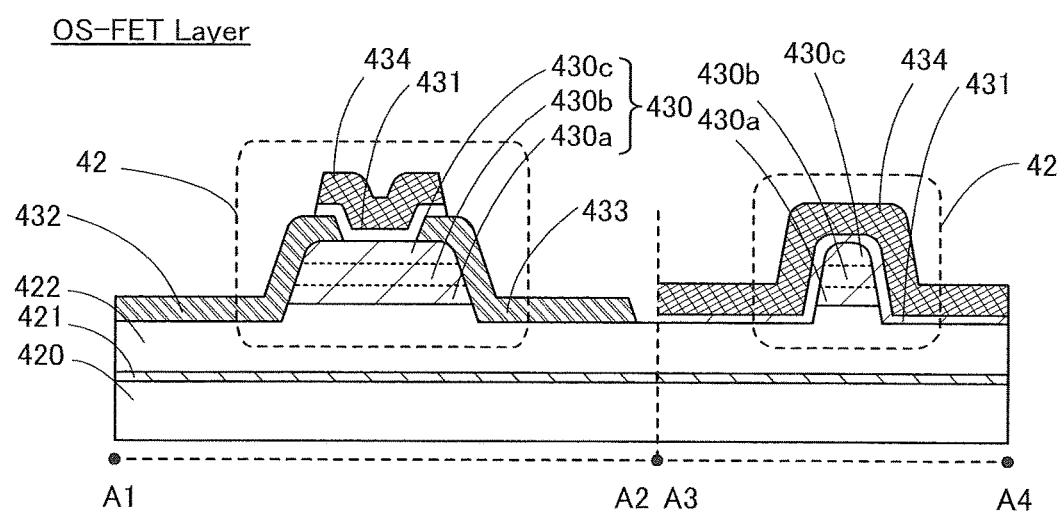
FIGS. 20A and 20B are cross-sectional schematic views each illustrating one embodiment of the present invention.
Figure 20B:
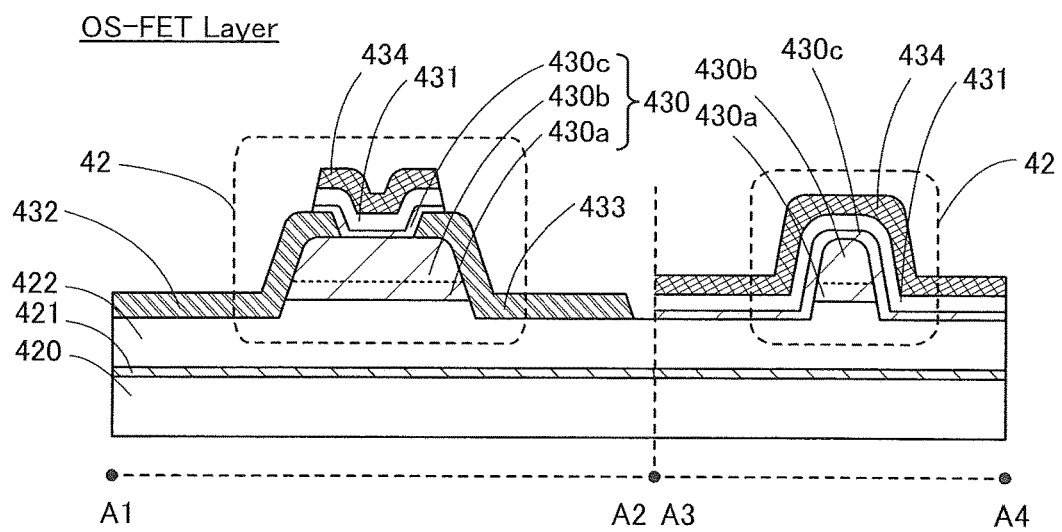

Next, FIGS. 20A and 20B illustrate an example of a cross-sectional structure of the layer 33 including OS transistors described with reference to FIGS. 18A and 18B. In FIGS. 20A and 20B, cross-sectional structures of a transistor 42 included in the layer 33 including OS transistors are illustrated. The cross-sectional structures of the transistor 42 in FIGS. 20A and 20B can be applied to the transistors 12 to 14 illustrated in FIG. 1 in Embodiment 1, for example.

In FIGS. 20A and 20B, in a manner similar to that of FIG. 19, a region along dashed line A1-A2 shows a structure of the transistor 42 in the channel length direction, and a region along dashed line A3-A4 shows a structure of the transistor 42 in the channel width direction.

An insulating film 421 having a blocking effect of preventing diffusion of oxygen, hydrogen, and water is provided over an insulating film 420 that is provided over the layer 32 in which a wiring is provided described with reference to FIGS. 18A and 18B. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 42 is provided over the insulating film 422.

The transistor 42 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween.

Note that in FIG. 20A, the transistor 42 includes at least the gate electrode 434 on one side of the semiconductor film 430, and may further include a gate electrode overlapping with the semiconductor film 430 with the insulating film 422 positioned therebetween.

In the case where the transistor 42 has a pair of gate electrodes, one of the gate electrodes may be supplied with a signal for controlling the on/off state, and the other of the gate electrodes may be supplied with a voltage from another wiring. In this case, voltages with the same level may be supplied to the pair of gate electrodes, or a fixed voltage such as the ground voltage may be supplied only to the other of the gate electrodes. By controlling a voltage supplied to the other of the gate electrodes, the threshold voltage of the transistor can be controlled.

In FIG. 20A, the transistor 42 has a single-gate structure where one channel formation region corresponding to one gate electrode 434 is provided. However, the transistor 42 may have a multi-gate structure where a plurality of electrically connected gate electrodes are provided so that a plurality of channel formation regions are included in one active layer.

FIG. 20A illustrates an example in which the semiconductor film 430 included in the transistor 42 includes oxide semiconductor films 430a to 430c that are stacked in this order over the insulating film 422. Note that in one embodiment of the present invention, the semiconductor film 430 of the transistor 42 may be formed using a single-layer metal oxide film.

In the case where the oxide semiconductor film 430b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 430b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film as the oxide semiconductor film 430b is easily formed. Typical examples of the atomic ratio of the metal elements of the target are In:M:Zn=1:1:1 and In:M:Zn=3:1:2.

Note that in the case where the oxide semiconductor film 430a and the oxide semiconductor film 430c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 430a and 430c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, In:M:Zn=1:3:4, In:M:Zn=1:3:6, and the like.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 42 illustrated in FIG. 20A, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the voltage of the gate electrode 434 because the end portions of the oxide semiconductor film 430b that do not overlap with the conductive films 432 and 433 overlap with the gate electrode 434 in the transistor 42 illustrated in FIG. 20A. Consequently, current that flows between the conductive films 432 and 433 through the end portions of the oxide semiconductor film 430b can be controlled by the voltage applied to the gate electrode 434. Such a structure of the transistor 42 is referred to as a surrounded channel (s-channel) structure.

With the s-channel structure, specifically, when a voltage at which the transistor 42 is turned off is supplied to the gate electrode 434, the amount of off-state current that flows between the conductive films 432 and 433 through the end portions can be reduced. For this reason, in the transistor 42, even when the distance between the conductive films 432 and 433 at the end portions of the oxide semiconductor film 430b is reduced as a result of reducing the channel length to obtain high on-state current, the transistor 42 can have low off-state current. Consequently, with the short channel length, the transistor 42 can have high on-state current when in an on state and low off-state current when in an off state.

With the s-channel structure, specifically, when a voltage at which the transistor 42 is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 42. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in carrier mobility of the transistor 42. As a result, the on-state current of the transistor 42 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

In the description with FIG. 20A, the structure in which the semiconductor film 430 included in the transistor 42 includes the oxide semiconductor films 430a, 430b, and 430c stacked in this order is used as an example. As another structure, a structure illustrated in FIG. 20B may also be employed for the semiconductor film 430. As illustrated in FIG. 20B, the oxide semiconductor film 430c included in the semiconductor film 430 may be provided over the conductive films 432 and 433 and overlap with the gate insulating film 431.

<Cross-Sectional Structure of Stack Including Layer Including Si Transistors and Layer Including OS Transistors>

Figure 21:
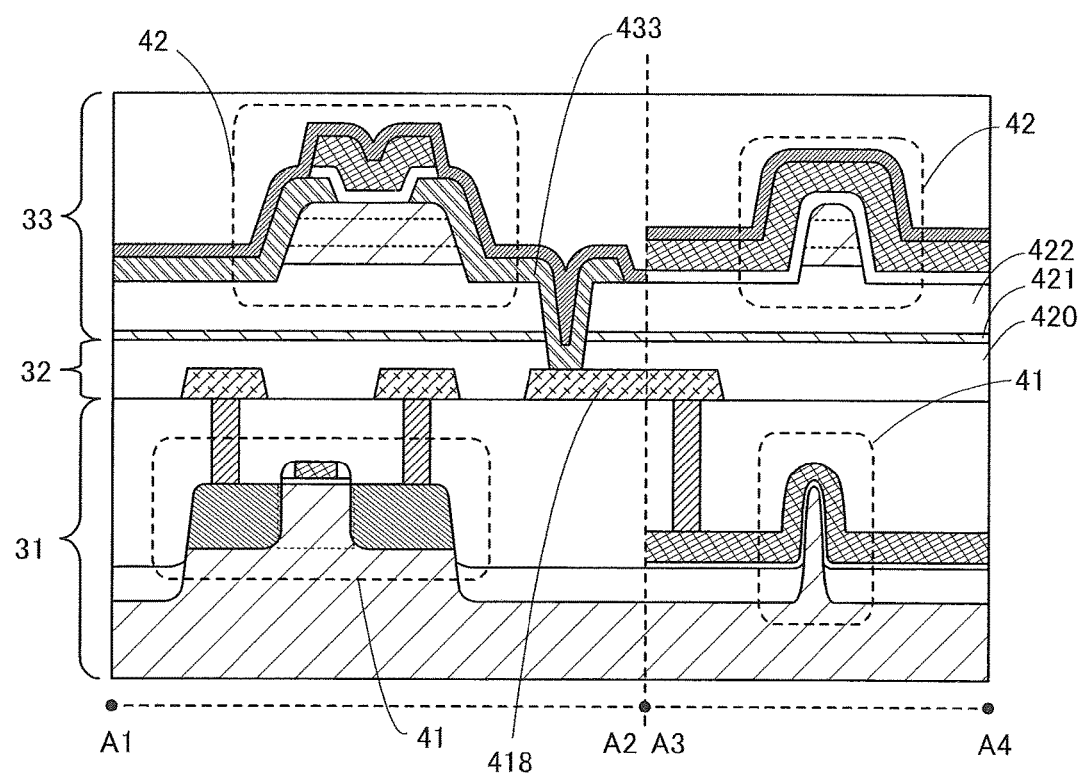
FIG. 21 is a schematic cross-sectional view illustrating one embodiment of the present invention.
Figure 22:
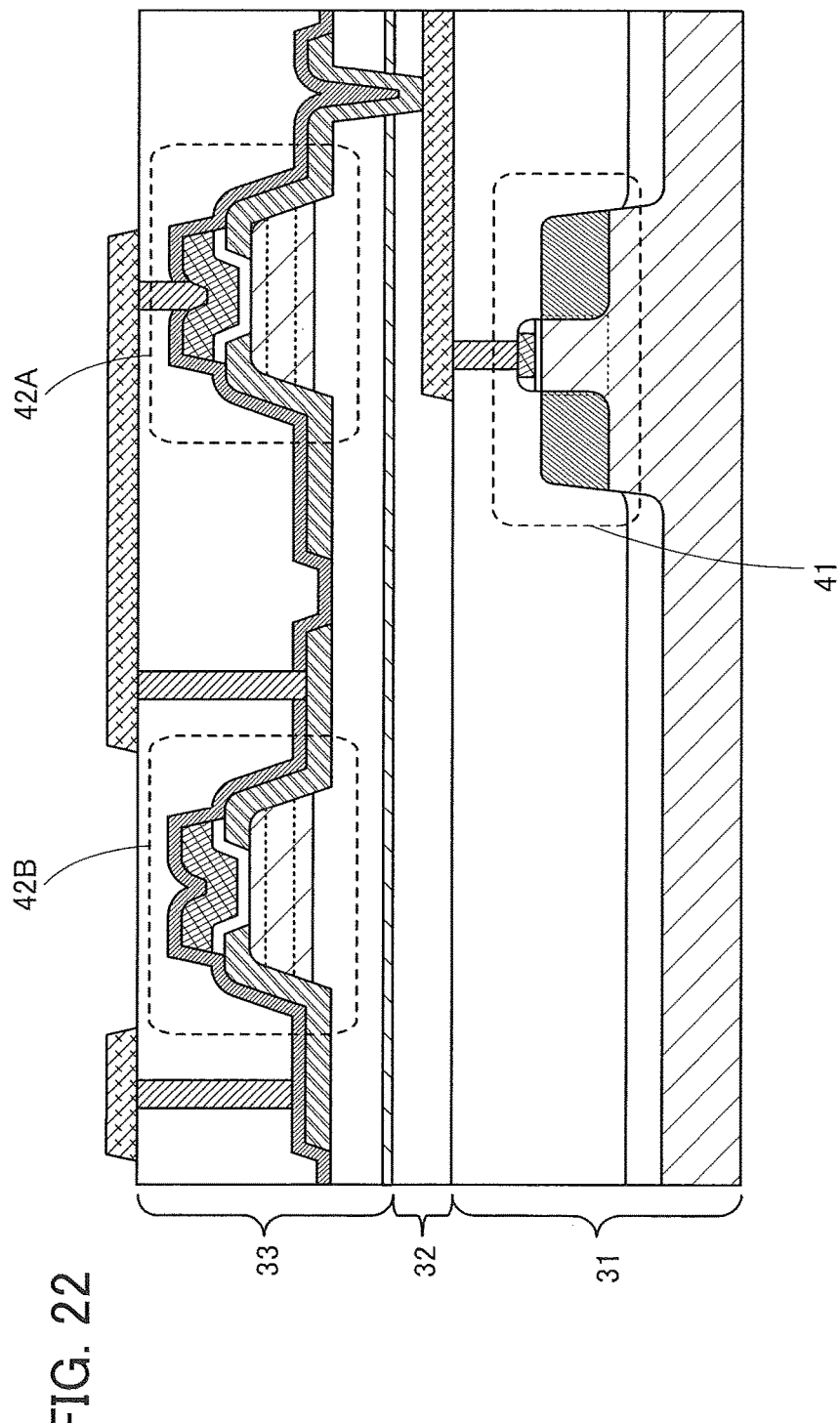
FIG. 22 is a schematic cross-sectional view illustrating one embodiment of the present invention.
Figure 23:
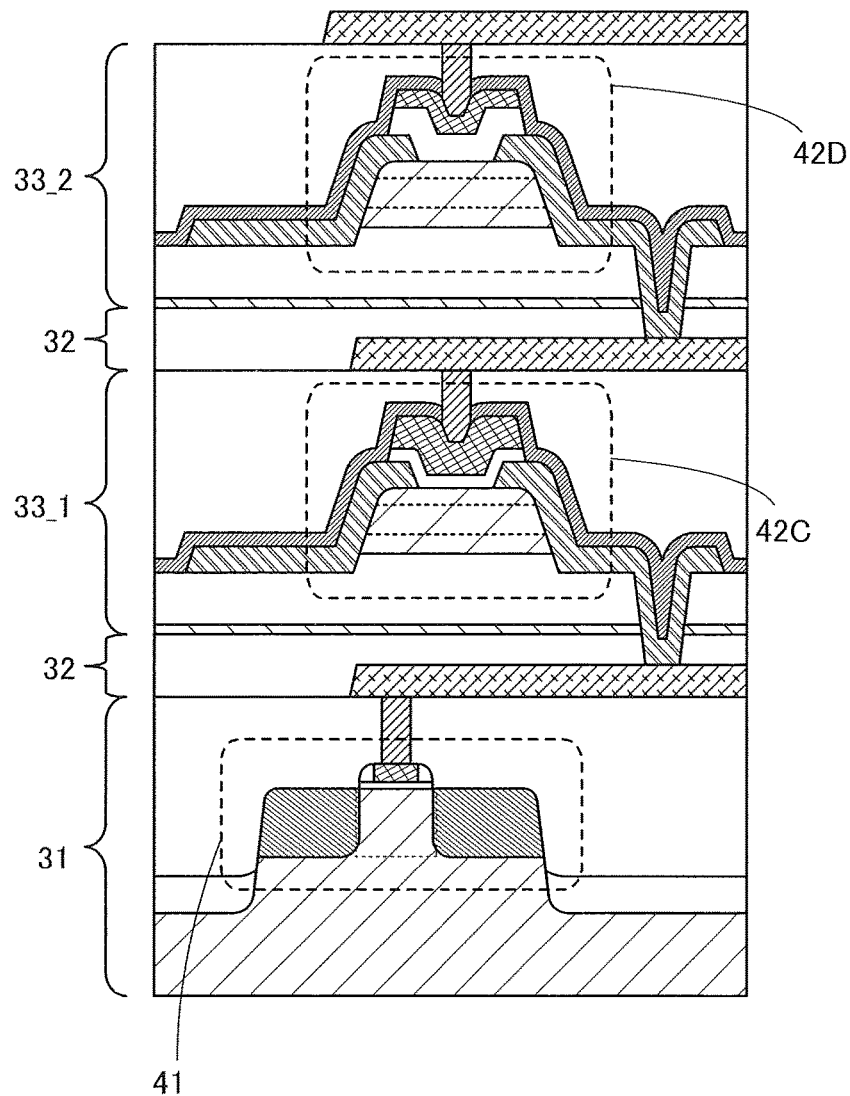
FIG. 23 is a schematic cross-sectional view illustrating one embodiment of the present invention.

Next, FIG. 21, FIG. 22, and FIG. 23 illustrate an example of a cross-sectional structure in the case of stacking the layer including Si transistors and the layer in which a wiring is provided, which are described with FIG. 19, and the layer 33 including OS transistors described with FIG. 20A.

FIG. 21 illustrates an example of a cross-sectional structure illustrated in the schematic view of FIG. 18A.

In FIG. 21, in a manner similar to that of FIG. 19 and FIG. 20A, a region along dashed line A1-A2 shows a structure of the transistors 41 and 42 in the channel length direction, and a region along dashed line A3-A4 shows a structure of the transistors 41 and 42 in the channel width direction.

Note that in one embodiment of the present invention, as shown in FIG. 21, the channel length direction of the transistor 41 and the channel length direction of the transistor 42 may not be necessarily consistent with each other.

In FIG. 21, for electrical connection between the transistor 41 and the transistor 42, an opening is provided in the insulating films 420 to 422. The conductive film 433 provided in the opening is connected to the conductive film 418 in the opening.

In the cross-sectional structure illustrated in FIG. 21, as described for FIG. 18A, the transistor 42 including a channel formation region in an oxide semiconductor film is formed over the transistor 41 including a channel formation region in a single crystal silicon substrate. With the structure illustrated in FIG. 21, the channel formation region of the transistor 42 can overlap with the channel formation region of the transistor 41. Accordingly, a semiconductor device including a memory cell with such a structure can have a reduced layout area.

In the case where a plurality of transistors 42 are provided in the layer 33 including OS transistors, the transistors 42 may be provided in the same layer or different layers.

For example, in the case where the transistors 42 are provided in the same layer in the layer 33 including OS transistors, the structure illustrated in FIG. 22 can be formed. In the case where the transistors 42 are provided in different layers in the layer 33 including OS transistors, the layer 33_1 including OS transistors and the layer 33_2 including OS transistors can be separately provided so as to be stacked with the layer 32 in which a wiring is provided placed therebetween. This structure is illustrated in FIG. 23.

In the case of the cross-sectional structure illustrated in FIG. 22, even when the number of OS transistors is increased, only one layer, which is the layer 33 including OS transistors, is required; accordingly, the number of stacked layers can be reduced. In FIG. 22, a transistor 42A and a transistor 42B can be formed at once, for example. Accordingly, the number of steps for manufacturing a semiconductor device can be reduced.

FIG. 22 illustrates a structure of the transistors 41, 42A, and 42B in the channel length direction. The structure in the channel width direction thereof is similar to that illustrated in FIG. 21, and the aforementioned structure can be referred to.

By applying the cross-sectional structure of FIG. 22 to the transistors described in Embodiment 1, the transistors 42A and 42B can be manufactured as the transistors 12 and 13. Furthermore, the transistor 14 can also be manufactured similarly. Thus, manufacturing cost of the semiconductor devices can be reduced.

Moreover, with the cross-sectional structure illustrated in FIG. 23, even when the number of OS transistors is increased, the layer 33_1 including OS transistors and the layer 33_2 including OS transistors are separately provided in a plurality of layers; accordingly, an increase in circuit area can be prevented. Therefore, the chip area and size of the semiconductor device can be reduced.

FIG. 23 illustrates a structure of the transistor 41, a transistor 42C, and a transistor 42D in the channel length direction. The structure in the channel width direction thereof is similar to that illustrated in FIG. 21, and the aforementioned structure can be referred to.

In the cross-sectional structure illustrated in FIG. 23, OS transistors included in the layer 33_1 including OS transistors and OS transistors included in the layer 33_2 including OS transistors, which exist in different layers, can have different film thicknesses, film qualities, and the like from each other. Thus, transistors with different characteristics can be formed separately. For example, transistors having high switching characteristics owing to thin gate insulating films and transistors having high withstand voltage owing to thick gate insulating films can be stacked. Accordingly, the semiconductor device can have high performance.

<Cross-Sectional Structure of Stack of Layer Including Si Transistors and Layer Including OS Transistors>

Figure 26:
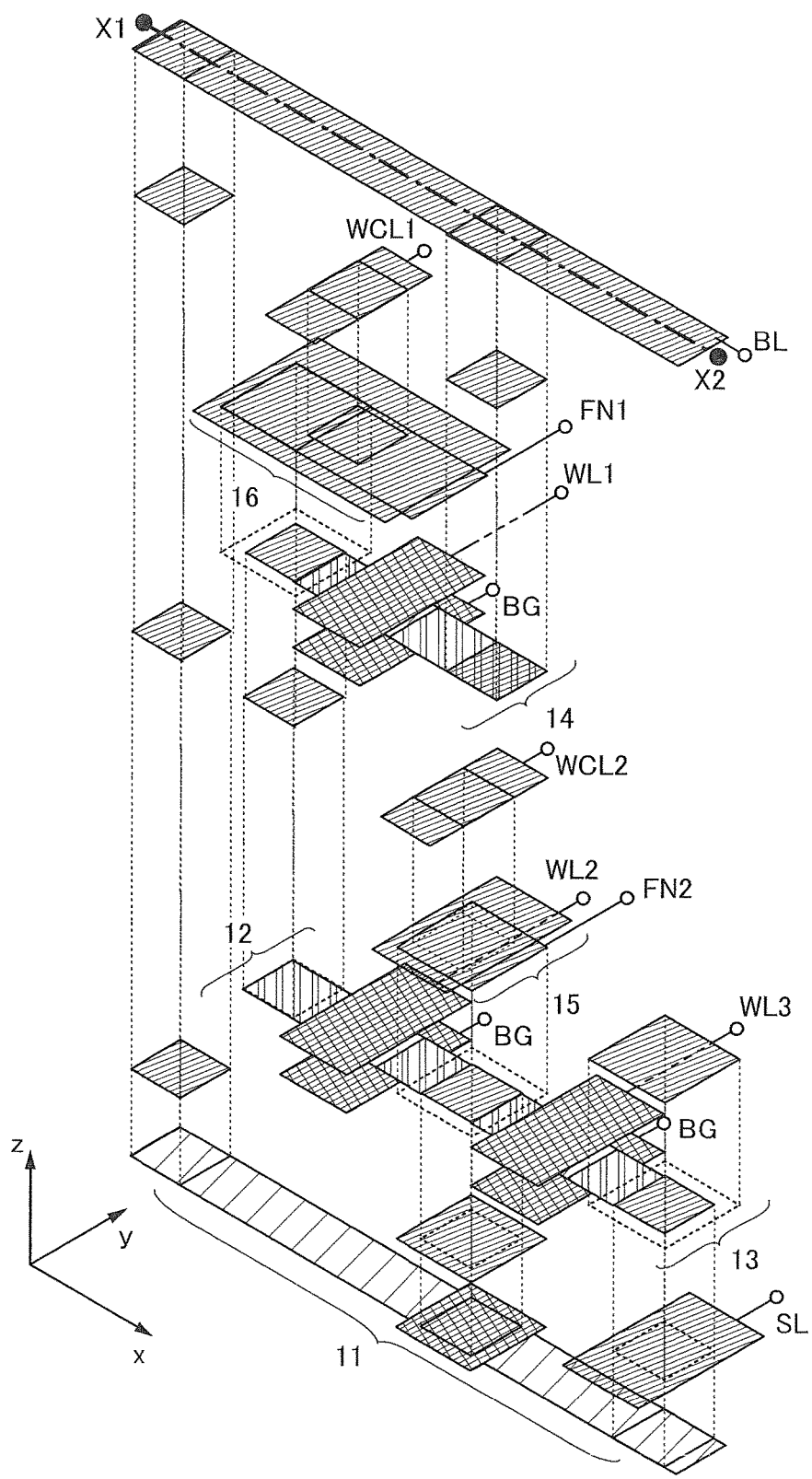
FIG. 26 is a layout diagram illustrating one embodiment of the present invention.
Figure 27:
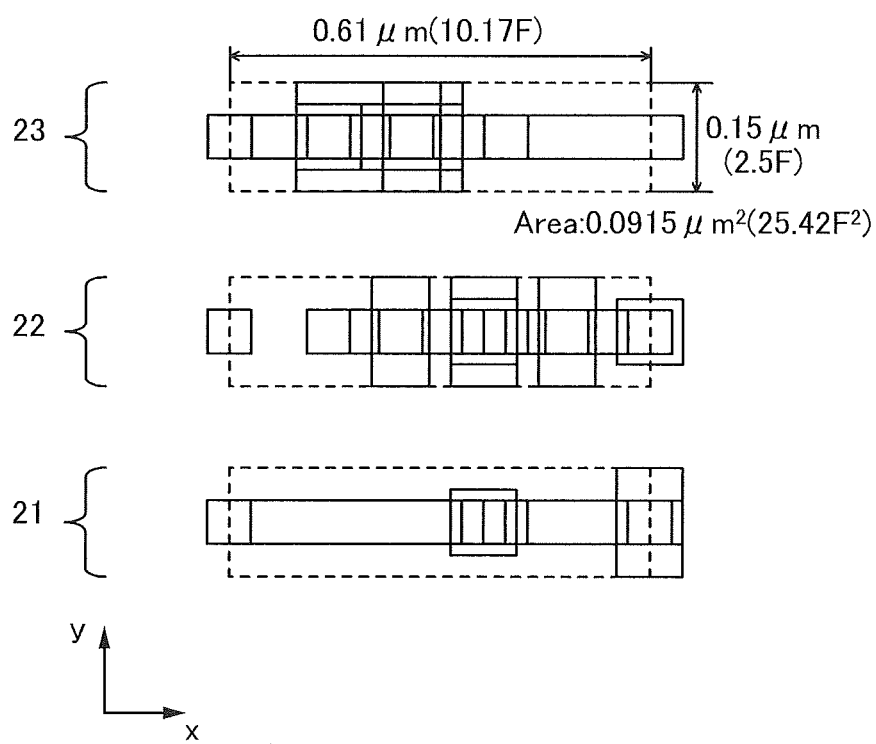
FIG. 27 is a layout diagram illustrating one embodiment of the present invention.
Figure 28:
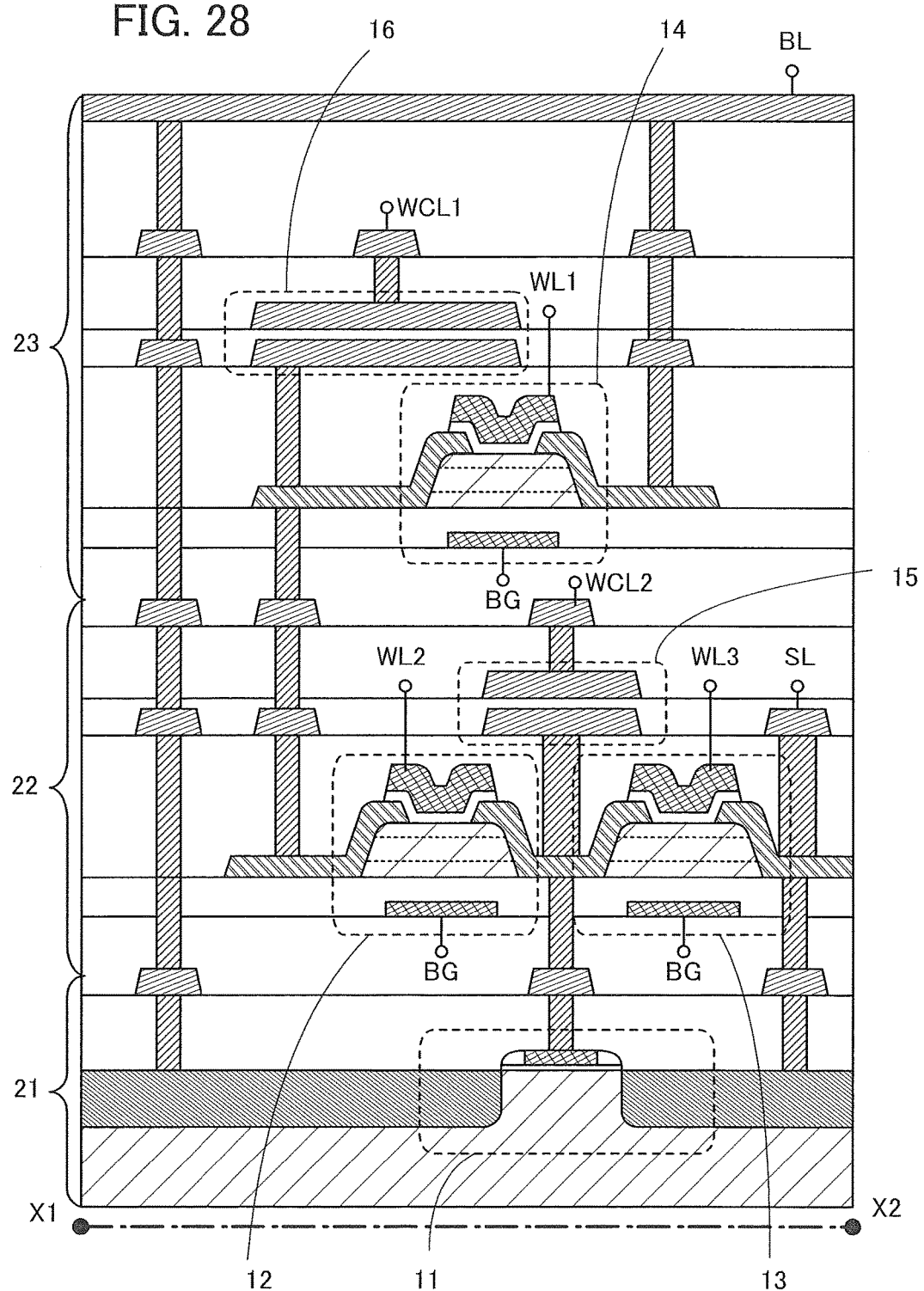
FIG. 28 is a schematic cross-sectional view illustrating one embodiment of the present invention.

FIG. 26 and FIG. 27 illustrate a layout based on the circuit diagram of the memory cell MC in FIG. 1. FIG. 26 shows an example of a layout of semiconductor layers and conductive layers in the transistors in the plane direction indicated by the x-y axes and the perpendicular direction indicated by the z-axis. FIG. 27 illustrates a layout in the plane direction indicated by the x-y axes. FIG. 28 shows an example of a schematic cross-sectional view taken along dashed-dotted line X1-X2 in FIG. 26.

FIG. 26, FIG. 27, and FIG. 28 show the positions of the wirings WL1 to WL3, the wirings WCL1 and WCL2, the transistors 11 to 14, the capacitors 15 and 16, and the nodes FN1 and FN2 in the memory cell MC in FIG. 1. FIG. 26, FIG. 27, and FIG. 28 illustrate a structure in which back-gates BG are provided in the transistors 12 to 14. The insulating films are omitted in FIG. 26 and FIG. 27 to increase the visibility.

As illustrated in FIG. 27, memory cells can be represented as the first to third layers 21 to 23. The memory cell size is 0.15 µm in the x direction and 0.61 µm in the y direction, and is 0.0915 µm$^2$ in area. When the minimum feature size is 60 nm, the length in the x direction is 2.5 F and the length in the y direction is 10.17 F; thus, the area is estimated to be 25.42 F$^2$.

In the layouts and the schematic cross-sectional view of the memory cells in FIG. 26, FIG. 27, and FIG. 28, the transistor 11, the transistors 12 and 13, and the transistor 14 are provided in different layers to be stacked. With the structure, even in a memory cell including a plurality of data retention portions, the circuit area can be reduced, so that the size of the semiconductor device can be reduced.

Figure 29:
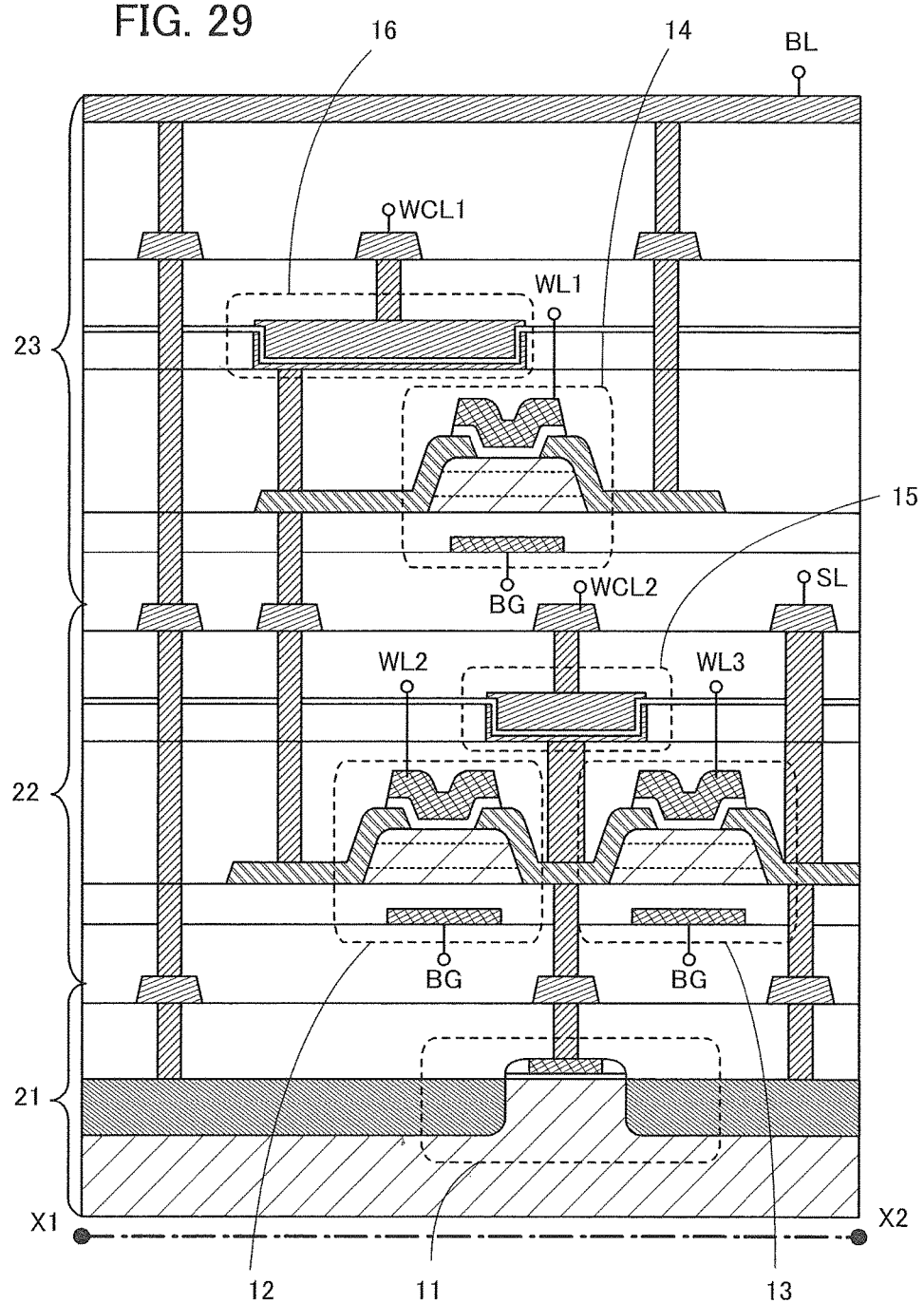
FIG. 29 is a schematic cross-sectional view illustrating one embodiment of the present invention.

In the schematic cross-sectional view in FIG. 28, the capacitors are formed by arranging conductive layers forming the capacitors 15 and 16 in parallel. Alternatively, another structure may be employed. For example, as illustrated in FIG. 29, capacitors may be formed by arranging conductive layers to have a trench shape. With the structure, large capacitance can be ensured even with the same area.

Embodiment 6

Although the conductive layers and the semiconductor layers described in the above embodiments can be formed by a sputtering method, they may be formed by another method, for example, a thermal CVD method. As a thermal CVD method, a metal organic chemical vapor deposition (MOCVD) method or an atomic layer deposition (ALD) method may be employed, for example.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive films and the semiconductor films disclosed in the above embodiments can be formed by a thermal CVD method such as a MOCVD method or an ALD method. For example, in the case where an InGaZnO$_X$ (X>0) film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are sequentially introduced plural times to form a GaO layer, and then a Zn(CH$_3$)$_2$ gas and an O$_3$ gas are sequentially introduced plural times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Embodiment 7

In this embodiment, application examples of the semiconductor device described in the above embodiments to an electronic component and to an electronic device including the electronic component will be described with reference to FIGS. 24A and 24B and FIGS. 25A to 25E.

Figure 24A:
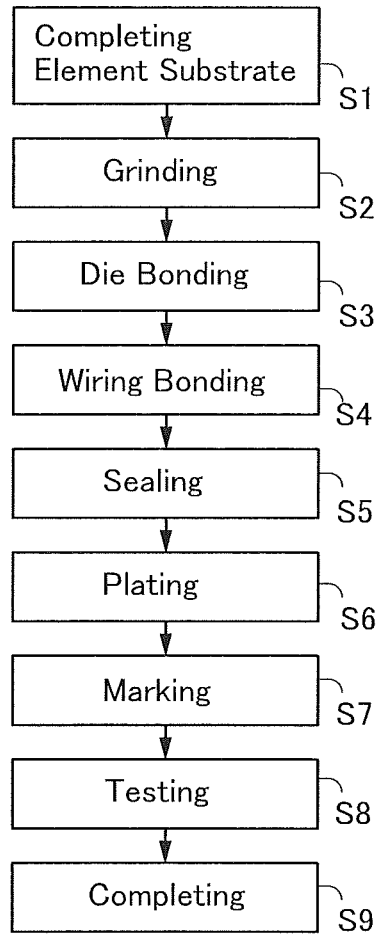
FIGS. 24A and 24B are a flowchart and a perspective view illustrating one embodiment of the present invention.

FIG. 24A shows an example where the semiconductor device described in the above embodiments is used to make an electronic component. Note that the electronic component is also referred to as semiconductor package or IC package. The electronic component has a plurality of standards and names depending on a terminal extraction direction and a terminal shape. Thus, examples of the electronic component will be described in this embodiment.

A semiconductor device including the transistors illustrated in FIGS. 18A and 18B, FIG. 19, FIGS. 20A and 20B, FIG. 21, FIG. 22, FIG. 23, FIG. 26, FIG. 27, FIG. 28, and FIG. 29 of Embodiment 4 is completed by integrating detachable components on a printed circuit board through the assembly process (post-process).

The post-process can be completed through steps shown in FIG. 24A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component can include the semiconductor device described in the above embodiments. Thus, an electronic component with small size, large memory capacity, and high reliability can be obtained.

Figure 24B:
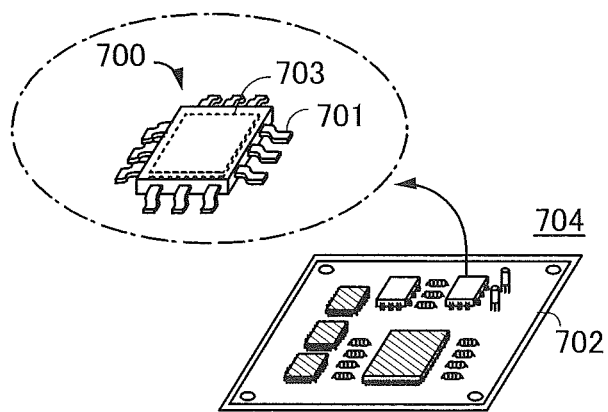

FIG. 24B is a schematic perspective view of the completed electronic component. FIG. 24B is a schematic perspective view illustrating a quad flat package (QFP) as an example of the electronic component. A lead 701 and a circuit portion 703 of an electronic component 700 are shown in FIG. 24B. The electronic component 700 in FIG. 24B is, for example, mounted on a printed circuit board 702. When a plurality of electronic components 700 are used in combination and electrically connected to each other over the printed circuit board 702, the electronic components 700 can be mounted on an electronic device. The completed circuit board 704 is provided in an electronic device or the like.

Next, the description will be made on applications of the above electronic component to electronic devices such as a computer, a portable information terminal (including a mobile phone, a portable game machine, an audio reproducing device, and the like), electronic paper, a television device (also referred to as television or television receiver), and a digital video camera.

Figure 25A:
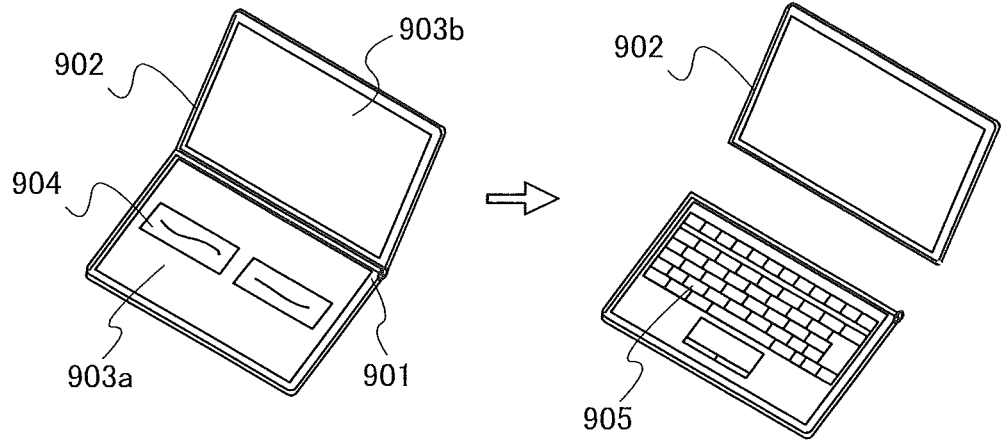
FIGS. 25A to 25E are electronic devices to which one embodiment of the present invention can be applied.

FIG. 25A illustrates a portable information terminal, which includes a housing 901, a housing 902, a first display portion 903a, a second display portion 903b, and the like. The semiconductor device described in the above embodiments is provided inside at least one of the housings 901 and 902. Thus, a portable information terminal with small size, large memory capacity, and high reliability can be obtained.

Note that the first display portion 903a is a touch panel, and for example, as illustrated in the left of FIG. 25A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 25A. With such a structure, letters can be input quickly by keyboard input as in the case of using a conventional information terminal, for example.

Furthermore, one of the first display portion 903a and the second display portion 903b can be detached from the portable information terminal as illustrated in the right in FIG. 25A. Providing the second display portion 903b with a touch input function makes the information appliance convenient to carry because the weight can be further reduced and the information terminal can operate with one hand while the other hand supports the housing 902.

The portable information terminal illustrated in FIG. 25A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 25A may transmit and receive data wirelessly. Through wireless communication, desired book data or the like can be purchased and downloaded from an e-book server.

Furthermore, the housing 902 in FIG. 25A may have an antenna, a microphone function, or a wireless communication function to be used as a mobile phone.

Figure 25B:
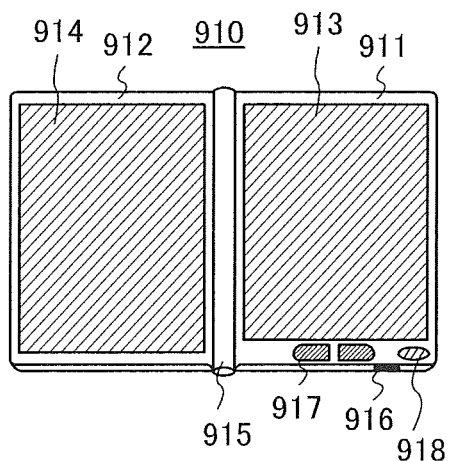

FIG. 25B shows an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. The semiconductor device described in the above embodiments is provided in at least one of the housings 911 and 912. Thus, an e-book reader with small size, large memory capacity, and high reliability can be obtained.

Figure 25C:
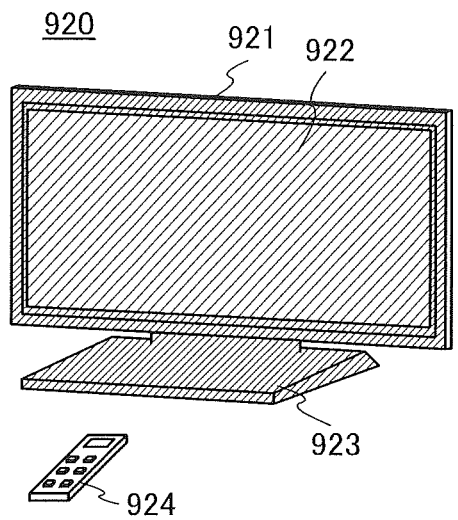

FIG. 25C is a television device, which includes a housing 921, a display portion 922, a stand 923, and the like. The television device 920 can operate with a switch on the housing 921 and a separate remote controller 924. The semiconductor device described in the above embodiments is provided in the housing 921 and the remote controller 924. Thus, a television device with small size, large memory capacity, and high reliability can be obtained.

Figure 25D:
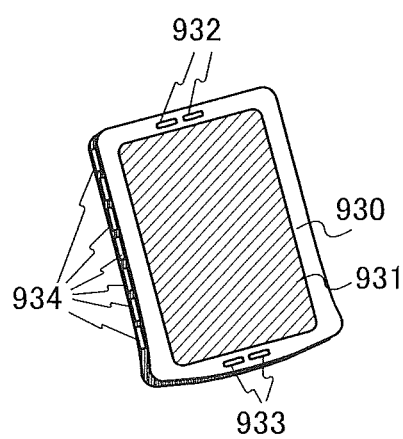

FIG. 25D shows a smartphone in which a main body 930 includes a display portion 931, a speaker 932, a microphone 933, operation buttons 934, and the like. The semiconductor device described in the above embodiments is provided in the main body 930. Thus, a smartphone with small size, large memory capacity, and high reliability can be obtained.

Figure 25E:
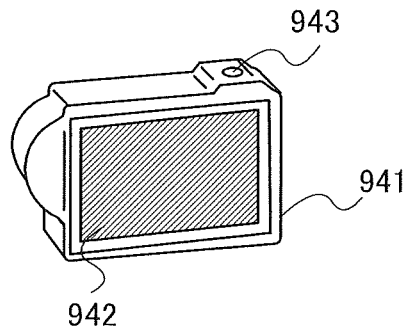

FIG. 25E shows a digital camera, which includes a main body 941, a display portion 942, an operation switch 943, and the like. The semiconductor device described in the above embodiments is provided in the main body 941. Thus, a digital camera with small size, large memory capacity, and high reliability can be obtained.

As described above, the electronic devices described in this embodiment each include the semiconductor device according to any of the above embodiments. Thus, electronic devices with small size, large memory capacity, and high reliability can be obtained.

(Notes about the Description in the Specification and the Like)

Additional notes are provided below as to the above embodiments and the description of the structures in the above embodiments.

<Notes about One Embodiment of the Present Invention Described in the Embodiments>

The structure described in each embodiment can be used as appropriate in combination with any of the structures described in the other embodiments to make another embodiment of the present invention. In addition, in the case where a plurality of structural examples is given in one embodiment, any of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiment. The example where OS transistors are used as transistors having low off-state current is described in Embodiment 1 as one embodiment of the present invention; however, one embodiment of the present invention is not limited to using OS transistors as long as transistors having low off-state current are used. Therefore, depending on conditions, an example without OS transistors may be one embodiment of the present invention.

<Notes about the Description for the Drawings>

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

Note that the term "over" or "under" does not necessarily mean that a component is placed directly above or directly below and directly in contact with another component. For example, the expression "electrode B over insulating layer A" does not necessarily mean that the electrode B is above and in direct contact with the insulating layer A and can mean the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, embodiments of the present invention are not limited to such a scale. Note that the drawings are schematically illustrated for clarity, and shapes or values are not limited to those illustrated in the drawings. For example, the following can be included: variation in signal, voltage, or current due to noise or difference in timing.

In a top view (also referred to as a plan view or a layout chart), a perspective view, and the like, some components are not illustrated for clarity of the drawing in some cases.

<Notes about the Description that can be Rephrased or Reworded>

In this specification or the like, in description of connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, the terms "voltage" and "potential" are interchangeable in appropriate cases. The term "voltage" refers to a potential difference between a given potential and a reference potential. When the reference potential is a ground voltage, the term "voltage" can be replaced with the term "potential". The ground voltage does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

<Notes about Definitions of Terms>

Definitions of terms that are not mentioned in the above embodiments are described below.

<<Switch>>

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in the semiconductor when a transistor is on) and a gate overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

<<Channel Width>>

In this specification and the like, a channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Another example of the expressions is, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expressions is "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on expression. Here, X, Y, Z1, and Z2 each denote an object (e.g., a device, an element, a circuit, a wiring, an electrode, a terminal, a conductive film, and a layer).

This application is based on Japanese Patent Application serial no. 2014-249679 filed with Japan Patent Office on Dec. 10, 2014 and Japanese Patent Application serial no. 2015-023937 filed with Japan Patent Office on Feb. 10, 2015, the entire contents of which are hereby incorporated by reference.

What is claimed is:

1. A semiconductor device comprising a memory cell, a first wiring, and a second wiring,
   wherein the memory cell includes a first transistor, a second transistor, a third transistor, a fourth transistor, a first capacitor, and a second capacitor,
   wherein one of a source and a drain of the first transistor is electrically connected to the first wiring,
   wherein the other of the source and the drain of the first transistor is electrically connected to the second wiring,
   wherein the memory cell includes a first data retention portion where the second capacitor, one of a source and a drain of the second transistor, and one of a source and a drain of the fourth transistor are electrically connected to one another,
   wherein the memory cell includes a second data retention portion where the first capacitor, a gate of the first transistor, the other of the source and the drain of the second transistor, and one of a source and a drain of the third transistor are electrically connected to one another,
   wherein a first data voltage is configured to be written to the first data retention portion from the first wiring through the first transistor, the second wiring, and the other of the source and the drain of the fourth transistor, and
   wherein a second data voltage is configured to be written to the second data retention portion from the second wiring through the first transistor, the first wiring, and the other of the source and the drain of the third transistor.

2. The semiconductor device according to claim 1, wherein a semiconductor layer of the first transistor, semiconductor layers of the second transistor and the third transistor, and a semiconductor layer of the fourth transistor are provided in different layers.

3. The semiconductor device according to claim 1, wherein a semiconductor layer of the first transistor and semiconductor layers of the second transistor and the fourth transistor are provided in different layers.

4. The semiconductor device according to claim 1, wherein a semiconductor layer of the first transistor includes silicon.

5. The semiconductor device according to claim 1, wherein semiconductor layers of the second transistor, the third transistor, and the fourth transistor include oxide semiconductors.

6. The semiconductor device according to claim 1, wherein a capacitance of the second capacitor is larger than a capacitance of the first capacitor.

7. The semiconductor device according to claim 1, wherein a voltage retained in the first data retention portion is higher than a voltage retained in the second data retention portion.

8. An electronic device comprising:
   the semiconductor device according to claim 1; and
   a display portion.

9. A semiconductor device comprising a memory cell, a first wiring, and a second wiring,
   wherein the memory cell includes a first transistor, a second transistor, a third transistor, a fourth transistor, a first capacitor, and a second capacitor,
   wherein one of a source and a drain of the first transistor is electrically connected to the first wiring,
   wherein the other of the source and the drain of the first transistor is electrically connected to the second wiring,
   wherein the memory cell includes a first data retention portion where the second capacitor, one of a source and a drain of the second transistor, and one of a source and a drain of the fourth transistor are electrically connected to one another,
   wherein the memory cell includes a second data retention portion where the first capacitor, a gate of the first transistor, the other of the source and the drain of the second transistor, and one of a source and a drain of the third transistor are electrically connected to one another,
   wherein a first data voltage is configured to be written to the first data retention portion from the first wiring through the first transistor, the second wiring, and the other of the source and the drain of the fourth transistor,
   wherein a second data voltage is configured to be written to the second data retention portion from the second wiring through the first transistor, the first wiring, and the other of the source and the drain of the third transistor,
   wherein the second data voltage is configured to be read from the second data retention portion using a voltage obtained by precharging the first wiring and then discharging the first wiring in accordance with a current flowing through the first transistor, and
   wherein the first data voltage is configured to be read from the first data retention portion using a voltage obtained by initializing the second data retention portion, distributing charge of the first data retention portion to the second data retention portion, precharging the first wiring, and then discharging the first wiring in accordance with a current flowing through the first transistor.

10. The semiconductor device according to claim 9, wherein the second data retention portion is configured to be initialized by turning on the third transistor.

11. The semiconductor device according to claim 9, wherein the charge of the first data retention portion is configured to be distributed to the second data retention portion by turning on the second transistor.

12. The semiconductor device according to claim 9, wherein a semiconductor layer of the first transistor, semiconductor layers of the second transistor and the third transistor, and a semiconductor layer of the fourth transistor are provided in different layers.

13. The semiconductor device according to claim 9, wherein a semiconductor layer of the first transistor and semiconductor layers of the second transistor and the fourth transistor are provided in different layers.

14. The semiconductor device according to claim 9, wherein a semiconductor layer of the first transistor includes silicon.

15. The semiconductor device according to claim 9, wherein semiconductor layers of the second transistor, the third transistor, and the fourth transistor include oxide semiconductors.

16. The semiconductor device according to claim 9, wherein a capacitance of the second capacitor is larger than a capacitance of the first capacitor.

17. The semiconductor device according to claim 9, wherein a voltage retained in the first data retention portion is higher than a voltage retained in the second data retention portion.

18. An electronic device comprising:
the semiconductor device according to claim 9; and
a display portion.

* * * * *